(12) United States Patent
Sengupta et al.

(10) Patent No.: US 8,319,549 B2
(45) Date of Patent: Nov. 27, 2012

(54) SELF-HEALING POWER AMPLIFIER: METHODS AND APPARATUS

(75) Inventors: Kaushik Sengupta, Pasadena, CA (US); Steven Bowers, Duarte, CA (US); Aydin Babakhani, White Plains, NY (US); Arthur H. Chang, Irvine, CA (US); Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 12/964,281

(22) Filed: Dec. 9, 2010

(65) Prior Publication Data

US 2011/0140772 A1 Jun. 16, 2011

Related U.S. Application Data

(60) Provisional application No. 61/285,088, filed on Dec. 9, 2009.

(51) Int. Cl.
*H03F 3/191* (2006.01)

(52) U.S. Cl. .................... 330/2; 330/124 R; 330/305

(58) Field of Classification Search ............... 330/2, 51, 330/124 R, 305
See application file for complete search history.

(56) References Cited

U.S. PATENT DOCUMENTS

| 7,382,182 B2 * | 6/2008 | Trocke et al. ............ 330/2 |
| 7,965,136 B2 * | 6/2011 | Rhodes et al. .......... 330/2 |
| 2005/0127441 A1 * | 6/2005 | Plass et al. .............. 257/347 |
| 2006/0028268 A1 * | 2/2006 | Chen ....................... 330/2 |

* cited by examiner

*Primary Examiner* — Steven J Mottola
(74) *Attorney, Agent, or Firm* — Milstein Zhang & Wu LLC; Joseph B. Milstein

(57) ABSTRACT

An integrated power amplifier includes a divider and a combiner. The integrated power amplifier also includes two or more amplifiers. Each of the amplifier input terminals is electrically coupled to a divider output terminal and each of the amplifier output terminals is electrically coupled to a combiner input terminal. At least one power sensor is configured to provide a power amplifier performance metric. The divider and the combiner include a plurality of actuators. Each actuator has at least one actuator control terminal which is configured to provide an actuator setting. The actuators are configured via the actuator control terminals to optimize the power amplifier performance metric. Methods to simulate the operation of a self-healing power amplifier and a process for the operation of a self-healing circuit are also described.

23 Claims, 57 Drawing Sheets

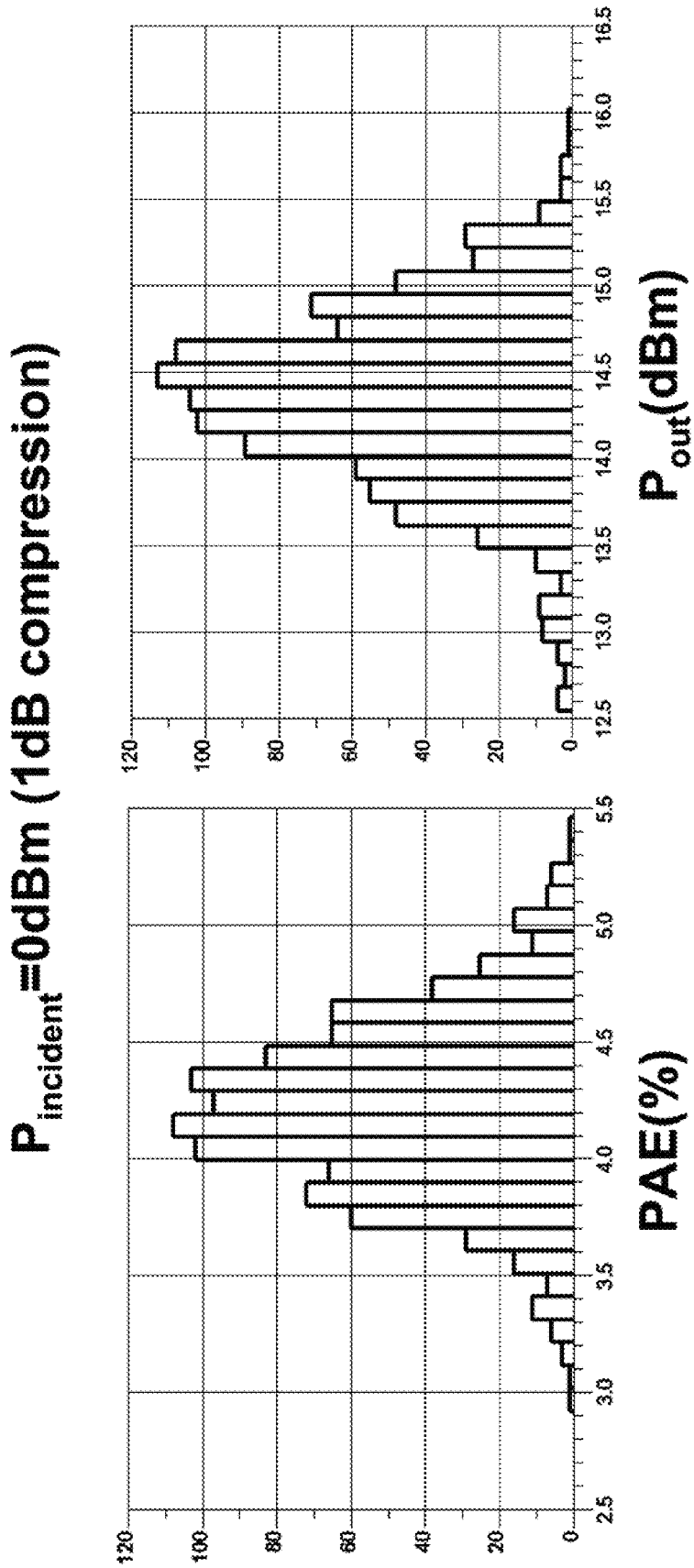

| | Gain | Pout | PAE |
|---|---|---|---|
| 1dB Compression Point | 22.4dB | 15.0dBm | 4.25% |
| Saturated Power | 14.5dB | 21.3dBm | 18.5% |

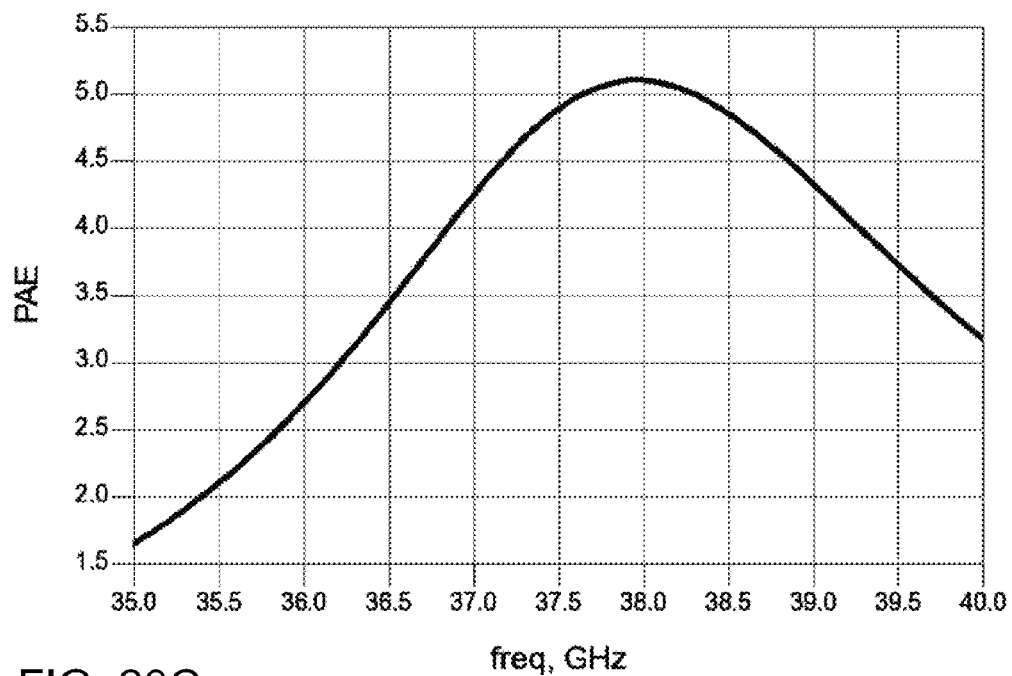
FIG. 20C
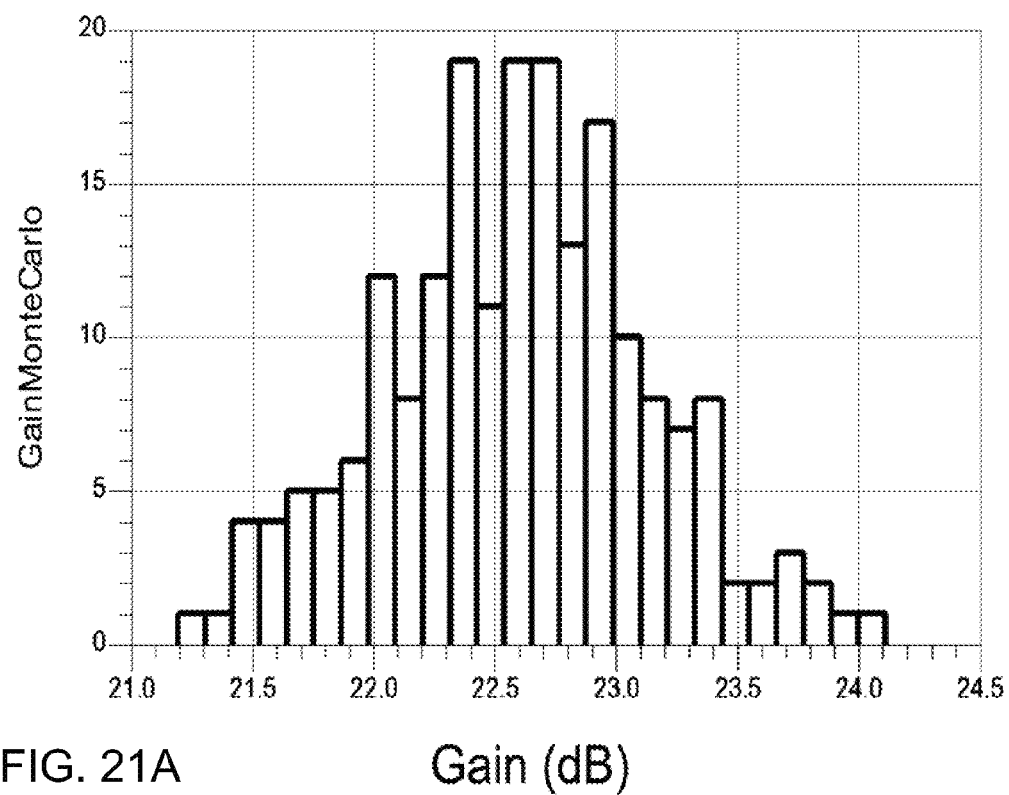
FIG. 21A          Gain (dB)

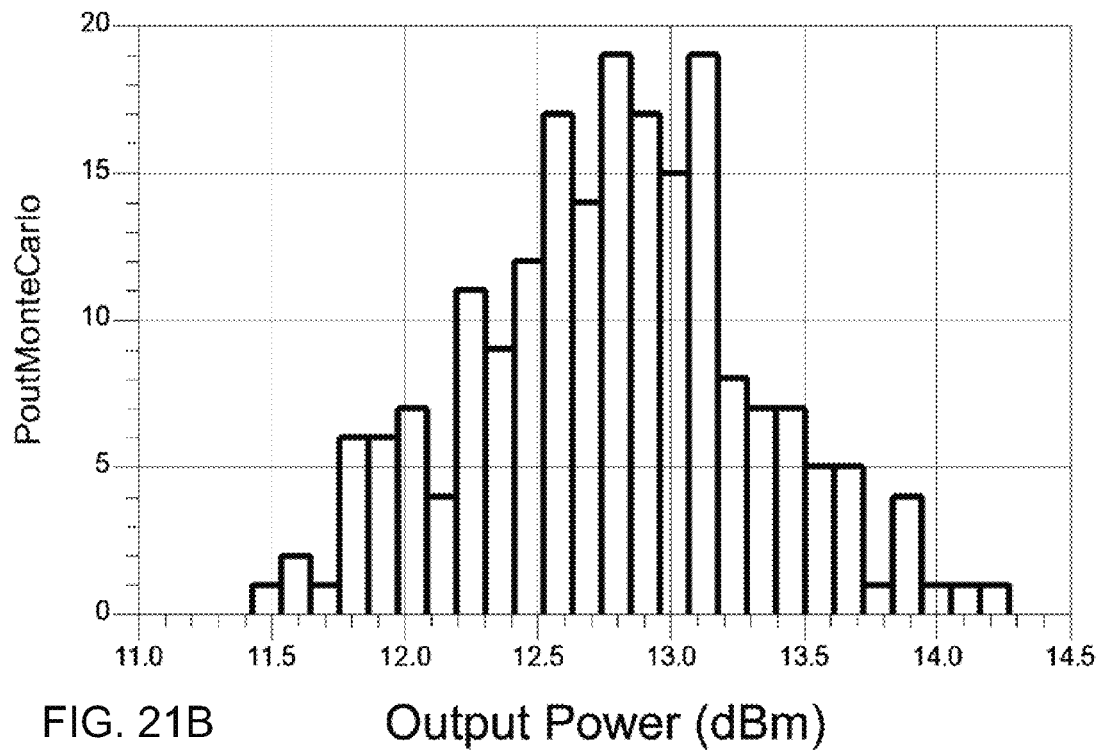
FIG. 21B  Output Power (dBm)
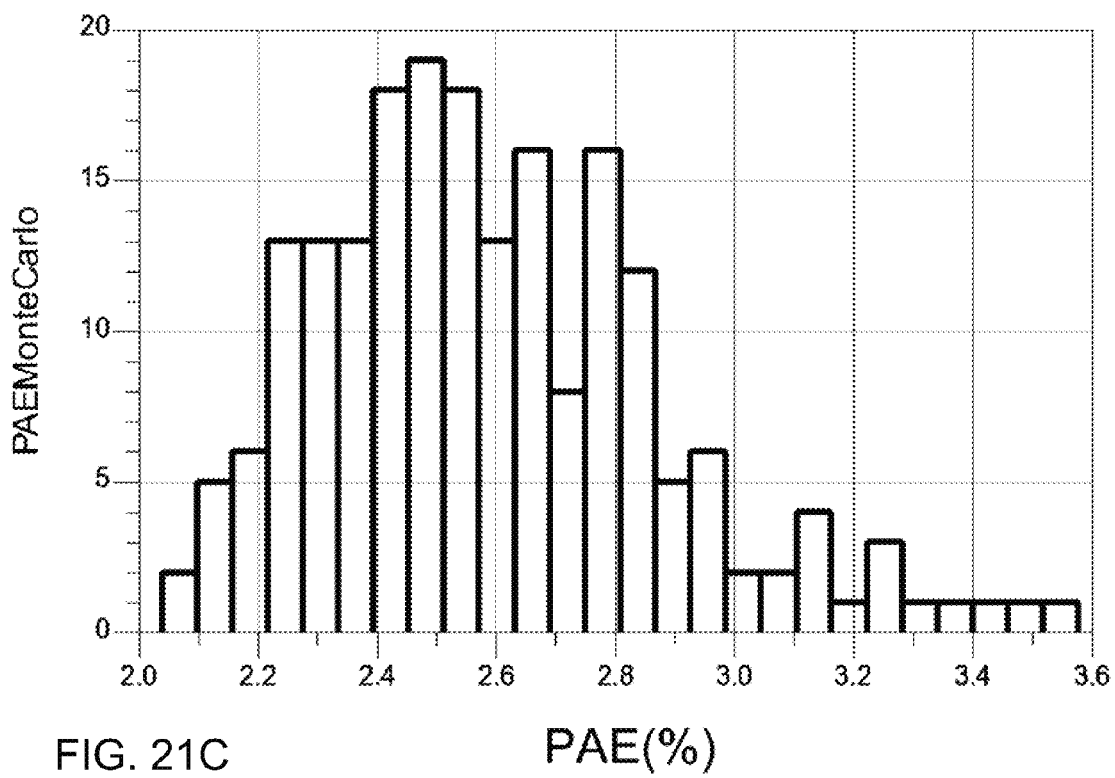
FIG. 21C  PAE(%)

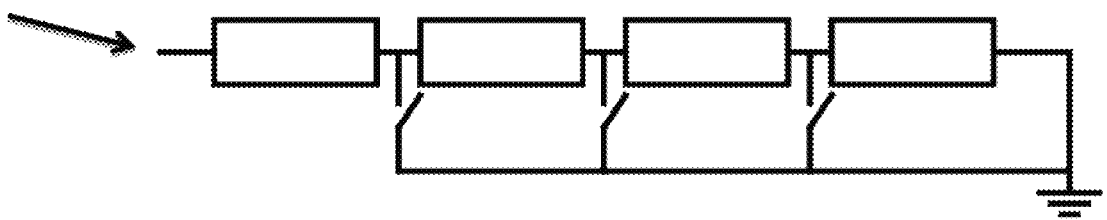
FIG. 25
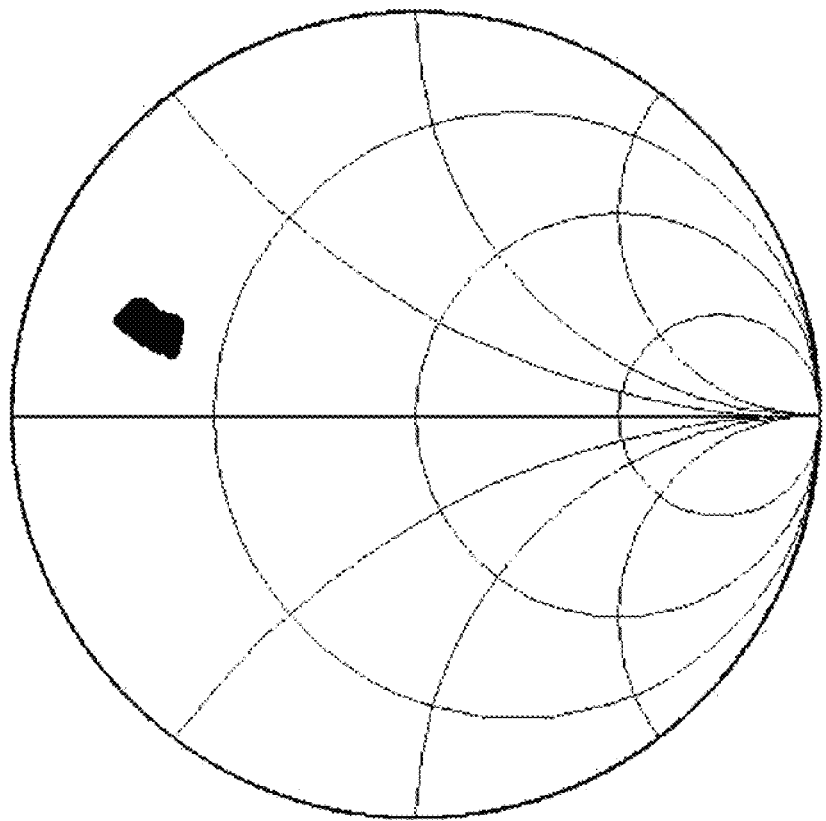
FIG. 26A   Tunable range of combiner with fine tuning alone ($Z_{lp}$)

Tunable range of combiner with coarse tuning alone ($Z_{lp}$)

Tunable range of combiner with fine and coarse tuning ($Z_{lp}$)

- Thermal Sensor 1

| | |
|---|---|
| Sensitivity | 1mV/1mW |
| | 4mW/bit |
| Power (mW) | 160 µW |
| Area (µm²) | 100 x 100 |
| 3σ | 10 µW |
| <Vn,rms> | 300 µV~0.3mW |
| Maximum PA Temp. Rise | >15°C |
| Ambient Temperature Range | -50°C -100°C |

- Thermal Sensor 2

| | |
|---|---|
| Sensitivity | 5mV/1mW |
| | 1mW/bit |
| Power (mW) | 160 µW |
| Area (µm²) | 100 x 100 |
| 3σ | 10 µW |
| <Vn,rms> | 300 µV~0.06mW |
| Maximum PA Temp. Rise | ~3-5°C |
| Ambient Temperature Range | -50°C -100°C |

FIG. 31

| RF Power Sensors | |
|---|---|
| Sensitivity | 16mV/1mW of Reflected RF Power |
| Power (mW) | 0.25mW/bit |
| Area (μm²) | ~ 800μW - 2mW |
| Max variation in prediction from Coupling | Dominated by 1pF cap. (25μm by 20μm) |
| | ~ 3% |
| Mean and σ in error prediction from Sensed Voltage | ~ 2.5% each |
| Power Range | ~ 10μW - 1mW (20dB) |

FIG. 36

DC Current Sensors

| | |
|---|---|
| Sensitivity | 400mV/40mA ~ 10mV/mA |
| Power (mW) | ~0.5mW/bit |
| Area ($\mu m^2$) | ~ 1/40 of PA |
| Max variation in prediction with one point calibration | Dominated by OP-AMP compensation |
| Max variation in prediction with one point calibration | $\mu=2.2\%$, $\sigma=1.3\%$ |
| | $\mu=0.73\%$, $\sigma=0.23\%$ |
| Current Range per PA | ~ 20mA-60mA |
| Drain Efficiency | 97% of drain efficiency without sensor |

FIG. 39

SELF-HEALING POWER AMPLIFIER: METHODS AND APPARATUS

CROSS-REFERENCE TO RELATED APPLICATIONS

This application claims priority to and the benefit of co-pending U.S. provisional patent application Ser. No. 61/285,088, Self-healing Power Amplifier: Methods and Apparatus, filed Dec. 9, 2009. This application is related to co-pending U.S. patent application Ser. No. 12/806,906, filed Aug. 24, 2010, entitled ELECTRONIC SELF-HEALING METHODS FOR RADIO-FREQUENCY RECEIVERS, and co-pending U.S. patent application Ser. No. 12/877,743, filed Sep. 8, 2010, entitled SELF-HEALING TECHNIQUE FOR HIGH FREQUENCY CIRCUITS. All of the enumerated applications above are incorporated herein by reference in their entirety for all purposes.

STATEMENT REGARDING FEDERALLY FUNDED RESEARCH OR DEVELOPMENT

This invention was made with government support under contract number FA8650-09-C-7924 awarded by the Air Force Office of Scientific Research. The government has certain rights in the invention.

FIELD OF THE INVENTION

The invention relates to power amplifiers in general and particularly to a power amplifier that employs self-healing.

BACKGROUND OF THE INVENTION

Process variations in the fabrication of integrated circuits lead to variations in the operating parameters or characteristics exhibited by multiple exemplars of the same circuit or device, including those made on the same fabrication line. These variations can result in divergent operation of what should be identical devices. One problem that this can create is the necessity to "trim" or adjust circuits to achieve acceptable operation. In the worst of cases, the variation can result in the need to reject or to discard chips that fall outside a desired operational envelope. Especially problematic are designs which include a RF power amplifier (PA), such as a high frequency (e.g. mm-wave) PA.

There is a need for systems and methods that allow power amplifiers having devices that exhibit divergent operating parameters or characteristics to "self heal" or to self correct when such divergent operating parameters or characteristics are present.

SUMMARY OF THE INVENTION

According to one aspect, the invention features an integrated power amplifier which includes a divider having a divider input terminal and two or more divider output terminals. The divider input terminal is electrically coupled to a power amplifier input terminal. A combiner having two or more combiner input terminals and a combiner output terminal are electrically coupled to a power amplifier output terminal. The integrated power amplifier also includes two or more amplifiers, each amplifier having an amplifier input terminal and an amplifier output terminal. Each of the amplifier input terminals is electrically coupled to a divider output terminal and each of the amplifier output terminals is electrically coupled to a combiner input terminal. At least one power sensor is configured to provide a power amplifier performance metric. At least one terminal is configured to receive an electrical voltage to power the integrated power amplifier. The divider and the combiner include a plurality of actuators. Each actuator of the actuators has at least one actuator control terminal which is configured to provide an actuator setting. The actuators are configured via the actuator control terminals to optimize the power amplifier performance metric.

In one embodiment, each of the amplifiers further includes at least one actuator configured to optimize a gain.

In another embodiment, each of the amplifiers further includes at least one actuator configured to set a dc bias.

In yet another embodiment, the actuator includes a tunable transmission line.

In yet another embodiment, the tunable transmission line includes switchable capacitors.

In yet another embodiment, the tunable transmission line includes stubs and shorting switches.

In yet another embodiment, the power sensor includes a thermal sensor.

In yet another embodiment, the thermal sensor includes a plurality of diodes interlaced with the integrated power amplifier.

In yet another embodiment, the power sensor includes a RF power sensor.

In yet another embodiment, the RF power sensor includes a coupled line.

In yet another embodiment, the power sensor includes a DC current sensor comprising a current mirror.

In yet another embodiment, the DC current sensor includes a low headroom power circuit having an amplifier and a plurality of FETs and a DC current sensor output terminal.

In yet another embodiment, the integrated power amplifier further includes an ADC configured to digitize a signal from the power sensor.

In yet another embodiment, the ADC includes a successive-approximation (SAR) ADC.

In yet another embodiment, the SAR ADC includes a DAC having a binary-weighted capacitor array.

In yet another embodiment, the integrated power amplifier includes a CMOS technology.

In yet another embodiment, the integrated power amplifier includes body-contacted analog transistors.

According to another aspect, the invention features a method to simulate the operation of a self-healing power amplifier including the steps of: providing a computer configured to simulate self-healing power amplifier actuator settings and to calculate performance data for the simulated self-healing power amplifier actuator settings; setting the self-healing power amplifier actuator settings; calculating the performance data for the simulated self-healing power amplifier; calculating a figure of merit (FOM) based on the performance data; and calculating a revised set of self-healing power amplifier actuator settings based on the FOM.

In one embodiment, the method to tune a self-healing power amplifier includes repeating one or more times the steps of setting the self-healing power amplifier actuator settings to calculate a revised set of self-healing power amplifier actuator settings.

In another embodiment, the method to tune a self-healing power amplifier includes repeating the steps of setting the self-healing power amplifier actuator settings to calculating a revised set of self-healing power amplifier actuator settings until a desired FOM is reached or as desired.

According to yet another aspect, the invention features a process for the operation of a self-healing circuit including the steps of: providing a self-healing circuit including actuators having actuator settings and sensors to provide a measurement indicative of a circuit performance metric; providing a processor configured to run a self-healing procedure having as at least one input a sensor measurement and as output at least one actuator setting; defining an initial state for the at least one actuator; reading a present state of the at least one actuator and the sensor measurement; calculating the circuit performance metric; calculating a new setting for the at least one actuator setting to provide a predicted improvement in the circuit performance metric; and setting the new setting for the at least one actuator.

In one embodiment, the process for the operation of a self-healing circuit further includes the step of optionally repeating the step of reading a present state of the at least one actuator and the sensor measurement to the step of setting the new setting for the at least one actuator as many times as desired.

In another embodiment, the process is repeated until a desired circuit performance metric is reached.

In yet another embodiment, the process is repeated following a predetermined level of change of an environmental factor.

In yet another embodiment, the environmental factor includes a selected one of a temperature change, and a change in a voltage standing wave ratio (VSWR).

In yet another embodiment, the actuator includes a matching network including the at least one actuator.

In yet another embodiment, the self-healing circuit includes a self-healing power amplifier.

In yet another embodiment, the circuit performance metric includes a measurement of power added efficiency (PAE).

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 13A shows a histogram of number of occurrences plotted versus PAE (%).

FIG. 13B shows a histogram of number of occurrences plotted versus $P_{out}$ (dBm).

FIG. 20C shows a graph of PAE plotted versus frequency.

FIG. 21A shows a histogram of gain (dB).

FIG. 21B shows a histogram of output power (dBm).

FIG. 21C shows a histogram of PAE (%).

FIG. 25 shows a block diagram of an exemplary transmission line having three shorting switches.

FIG. 26A shows a Smith chart for a self-healing amplifier using fine tuning alone ($Z_{lp}$).

FIG. 31 shows a table of specifications of two exemplary thermal sensors.

FIG. 36 shows a table of specifications for exemplary modeled power sensors.

FIG. 39 shows a table of specifications for exemplary modeled DC current sensors.

DETAILED DESCRIPTION

We describe hereinbelow robust RF/analog circuitry for use in highly stochastic power amplifier design spaces (e.g., process variations and operational environmental factors) which includes built-in circuitry such that the system can detect imperfections and correct for its intrinsic flaws autonomously. In such a power amplifier system, "sensors" and "actuators" are added throughout the design. A loop can be closed and sensor outputs can be used to determine, for example, by use of digital processing, values for actuator settings which are expected to improve the performance of the RF/analog circuitry, such as a power amplifier. Such autonomous corrections (also referred to as "self healing") can be performed automatically during operation of the RF/analog circuitry.

Figure 1:
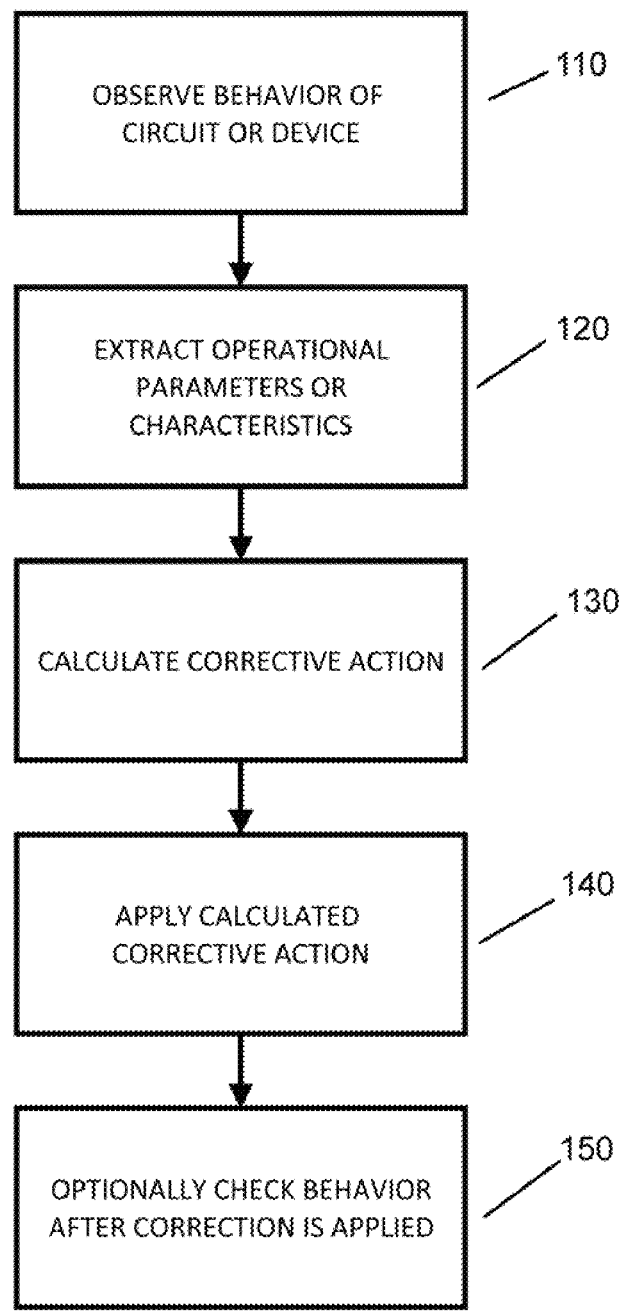
FIG. 1 is a schematic flow chart showing the overall system and process for a self-healing circuit or device.

FIG. 1 shows an exemplary schematic flow chart 100 of the overall system and process for a self-healing circuit or device. As illustrated in FIG. 1, at step 110, the behavior of a circuit or a device in response to an input signal is observed. In some embodiments, the input signal is a test signal or a pre-defined signal. This observation can be performed by components on the chip, or by components off the chip. At step 120, one extracts or derives one or more operational parameters or characteristics of the circuit or the device. At step 130, one calculates a corrective action, if needed, to bring the operational parameters or characteristics of the circuit or device within a desired range. The corrective action can be one or both of the application of a correction signal and a modification of one or more parameters or characteristics of an element in the circuit. At step 140, one applies the calculated corrective action, if needed, to bring the operational parameters or characteristics of the circuit or device within the desired range. Optionally, at step 150, one checks the operational parameters or characteristics of the circuit or the device after the correction is effectuated. In some embodiments, steps 120, 130, 140 and 150 can be repeated if it is determined that the one or more operational parameters or characteristics of the circuit or the device are still not within the desired range after the correction has been applied.

Challenges in CMOS Fabrication

Some conventional CMOS fabrication processes, including digital CMOS fabrication processes, are not well suited for use at mm-wave frequencies. The lower mobility of CMOS devices as compared to III-V semiconductor devices, lower quality factor of passive components, and lossy silicon substrates all contribute to high ohmic losses, and pose challenges to silicon integration and efficient power generation at mm-wave frequencies. CMOS RF designs are further constrained by a proportional scaling in breakdown voltages which fundamentally limits the amount of power that can be obtained from a single transistor.

Some design methodologies for mm-wave silicon integration that scale with technology have been developed. For example in Komijani and Hajimiri, A 24 GHz, +14.5 dBm fully-integrated power amplifier in 0.18 µm CMOS, Custom Integrated Circuits Conference, 2004, Proceedings of the IEEE 2004, pages 561-564, October, 2004, a slow-wave structure was described, which effectively reduced substrate loss and on-chip wavelength and achieved a +14.5 dBm output power in 180 nm CMOS with a 3.1 GHz bandwidth at 24 GHz. A 77 GHz power amplifier was described by Komijani and Hajimiri in a wideband 77 GHz, 17.5 dBm power amplifier in silicon, Custom Integrated Circuits Conference, 2005, Proceedings of the IEEE 2005, pages 571-574, September, 2005, in which a 130 nm SiGe BiCMOS process yielded a device which achieved +17.5 dBm with a PAE (power added efficiency) of 12.8%.

A resonant impedance match using transmission lines or lumped passive components is inherently narrow-band and therefore sensitive to inaccuracies of active and passive modeling. An extremely wideband combining network was proposed and implemented using a non-uniform transmission line which funneled the output power of four stages into a load, achieving an output power of 125 mW at 84 GHz with a 3 dB bandwidth of 24 GHz in 130 nm SiGe BiCMOS technology. These technologies have been described in United States Patent Application Publication No. 2007/0086786, Electrical funnel: a novel broadband signal combining method, filed Sep. 22, 2006, and United States Patent Application Publication No. 2009/0096554, 2D TRANSMISSION LINE-BASED APPARATUS AND METHOD, filed Oct. 16, 2008, both of which applications are incorporated herein by reference in their entirety for all purposes.

The possibility of integrating billions of transistors in silicon and the application of sophisticated back-end digital processing integrated with a mm-wave front-end, all integrated in a single die, can be leveraged to make robust, low-cost, high-yield fully integrated systems at mm-wave frequencies. Applications such as gigabit/s point-to-point links, wireless local area networks (WLANs) with extraordinary capacity, short-range high data-rate wireless personal area networks (WPANs), vehicular radar, imaging sensors in planetary remote sensing, medical imaging, all-weather vision, plasma diagnostics and other commercial and defense applications with unprecedented levels of integration are no longer a distant possibility.

Problems in Manufacturing High Frequency Integrated Circuits

As process technologies scale towards the sub-90 nm regime, transistors are being pushed towards their fundamental limits and model, parasitic, and process variations all contribute to a severe degradation in system performance. Device models provided by the standard foundries are generally not validated at mm-wave frequencies or thought to be practical, as related economic costs are high and the performance margin in mm-wave design is very small. For example, a 30 fF (femto Farad) parasitic capacitance, having a reactance of 56 ohms ($X_C$) at 94 GHz, can completely detune a matching network unless the smallest parasitic is accurately modeled and accounted for.

Integrating large numbers of transistors (e.g. billions of transistors) in silicon by use of existing process technologies remains problematic because of low manufacturing yields and very high economic costs of design and manufacture. At the limits of conventional CMOS processes, a design that relies on the accuracy of device and passive modeling is generally followed up with fabrication of test structures, custom active device modeling and several iterative runs (with the associated added expense), all of which, due to process variations, nevertheless fail to guarantee an optimum performance. Production of such designs is generally reduced to unacceptably low yield percentages and such designs are thought to be not commercially viable for large volume production.

One convention solution to the problem of low production yield caused by process variation is to design conservatively and to attempt to guarantee performance at all corners of a performance envelope (e.g., to meet stringent military requirements) or to use an architecture that is inherently less prone to parasitics (e.g., a wideband design). However, such workarounds generally come with a cost of higher power or a larger chip area or one needs to sacrifice transistor performance resulting in a suboptimum performance. Furthermore, such workarounds completely overlook the fundamental advantages of CMOS integration which comes with almost limitless computational abilities in the digital domain and where transistors are so inexpensive that, relative to the related design and manufacturing costs, they are virtually free.

Self-Healing High Frequency Integrated Circuits

We describe hereinbelow the concept of self-healing or self-adjusting autonomic systems, with an emphasis on mm-wave CMOS circuits, such as, for example, a mm-wave self-healing CMOS power amplifier. Our self-healing techniques are used to mitigate the effects of process variations, model inaccuracies and aging and environmental effects on circuits. Self-healing techniques can be accomplished by automatic monitoring and sensing and subsequent on-chip corrections and adjustments such as by use of tunable active and passive elements, tuned via a self-sustained control and optimization process using a general purpose programmable computer programmed with a set of instructions recorded on a computer-readable medium. In some embodiments, an application-specific integrated circuit (ASIC), a dedicated logic circuit, or a number of standard "cells" that can perform the necessary computational operations can be used in place of a general purpose programmable computer in order to save chip area (or chip "real estate") and/or to save expense and effort. We believe that such a self-healing approach can reliably overcome the fundamental shortcomings of variability and uncertainty in highly-scaled technology nodes, without a sacrifice in performance. It is contemplated that such self-healing techniques can increase first-pass functional production yields to 75-90% which is expected to make application of CMOS processes viable for fabricating devices suitable for commercial mm-wave applications.

Integrated CMOS Mm-Wave Power Amplifier

A mm-wave power amplifier is one of the most challenging blocks to integrate in CMOS. The size of integrated transistors generally decreases with advances in integrated processes. Thus, with each advance in integrated processes, transistor operating voltages are falling with decreased transistor sizes. Power is proportional to voltage squared. Because the power available scales quadratically with the supply voltage, the power available from each transistor (e.g., each MOS transistor of a CMOS integrated circuit) reduces dramatically with voltage. Therefore, as we push frequency of operation of transistors further and further towards their $f_{max}$, in some embodiments, we combine the output power of several transistors to achieve desired power levels. In addition, in some embodiments, we can combine the output power of several stages (either on-chip or off-chip) through electromagnetic radiation via on-chip antennas. On-chip antennas, as well as other types of power combiners, have ohmic losses due to skin effect. In addition, combining an increasing number of output stages implies a higher impedance transformation ratio (assuming antenna impedance does not change significantly) which decreases the bandwidth and therefore the margin of error in a matching network. Slight detuning due to node parasitics, process variation or model inaccuracies can cause a severe degradation in output power, efficiency and gain. Such degradation in output power, efficiency and gain is unacceptable at mm-wave frequencies, where the power gain in bulk CMOS technology is limited.

W-Band Mm-Wave Power Amplifier in CMOS

Figure 2:
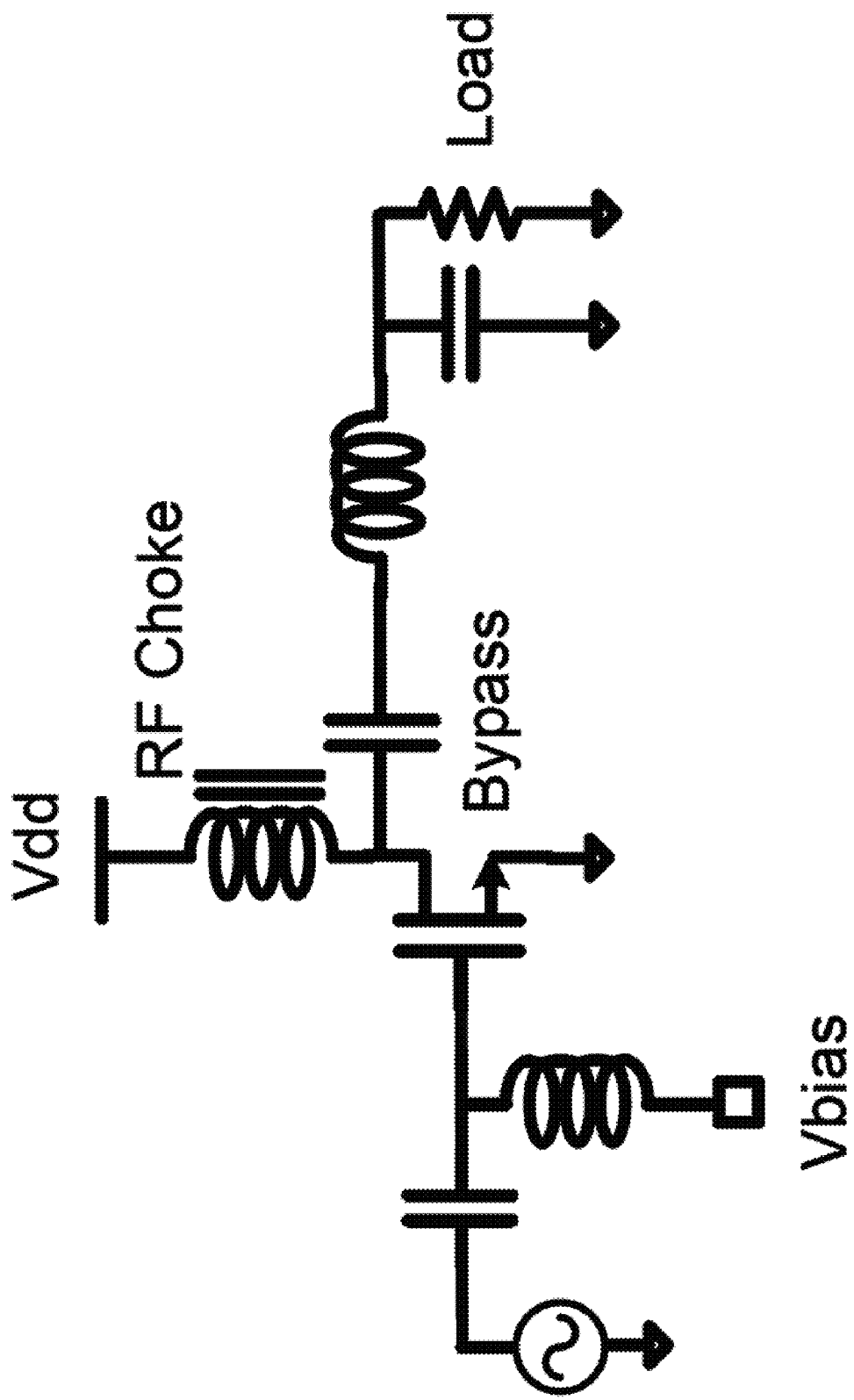
FIG. 2 shows a schematic diagram of an exemplary power amplifier.
Figure 3A:
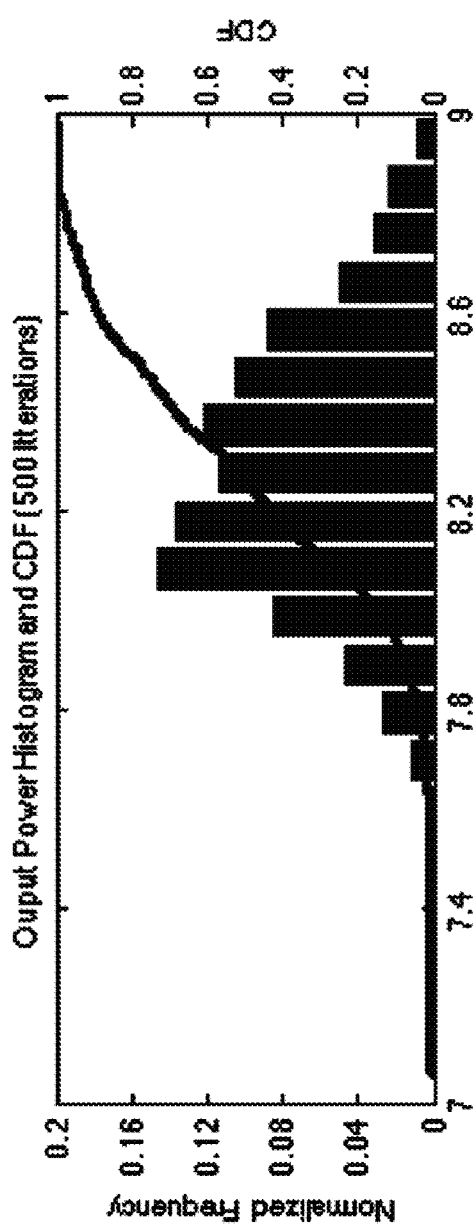
FIG. 3A shows graph of a Monte Carlo simulation of wafer-to-wafer variation over a range of output power for the circuit of FIG. 2.
Figure 3B:
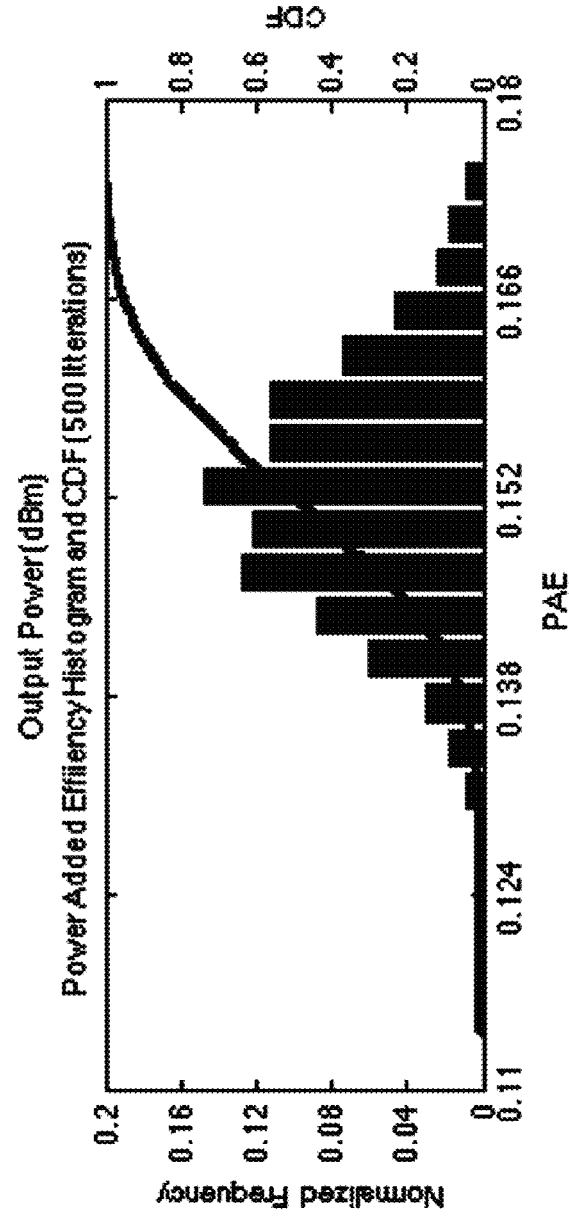
FIG. 3B shows graph of a Monte Carlo simulation of wafer-to-wafer variation simulation over a range of PAE for the circuit of FIG. 2.

An exemplary W-band (e.g., 94 GHz) power amplifier in 32 nm or 45 nm bulk CMOS technology is now described in more detail. FIG. 2 shows a schematic diagram of a section of a power amplifier. The power amplifier of FIG. 2 was simulated as biased in Class AB. Inductors were simulated with quality factor of 10 at 94 GHz. As shown in FIG. 3A and FIG. 3B, a Monte Carlo simulation was run which shows wafer-to-wafer variation over a range of Output Power (dBm) (FIG. 3A) and over a range of Power Added Efficiency (PAE) (FIG. 3B), with both simulations performed for the circuit of FIG. 2. The Monte Carlo simulation for a process variation of a bulk 65 nm CMOS technology shows how output power, gain, and efficiency can be expected to vary from wafer to wafer. Both simulations assumed no passive variations and absolute model accuracy and were therefore expected to be optimistic.

The single stage power amplifier of FIG. 2 was biased in class AB and matched at 94 GHz. From process variations alone, the output power can vary by 1 dB and the PAE can have a deviation of 3%. When model inaccuracies of active and passive devices are further included, the variation is expected to be much higher. In the Monte Carlo simulation of FIG. 2, nearly 70% of the yield fails to provide the designed 8.5 dB power level.

With a typical available input power of 5 dBm, current state of the art designs work around problems of process variation by embedding several capacitors in matching networks which are either digitally switched on and off as needed through manual control or are adjusted by laser trimming to bring the center frequency to the desired value. However, to our knowledge, there has been no concerted effort to automate the process and/or to mitigate losses, such as when the amplifier is forced to work under high VSWR conditions. Furthermore, under high VSWR conditions, the power amplifier can oscillate due to poor reverse isolation at high frequencies.

Another problem related to power amplifiers is the reduction of efficiency during "backoff" (gain non-linearity at higher operating power levels). Since the peak efficiency (at higher power levels) is lower than is achieved for low RF levels, backoff reduces the performance of mm-wave power amplifiers.

Self-Healing: Design Philosophy

As described hereinabove, CMOS processes such as digital CMOS processes have generally been thought to be impractical for high frequency circuits, and especially unsuitable for mm-wave applications. However, we have found that such CMOS processes can be used for high frequency RF circuits, including circuits used at mm-wave frequencies, by use of a careful amalgamation of the fundamental design procedures of analog and microwave circuit design. Our techniques include a careful modeling of both devices and high-frequency passive components. We have been able to mitigate these challenges by evaluation and critique of existing techniques and innovations in passive design, efficient power extraction and power combining. We now describe the techniques of self-healing (described hereinbelow in detail) as a holistic solution which attempts to substantially overcome all the fundamental problems of integrated circuit variation at a new level of abstraction. Instead of identifying and confronting individual problems and then devising custom solutions for each of them, self-healing constitutes a general design philosophy which allows an integrated circuit to achieve optimum performance over a range of both process variations as well as variation related to environmental factors.

Sensing

To develop the methodology of self-healing, we begin with an identification of relevant performance parameters that can be either directly or indirectly sensed. Self-actuation (in some embodiments, a fully automatic control aspect of the self-healing technique), can then be implemented through a control process operating on a general purpose programmable computer programmed with a set of instructions recorded on a computer-readable medium based on these performance metrics. Specifically with regard to the exemplary power amplifier, the relevant performance parameters include output power, efficiency, gain, and linearity. Therefore, a self-healing mm-wave power amplifier would typically include reliable, low-power, low-area, high impedance and/or low-insertion loss mm-wave sensors that can monitor metrics (e.g., output power, efficiency, gain, and linearity) of the power-amplifier through direct evaluation and/or through sensing other variables which have a known relationship with output power, efficiency, gain, and/or linearity.

Sensing Power

One way to directly sense (measure) input and output power is with a high impedance Schottky peak detector. Since the cut-off frequency of typical Schottky diodes in 32 nm typically exceeds 1 THz, these diodes are suitable for use as low-area, low power sensors for mm-wave power detection. High frequency power detection and implementation in standard CMOS processes based on high impedance Schottky peak detectors has been previously demonstrated.

Exemplary Self-Healing Architecture

Figure 4:
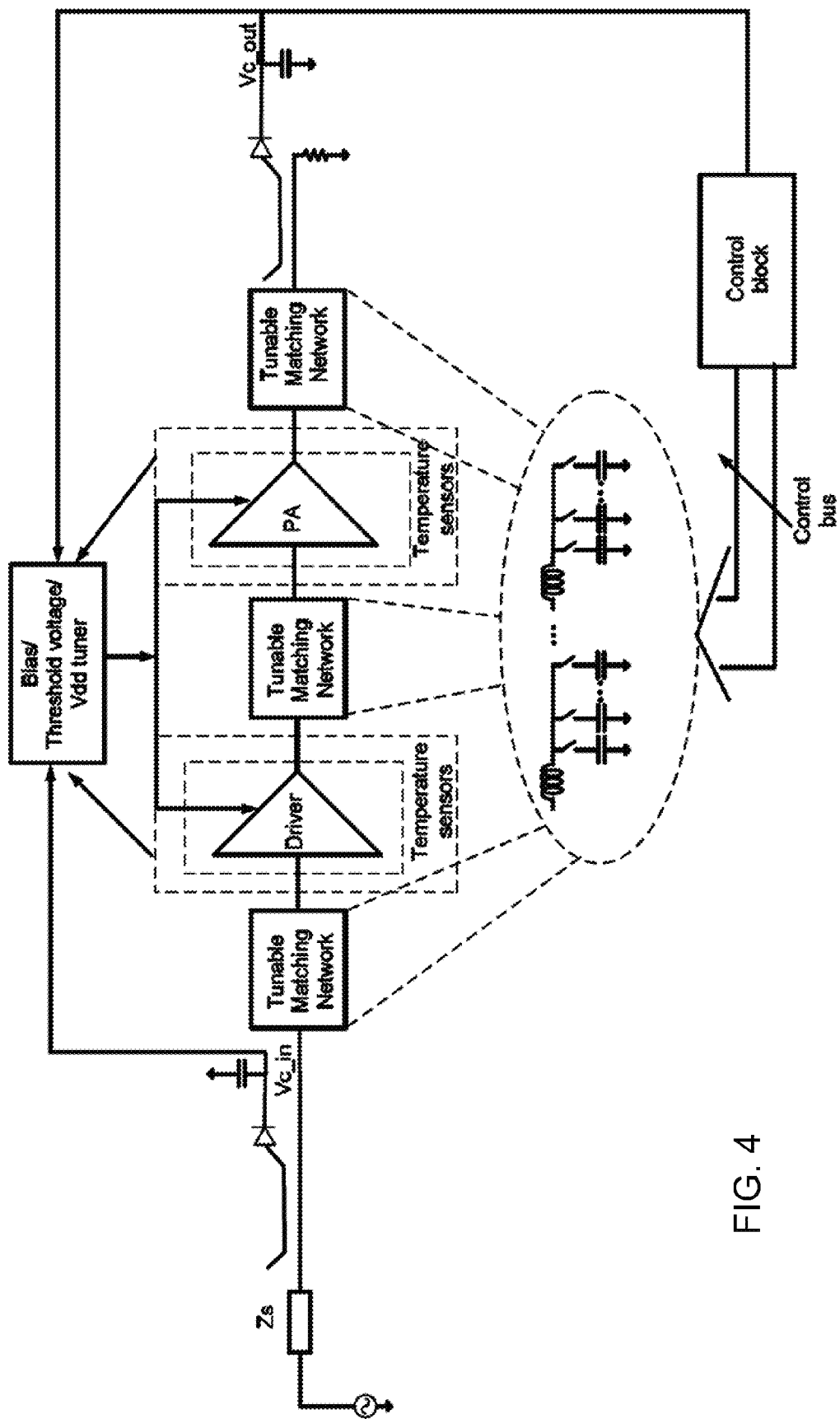
FIG. 4 shows a block diagram of an exemplary simplified block diagram of a two stage power amplifier according to the invention.

FIG. 4 shows a block diagram of a simplified architectural overview of various sensing and actuating mechanisms for an exemplary two stage power amplifier. The self-healing scheme uses the sensors and actuators shown around a core power amplifier. For power sensing, the output power can be coupled to the diode detector using an on-chip coupler or directly passed through it, depending on the loading effects of the diode. The coupler can also be designed to couple minimal power above some sensing threshold used for sensing. The effect of loading of the sensor on the output power network can be automatically adjusted as a part of the self-healing process through adjustments of an output tuning network as described herein below in more detail.

Gain, PAE, and Drain Efficiency Sensing

PAE is defined by the following equation:

$$PAE = \frac{\text{Output Power} - \text{Input Power}}{Pdc} \qquad \text{Eq. 1}$$

As seen in equation 1, to estimate drain efficiency or PAE, the DC power ($P_{dc}$) consumed is measured. One direct way to measure the DC power consumed is by sensing the power supply current by passing it through a transistor and mirroring it. While this DC power sensing can be done for a cascade stage, for a common source stage, the higher supply voltage typically used can degrade efficiency. One contemplated alternative approach is to mirror a scaled version current through the power amplifier (PA) by use of a voltage source below ground. It is also contemplated that there are other methods suitable for efficient bias current detection.

Circuit parameters can also be measured indirectly, such as by sensing their effects on other metrics, which in some cases are easier to measure. There are also variables in the nonelectrical domain which are indicative of PA efficiency. For example, lower efficiency implies a high power dissipation in active and/or passive circuit devices, which raises the local temperature surrounding the core. Therefore, the temperature of the core or parts of the circuit can be measured, for example, by use of well-known proportional to absolute temperature (PTAT) sensors. PTAT temperature sensors can be built on-chip to monitor heat dissipation and therefore to estimate efficiency inferred from the temperature measurements. One challenge is the calibration of the PTAT circuitry over ambient temperature. However, ambient temperature can also be sensed. PTAT sensors can provide a reliable, low-cost and low-power method for sensing efficiency.

Techniques such as polar loop and Cartesian feedback, which have been demonstrated for low RF frequencies, as well as other suitable approaches, are contemplated for improving linearity. Information regarding gain of the PA can be obtained from the outputs of peak detectors realized, for example, with Schottky diodes.

Information about accuracy of matching networks (e.g., matching network tuning) can also be determined by sensing the phase difference between gate and drain voltage of the amplifier. For example, at nearly perfect load-pull matching, the gate and drain voltage will be completely out of phase. However, due to the presence of gate resistance, this phase relationship may not be satisfied and in general, it is less feasible to tap the voltage across the MOS gate capacitor. An alternative contemplated method is to sense the phase difference between the gate current and drain voltage which should be at quadrature phase. It is also believed that vector sensors can be extended to other parts of self-healing systems (e.g., transceivers) for measuring I/Q imbalance and other parameters.

Actuators

Information obtained from the various sensing mechanisms can be processed through an optimization and control process operating on a general purpose programmable computer programmed with a set of instructions recorded on a computer-readable medium. The optimization and control process can activate the various passive and active actuation mechanisms which regulate the circuitry to optimize performance and which can perform self-healing as needed. Generally, a transistor is coupled into a circuit or decoupled by operation of the transistor (e.g., operation of a transistor gate) to place the transistor in or out of the circuit or to cause some related device (e.g., an impedance element or impedance tuning structure of a tuned network) to be placed in or out of a circuit, to affect operation of an actuator.

Some exemplary actuating mechanisms are shown in FIG. 4. For example, the tunable network can be a multistage LC ladder network where individual and/or groups of capacitors in the capacitor banks can be switched on and off for tuning Any suitable matching network can be used. Typically multistage LC matching networks can be used to achieve a desired quality factor. The matching networks can be tuned, for example, by using switched capacitors via an autonomous control process operating on a general purpose programmable computer programmed with a set of instructions recorded on a computer-readable medium which aims, for example, to maximize output power for a given bias and input power condition. The autonomous control process can be a control process as simple as a gradient descent process, or the autonomous control process can include more complex optimization routines. The flexibility of tuning over a large portion of a Smith chart can also enable a dynamic adjustment of the output matching network, for example, during a backoff condition, to increase efficiency.

Figure 5C:
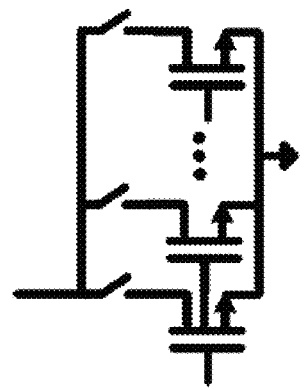
FIG. 5C shows a schematic diagram which illustrates another exemplary actuator circuit topology suitable for use in the power amplifier of FIG. 4.
Figure 5A:
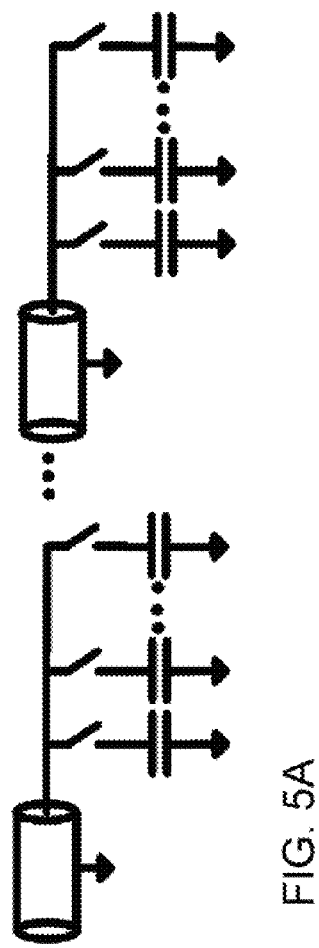
FIG. 5A shows a schematic diagram of an exemplary tunable matching network using a T-line suitable for use in the power amplifier of FIG. 4.
Figure 5B:
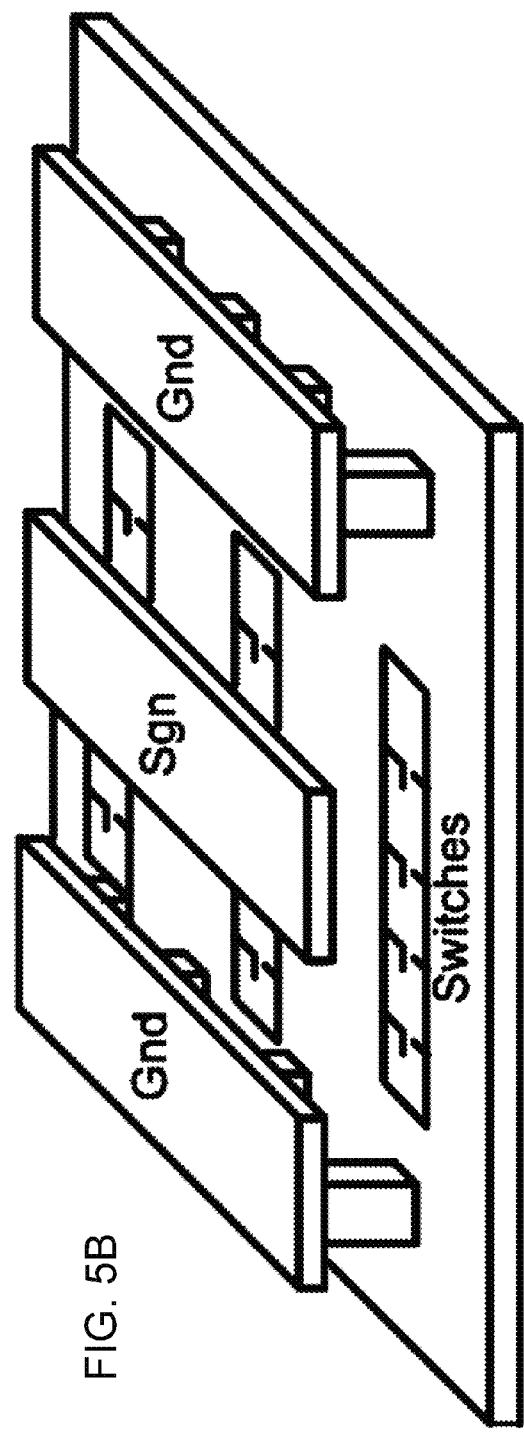
FIG. 5B shows a perspective view of another exemplary tunable show-wave transmission line suitable for use in the power amplifier of FIG. 4.

Tunable matching networks can also be realized with transmission lines instead of inductors as shown in FIG. 5A. Slow-wave transmission lines whose slots can be digitally controlled to switch on and off to allow flow of return current as shown in FIG. 5B are also believed to be suitable for use in tunable networks. In slow-wave transmission lines, dynamic changing of the return current flow allows control of characteristic impedance and wave velocity and can also be used for tunable matching. It is also contemplated that further analysis of optimum matching networks will identify other suitable matching networks and other types of actuating mechanisms that can extend useful bandwidth with minimum loss and to control overhead.

Any suitable active devices can be used to control the actuating mechanisms (e.g., one or more tunable matching networks of a power amplifier) and to allow re-configurability. Such active devices can be added in parallel to the core through logic control as shown in FIG. 5C. Active selection of multiple actuating mechanisms can be useful during backoff, for example, to save DC power and also to provide coarse tuning for optimum efficiency and/or optimum output power output, such as for a given input power. The incremental adjustments provided by such active devices can be sized in a weighted fashion, for example, binary weighted in a preferred embodiment, to allow for a relatively fine adjustment. Such incremental adjustments can be related to device sizes. The bias voltage and the threshold voltage through body effect (triple-well process) can be adjusted based on a gain estimate gathered from the output of peak detectors. Temperature sensors can also communicate with the control block (FIG. 4) to provide information on the efficiency of the power amplifier.

The control block of FIG. 4 can adjust, for example, the supply, bias and/or the threshold voltage to optimize performance. Such a control block can include, for example a state-machine in digital logic, software, or any combination thereof. It is contemplated that the "control" and "Bias/Threshold voltage/$V_{dd}$ tuner" blocks of FIG. 4 can be further controlled by a suitable "parent" control process operating on a general purpose programmable computer programmed with a set of instructions recorded on a computer-readable medium. It is contemplated that switches having a suitable wideband as well as a sufficient high off-state isolation and low insertion loss at on-state for use at mm-wave frequencies can be fabricated in CMOS.

Self-Healing PA (Power Amplifier)

We now summarize some of the self-healing techniques described hereinabove by describing a self-healing PA. In order to perform healing, the state of the PA is assessed. Some exemplary relevant metrics (sensed parameters for assessing the state of the PA) include center frequency, PAE, Output Power, Bandwidth, and gain. These metrics can be calculated knowing the input and output power at various frequencies. For example, detection of the output power can be done with an envelope detector with a diode and a low pass filter, to provide a maximum voltage which gives an estimate of output power. The accuracy of the output power estimate relies on how accurately the load impedance is known, which can also be subject to process variations, depending on what the load is and if the load is on-chip or off-chip. Measuring input power can be somewhat more difficult because the load on the input is the gate of the transistor, so process variation, for example, can change the input power for a given measured peak voltage. If the goal is to know the absolute metrics as outlined above, such errors can be problematic. However, if the goal is to maximize or optimize those metrics, knowledge of the absolute value of a given parameter is less important than how that parameter changes during a particular self-healing operation (e.g., tuning) Similarly, the final 50 ohm load at the output might not be exactly 50 ohms. However, the load characteristics (e.g. load impedance, such as, for example, the load impedance of an antenna) generally do not change significantly during tuning, so the output power, relative to other tuning levels, can be known. The same should be true for the input power. In addition, the gate impedance does not change very much as the matching networks are tuned, so relative input power could also be found during the time period of self-healing tuning.

Turning now to PA actuators, one exemplary method for tuning the PA is to use a varactor diode to tune a matching network. In other embodiments, at relatively high frequencies, transmission line matching networks can be preferred over varactor diodes. To tune a transmission line, the length and/or the impedance can be tuned. To tune the length of a shorted stub in a matching network, switches can be used to short a part of the line to ground. It is also believed that in some embodiments, adjustable slotted ground planes on the transmission lines can be used for tuning. If the slots have switches across them, by varying how many of the slots are open, a transmission line can be adjusted from a normal non-slotted line to a fully slotted slow wave line. The load itself can also be varied. In the case of the direct antenna modulation (DAM), which has been described, such as for example, in Babakhani, et. al, Transmitter Architectures Based on Near-Field Direct Antenna Modulation, IEEE Journal of Solid-State Circuits, vol. 43, no. 12, pages 2674-2692, December 2008, switching combinations can be chosen such that the amplifier always sees a 50 ohm antenna. However, other combinations with different impedances can also be used to help better tune the PA. With suitable detection methods, DAM also allows for tuning out the impact of the environment on the load impedance seen be the PA. For example, the self-healing technique can be used to set a switching combination to match into a nominal 50 ohm load, which has been shifted to some other load impedance by, for example, the presence of a nearby object. In addition, the bias voltage on the gate and the bias voltage on the drain can be adjusted to change the gain and set the operation point of the amplifier.

Figure 6:
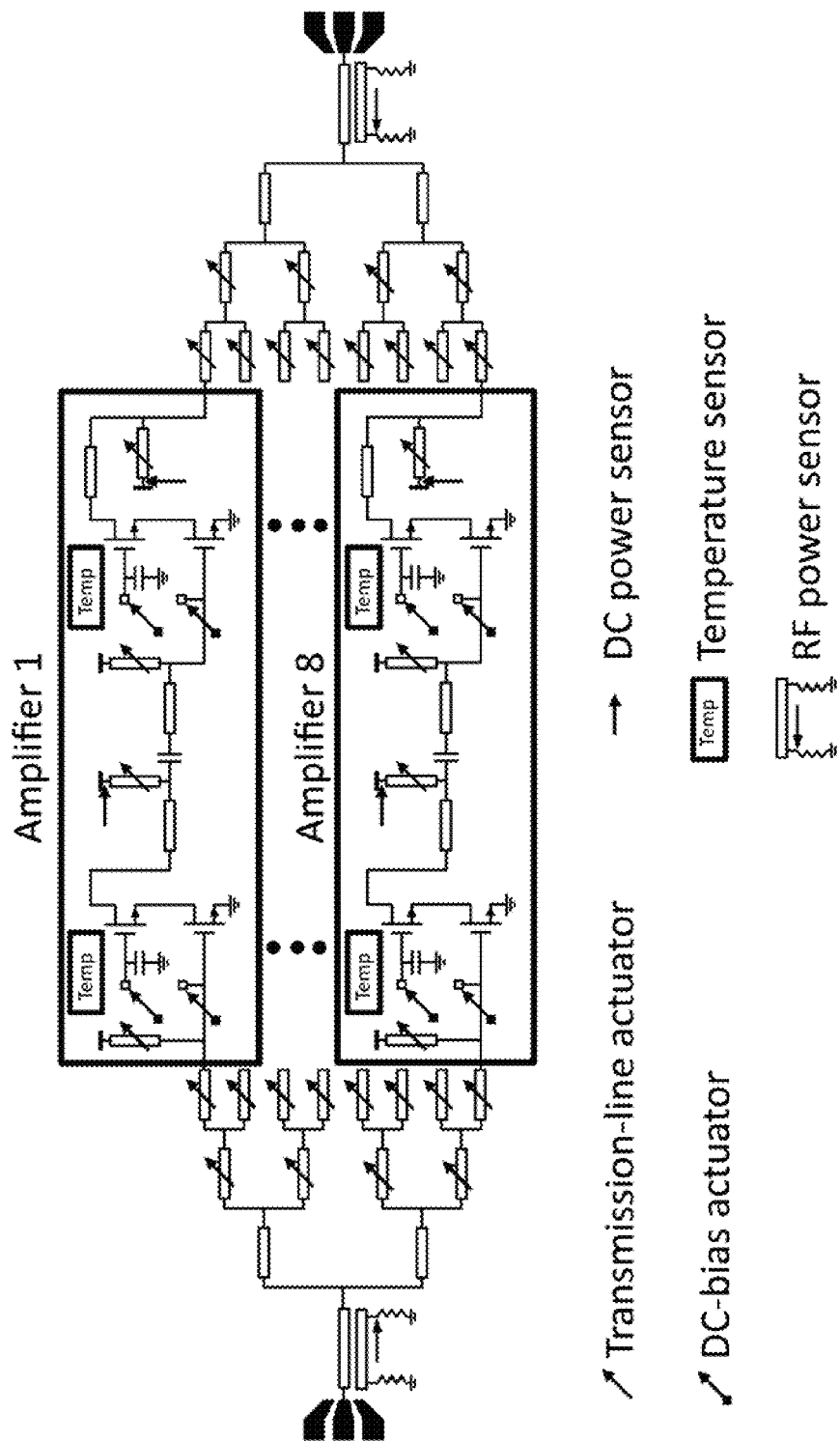
FIG. 6 shows a block diagram of one exemplary embodiment of a self healing power amplifier having eight parallel amplifier stages

FIG. 6 shows a block diagram of one exemplary embodiment of a self healing power amplifier having eight parallel amplifier stages. An input signal is divided by a plurality of transmission-line actuators (e.g. tunable transmission lines as discussed hereinabove) to feed the eight parallel amplifier sections. DC-bias actuators are also shown in each of the eight amplifier stages. The outputs of the eight amplifier sections are combined into a single power output using transmission-line actuators. Exemplary sensors (suitable for measurement of relevant performance metrics, as described in detail hereinabove) include temperature sensors and power sensors.

Self-Healing Power Amplifiers

Exemplary Embodiments

In the description which follows, following general remarks on power amplifier design, we describe two exemplary embodiments of self healing power amplifiers according to the invention.

Figure 7A:
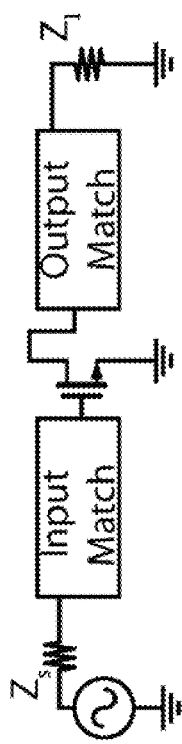
FIG. 7A shows a block diagram of a class AB amplifier.
Figure 7B:
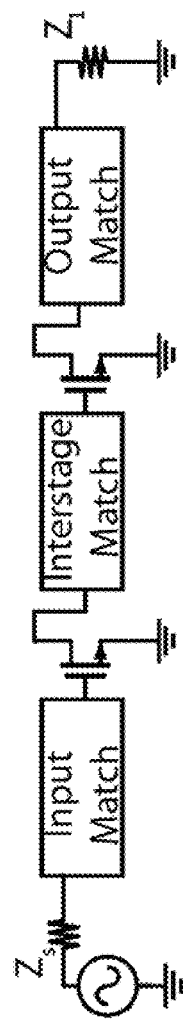
FIG. 7B shows a block diagram of the class AB amplifier design of FIG. 7A with an addition input transistor stage.
Figure 7C:
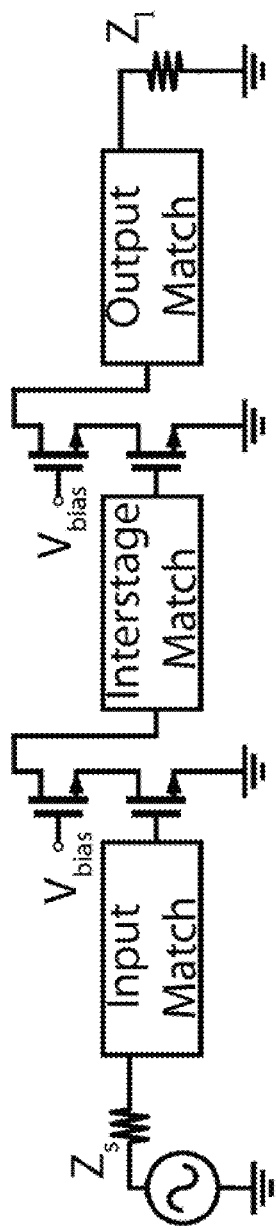
FIG. 7C shows a block diagram of the power amplifier of FIG. 7B where the common source transistor stages have been replaced by cascode transistor stages.

FIG. 7A to FIG. 7C show exemplary amplifier stages suitable for use in power amplifiers. FIG. 7A shows a block diagram of a basic class AB amplifier design using a common source transistor with input and output matching blocks. In a first improvement, FIG. 7B shows a block diagram of the basic class AB amplifier design of FIG. 7A having an input transistor stage and a corresponding interstage matching block. FIG. 7C shows a block diagram of the power amplifier of FIG. 7B where the common source transistor stages have been replaced by cascode transistor stages to increase voltage swing, gain, and stability. Transistor size can be increased to increase output power. The size of the individual transistors is generally limited by the ability to achieve a particular desired impedance match. Thus, there is a limit to the power that can be attained for each power amplifier stage.

Figure 8:
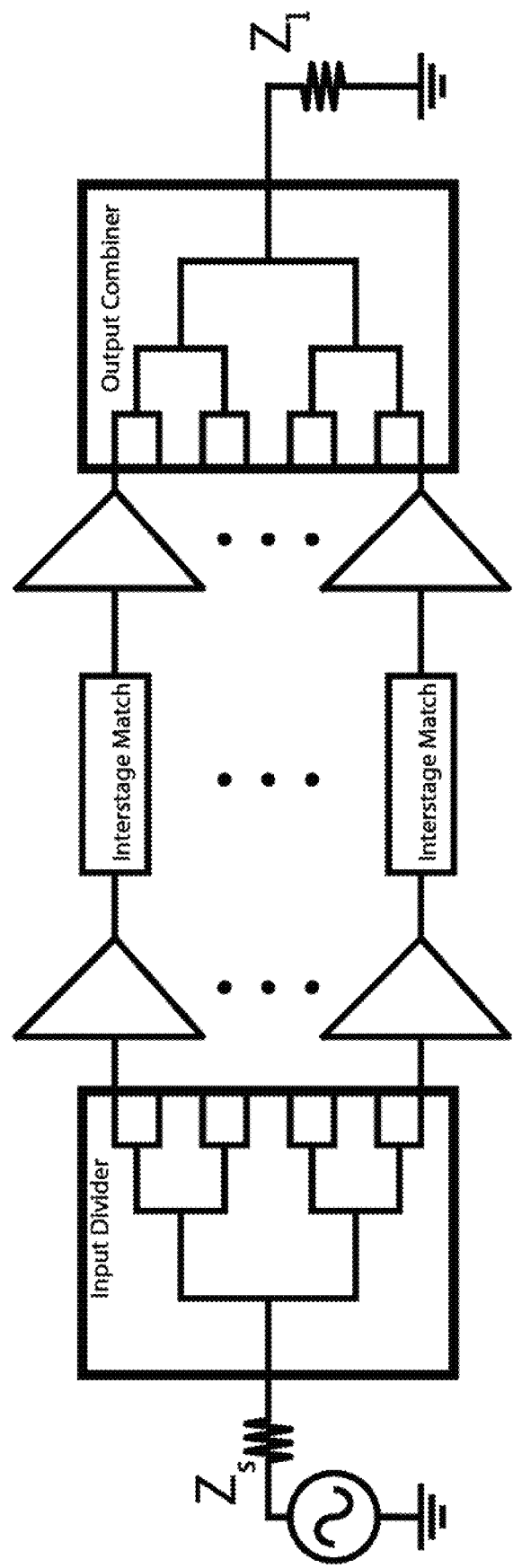
FIG. 8 shows a block diagram of a power amplifier having a plurality of parallel amplifier stages.

FIG. 8 shows a block diagram of a power amplifier having a plurality of parallel amplifier stages, such as those of FIG. 7A to FIG. 7C. Parallel operation is achieved by use of an input divider and an output combining matching network (output combiner). The power combiner can gradually transform the impedance as it combines power from the individual power amplifier stages. Since all of the outputs of the amplifier stages are operating in phase and with the substantially the same amplitude, the need for isolation between the input ports has been alleviated. Thus, the lines can be made shorter than, for example, would be the case with a ¼ wavelength Wilkinson combiner.

Figure 9:
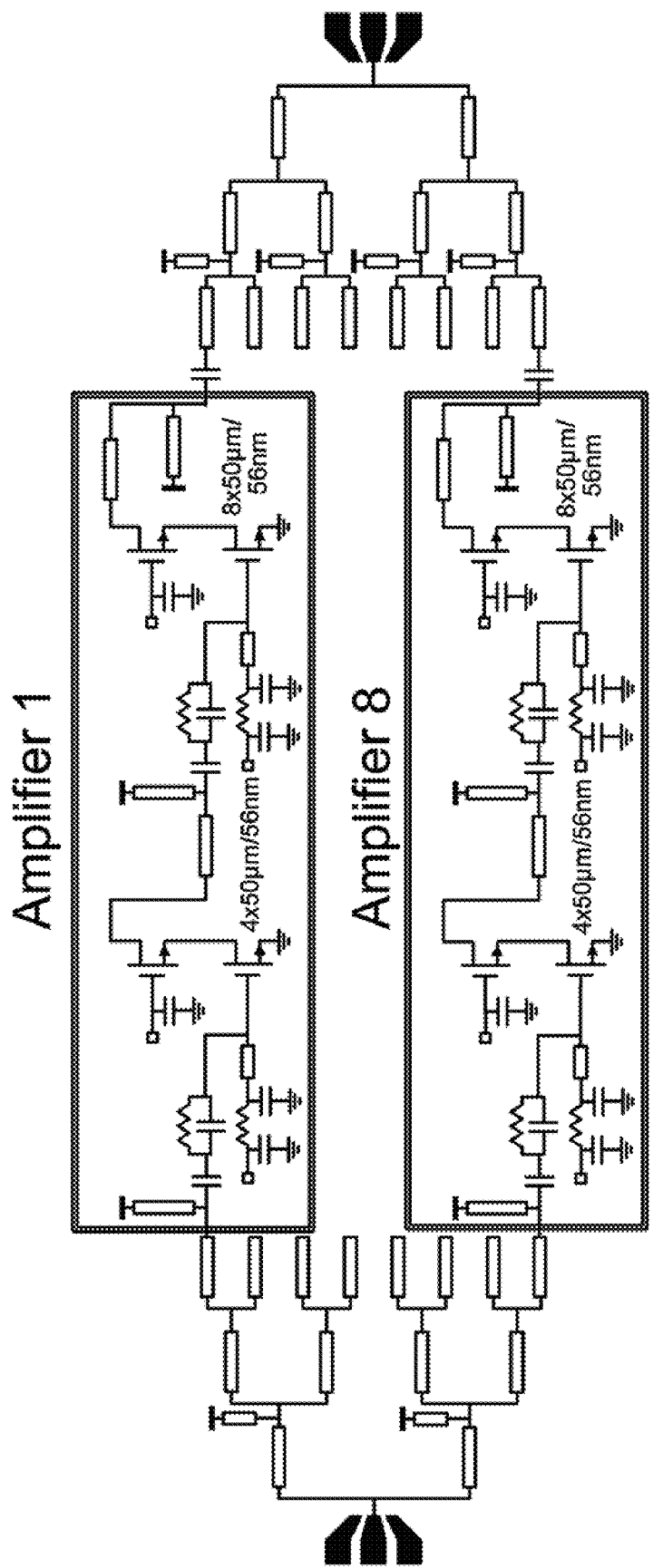
FIG. 9 shows a block diagram of one exemplary embodiment of a power amplifier according to the invention.

FIG. 9 shows a block diagram of an exemplary embodiment of a power amplifier according to the invention. The input and output combining networks use a combination of series and stub transmission lines. A resistor-capacitor (RC) network at the gate of the lower cascode transistor improves the low frequency stability of the power amplifier.

Figure 10:
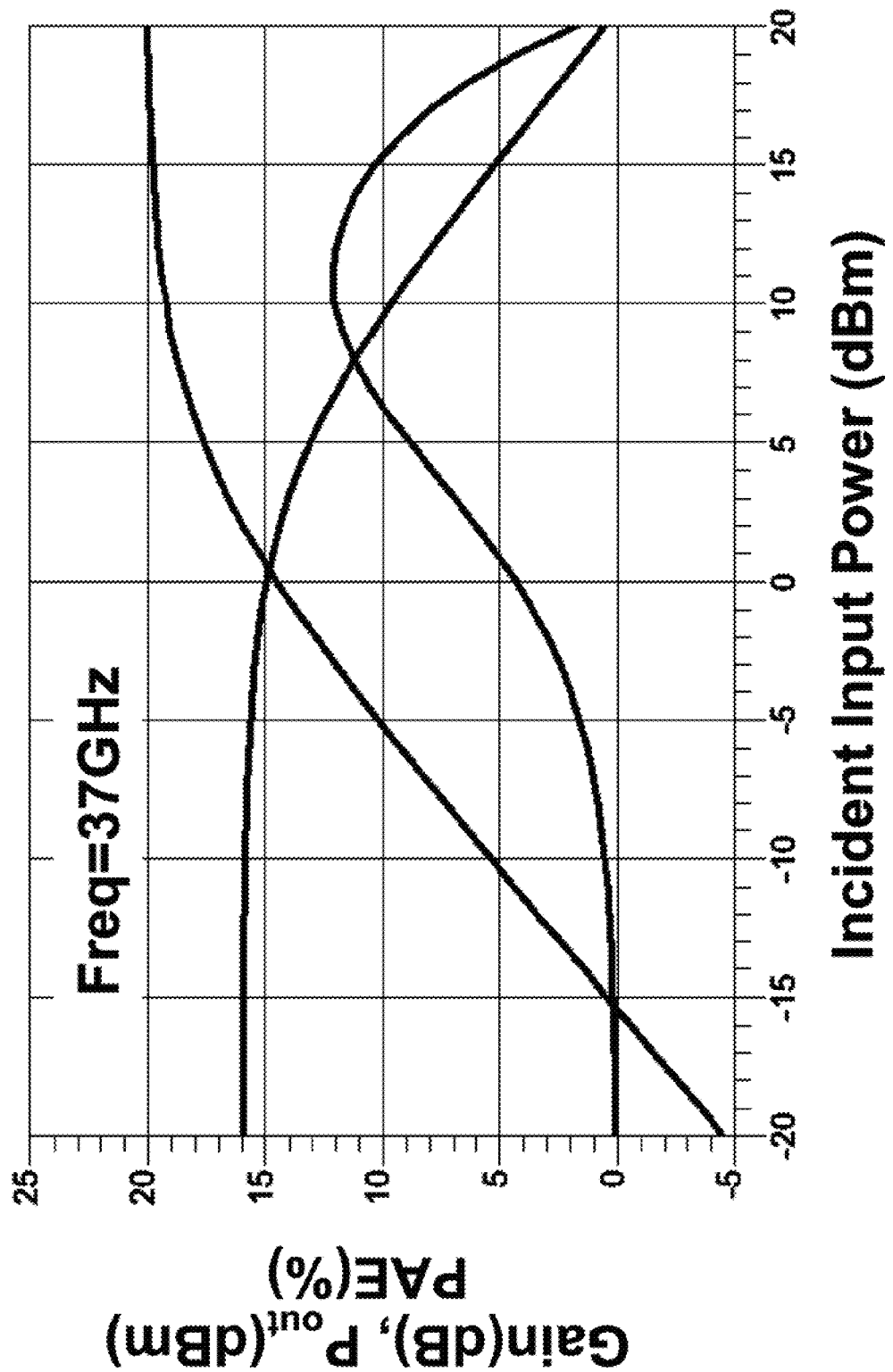
FIG. 10 shows a graph of gain, power output, and PAE (%) plotted versus incident input power.
Figure 11:
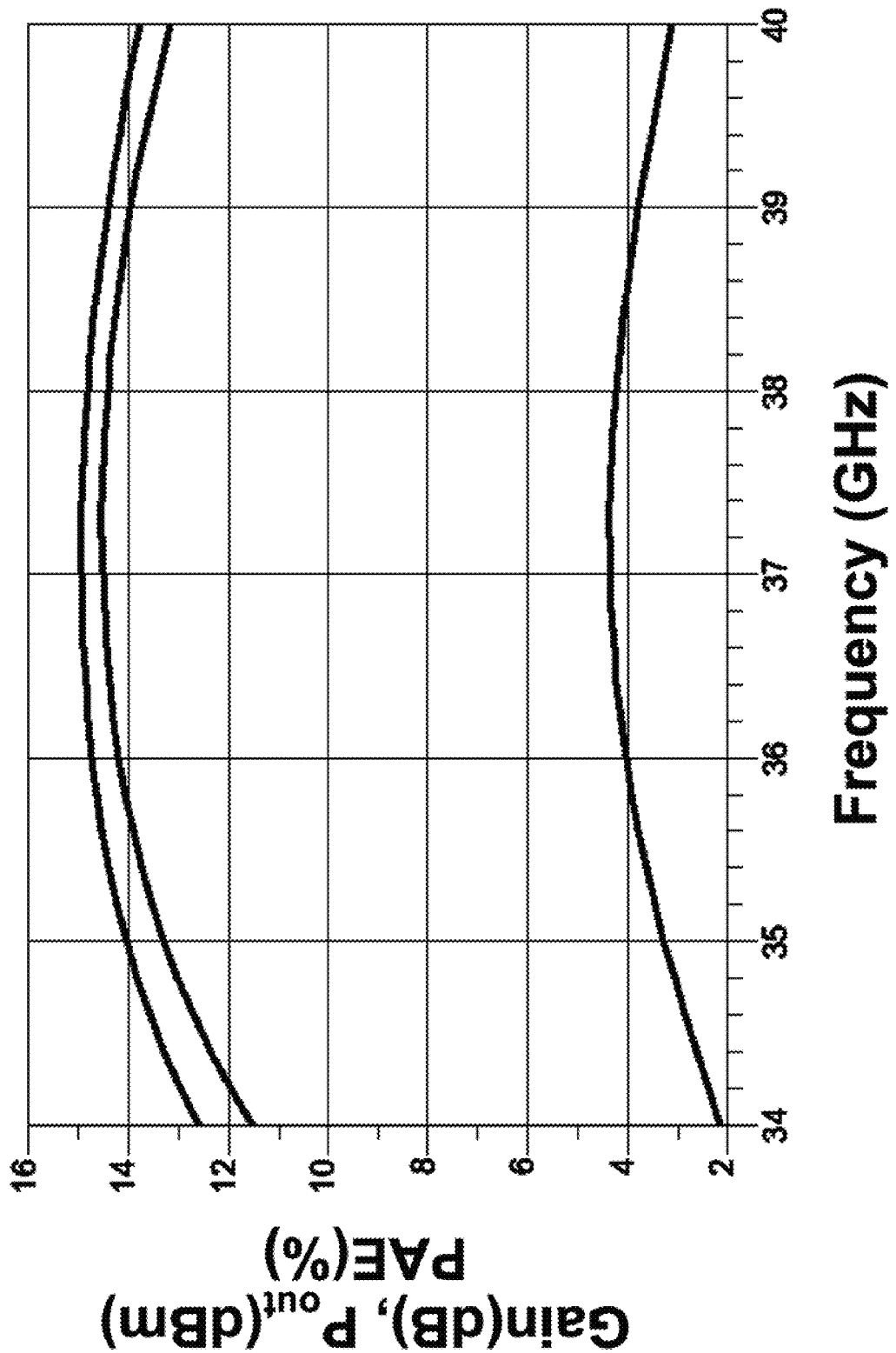
FIG. 11 shows a graph of gain, power output, and PAE (%) plotted versus operating frequency.
Figure 12:
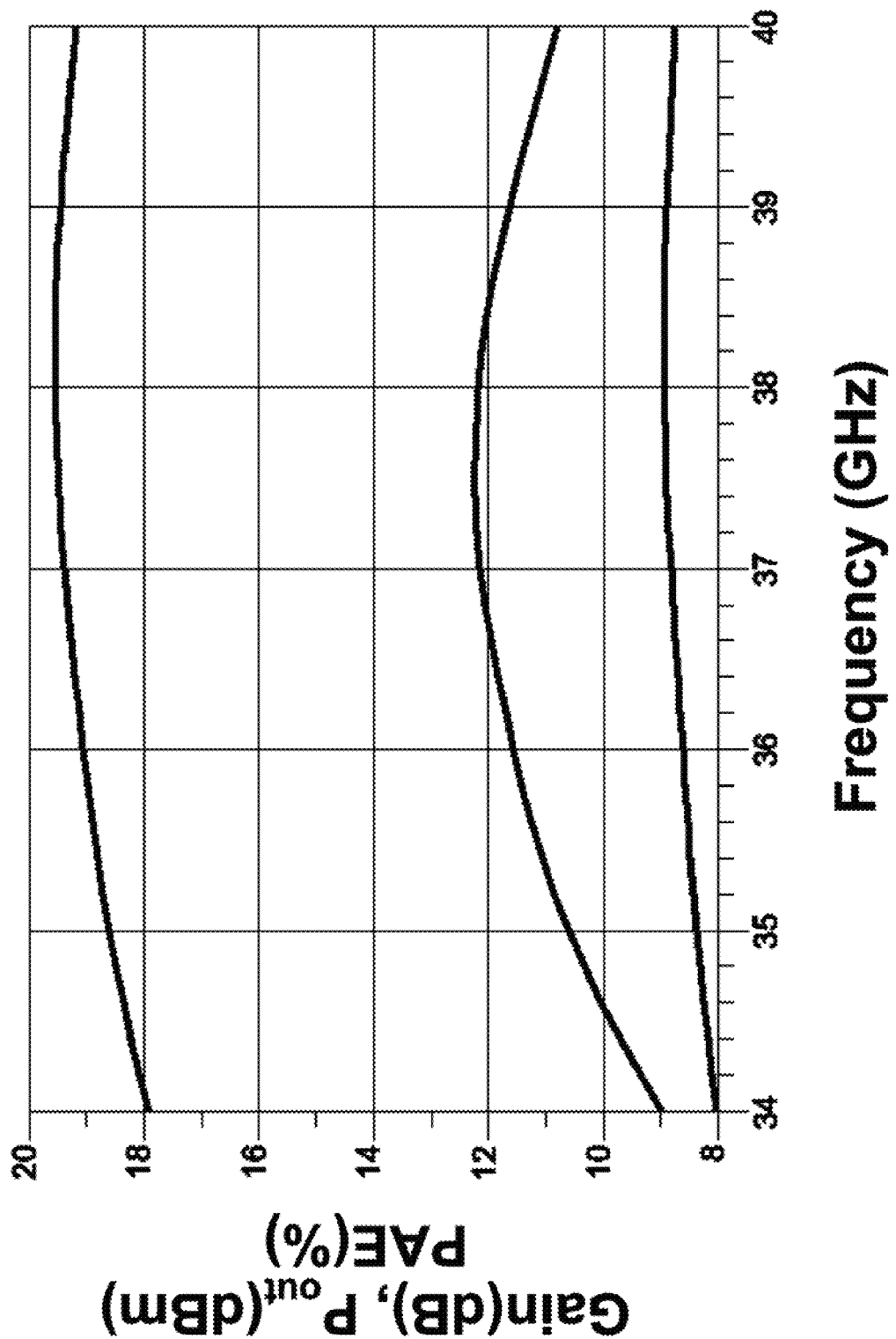
FIG. 12 shows a graph of gain, power output, and PAE (%) plotted versus operating frequency where PAE was maximized.

FIG. 10 shows a graph (simulation results) of gain, power output, and PAE (%) plotted versus incident input power (dBm) at 37 GHz. This modeled self-healing power amplifier achieved a $PAE_{max}$ of 12.1% at $P_{out}$=19.4 dBm and the Gain=8.8 dB, $P_{sat}$=20.1 dBm, the Small-signal gain=15.9 dB, and the $P_{out\_1dBCP}$=14.5 dBm at $P_{inc}$=0 dBm, and $PAE_{1dBCP}$=4.3%. FIG. 11 shows a graph of gain, power output, and PAE (%) plotted versus operating frequency from 34 GHz to 40 GHz for $P_{inc}$=0 dBm ($P_{inc}$ refers to incident power) where the gain was 1 dB compressed. At $P_{inc}$=0 dBm where the gain is 1 dB compressed: $P_{out}$=12.6 dBm (34 GHz), 14.9 dBm (37.2 GHz), 13.8 dBm (40 GHz), $PAE_{1dBCP}$=2.1% (34 GHz), 4.3% (37.2 GHz), and 3.1% (40 GHz). FIG. 12 shows a graph of gain, power output, and PAE (%) plotted versus operating frequency from 34 GHz to 40 GHz for $P_{inc}$=11 dBm where PAE was maximized. At $P_{inc}$=11 dBm where PAE is maximum: $P_{out}$=17.9 dBm (34 GHz), 19.5 dBm (38.2 GHz), 19.2 dBm (40 GHz), PAE=9.0% (34 GHz), 12.2% (37.6 GHz), and 10.8% (40 GHz).

Figures 14A, 14B:
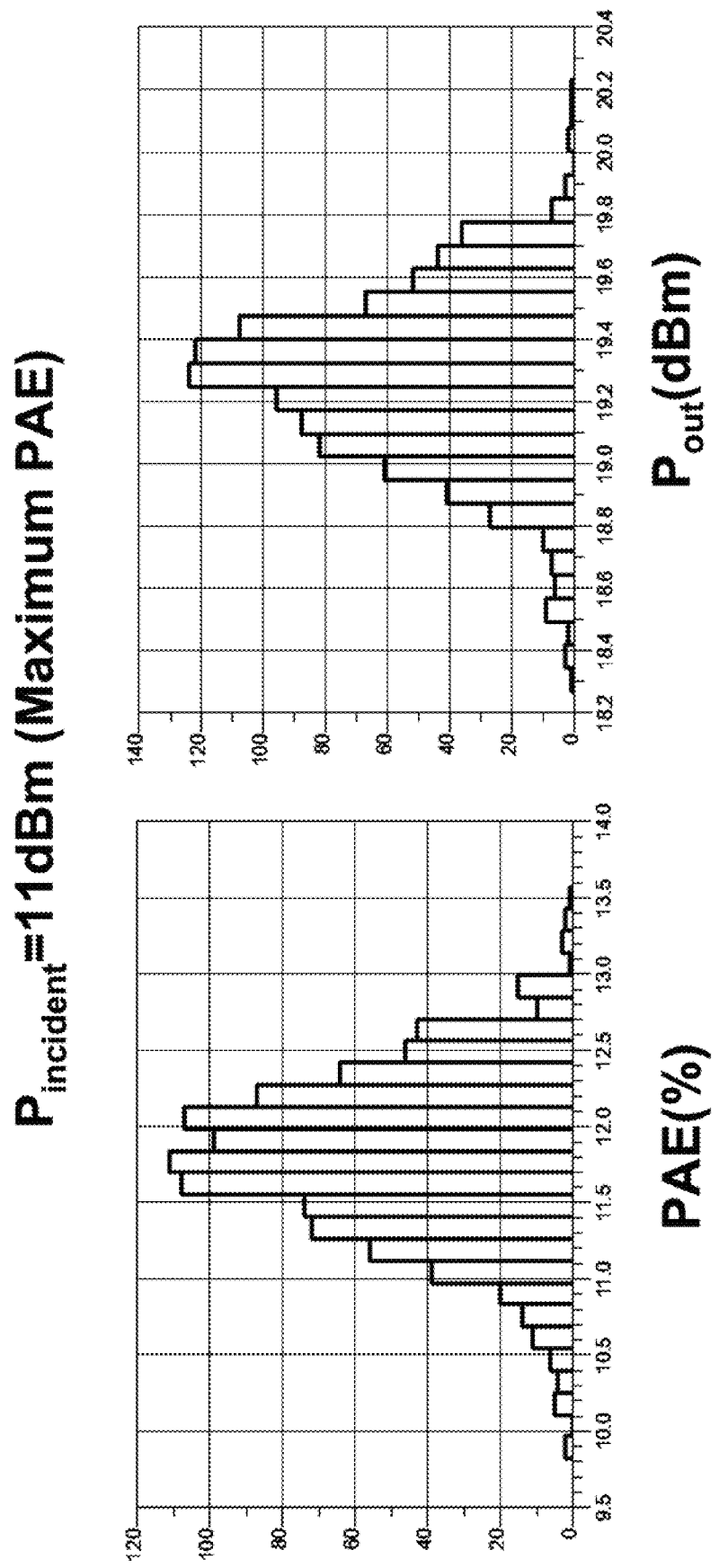
FIG. 14A shows a histogram of number of occurrences plotted versus PAE (%).
FIG. 14B shows a histogram of number of occurrences plotted versus $P_{out}$ (dBm).

FIG. 13A and FIG. 13B show histograms of Monte Carlo simulations at $P_{inc}$=0 dBm (with 1 dB compression). 1000 trials were used in the Monte-Carlo simulations. Both process and mismatch variations were included. FIG. 13A shows a histogram of number of occurrences plotted versus PAE (%). FIG. 13B shows a histogram of number of occurrences plotted versus $P_{out}$ (dBm). FIG. 14A and FIG. 14B show histograms of Monte Carlo simulations at $P_{inc}$=11 dBm (at maximum PAE). 1000 trials were used in the Monte-Carlo simulations, and both process and mismatch variations were included. FIG. 14A shows a histogram of number of occurrences plotted versus PAE (%). FIG. 14B shows a histogram of number of occurrences plotted versus $P_{out}$(dBm).

Figure 14C:
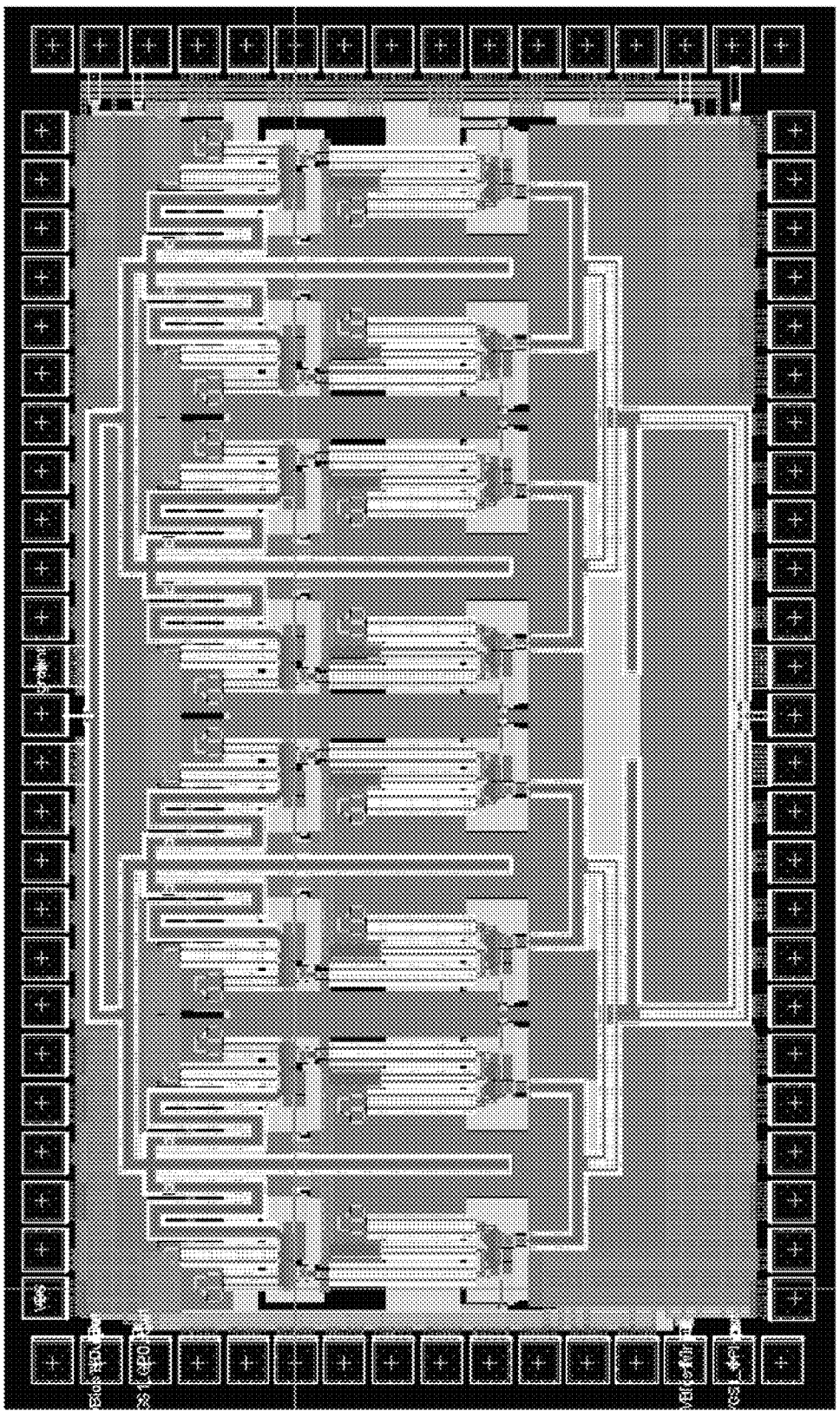
FIG. 14C shows a preliminary layout design for a self-healing power amplifier.

FIG. 14C shows a preliminary exemplary layout design of a self-healing power amplifier. The power amplifier dimensions are 1.6 mm×2.8 mm and only body-contacted analog transistors (56 nm) were used.

Now, turning to another exemplary embodiment, the input and output distribution networks were modified by removing extra stub transmission lines to reduce loss in the distribution and combining networks. Also, the number of fingers of the transistors was reduced. The decrease in the physical size of the transistors also minimized performance degradation caused by modeling inaccuracies related to large transistors.

Figure 15:
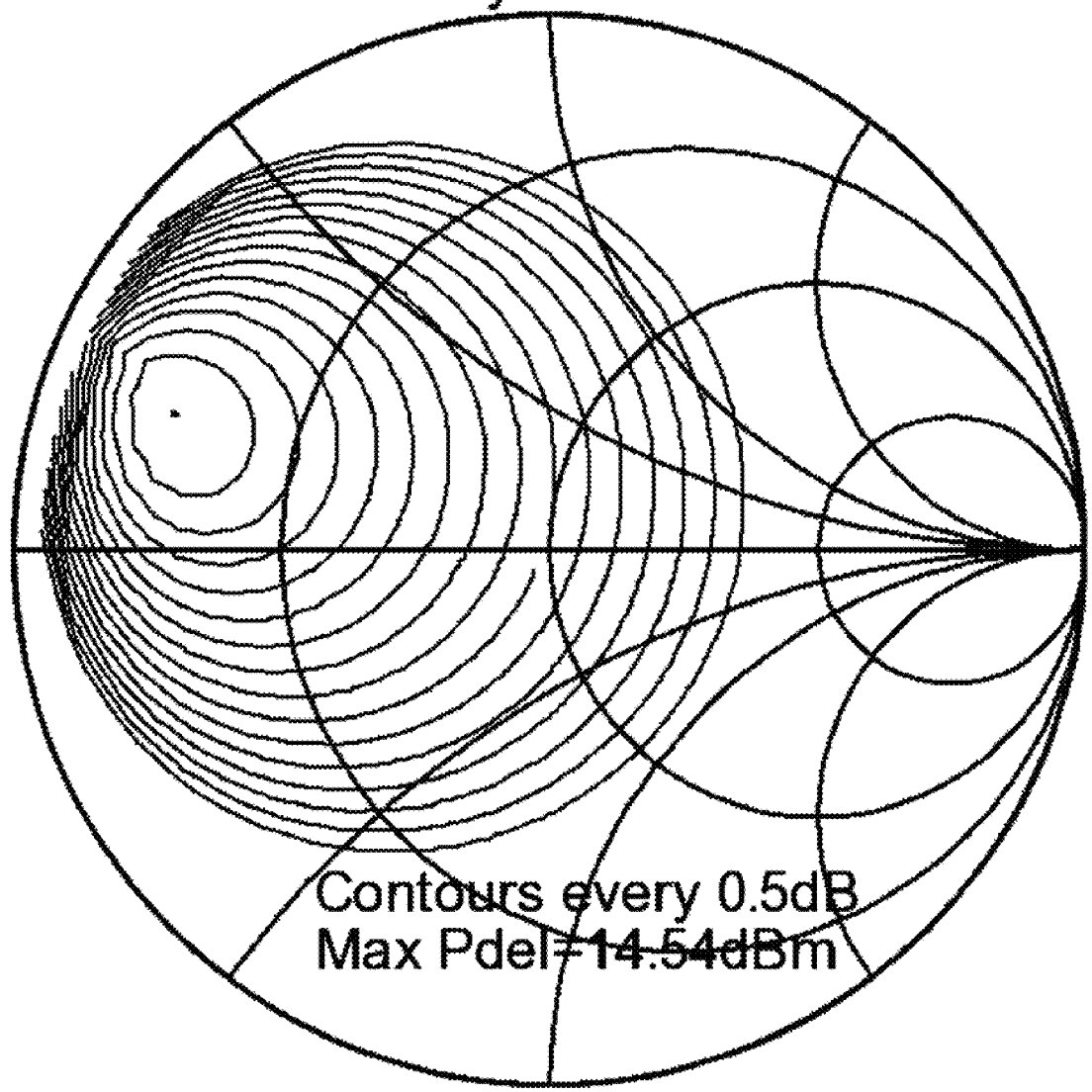
FIG. 15 shows a Smith chart of transistor delivered power for various impedances seen by the drain and illustrates load pull with transistor sizing.

FIG. 15 shows a Smith chart of transistor delivered power for various impedances seen by the drain and illustrates load pull with transistor sizing. Output transistors sized at 200 µm/65 µm were body contacted. The load simulation shows a load impedance which transfers a fixed power to the combining network. $P_{max-saturated}$=14.5 dBm/output stage. The maximum transistor saturated efficiency=40.9%.

Figure 16:
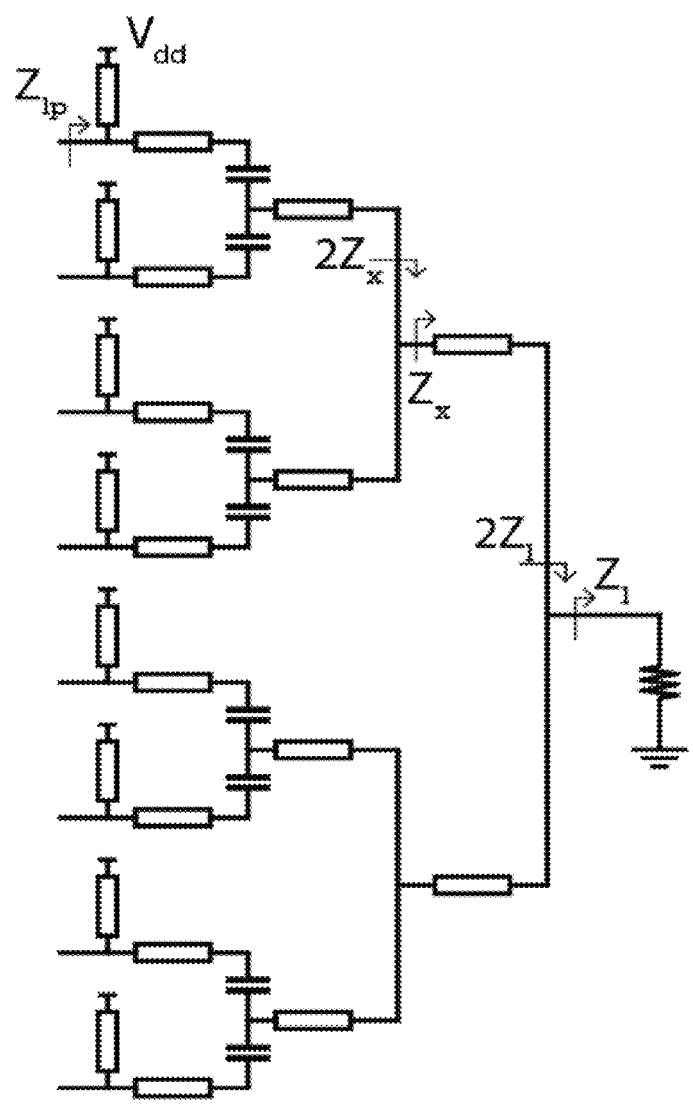
FIG. 16 shows a schematic diagram of one exemplary combiner.

FIG. 16 shows a schematic diagram of one exemplary combiner which can be used in a self-healing power amplifier. In such a circuit topology, a DC bias capacitor can be made relatively small, since it can be incorporated into the matching network. DC drain currents can be supplied through the stubs. Because all of the output stages operate in unison, each "T" effectively doubles the previous load impedance. $Z_{lp}$ can be set to a nearly optimum load impedance using a standard load pull simulation.

Figure 17:
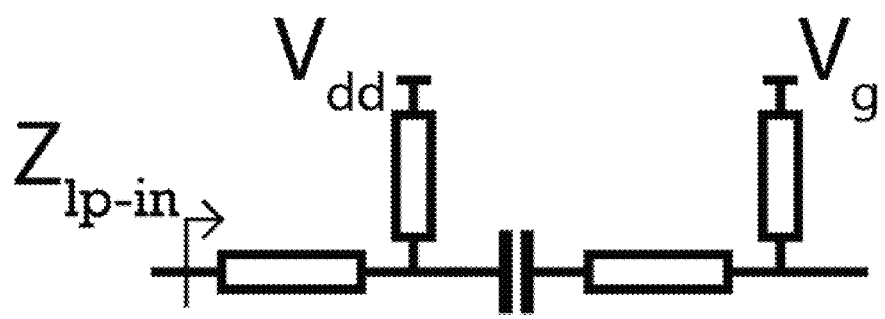
FIG. 17 shows a schematic diagram of one exemplary inter-stage matching network.

FIG. 17 shows a schematic diagram of one exemplary inter-stage matching network which can be used in a self-healing power amplifier. An optimum input match of the second stage is a conjugate match of the gate. The input of the matching network can then be matched to an optimum impedance as determined by a load pull simulation of the input stage. In some embodiments, the first stub biases the input stage's drain and the second stub biases the output stage's lower gate. A bypass capacitor can become part of the matching network.

Figure 18B:
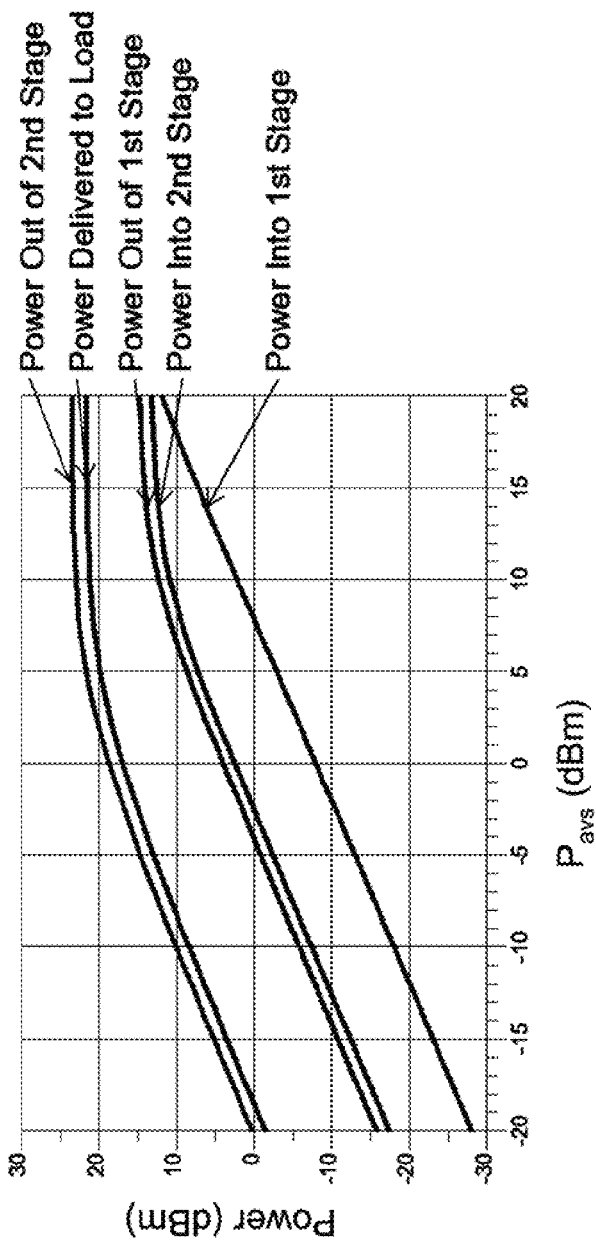
FIG. 18B shows a graph of Power (dBm) plotted versus $P_{avs}$ (dBm).
Figure 18A:
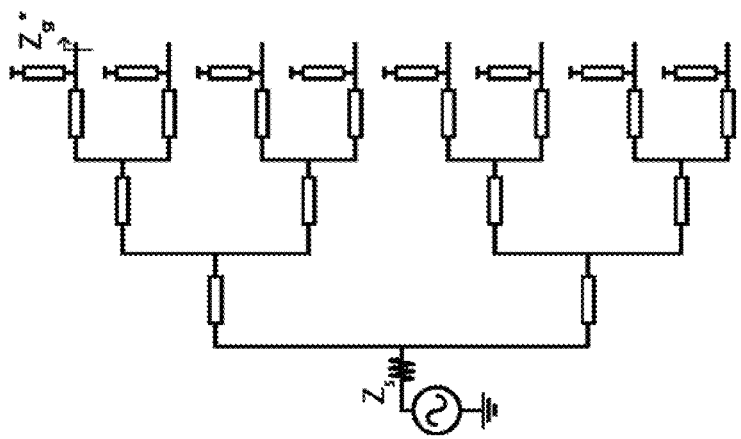
FIG. 18A shows a schematic diagram of one exemplary input divider and input stage.

FIG. 18A shows a schematic diagram of one exemplary input divider and input stage suitable for use in a self-healing power amplifier. The input amplifier can be sized such that it will saturate soon after causing the output stage to saturate (e.g. ¼ the size of the output stage). FIG. 18B shows a graph of Power (dBm) versus $P_{avs}$(dBm) for power of the second stage, power delivered to the load, power out of the first stage, power into the second stage, and power into the first stage. An input divider operates similar to an output combiner.

Figure 19A:
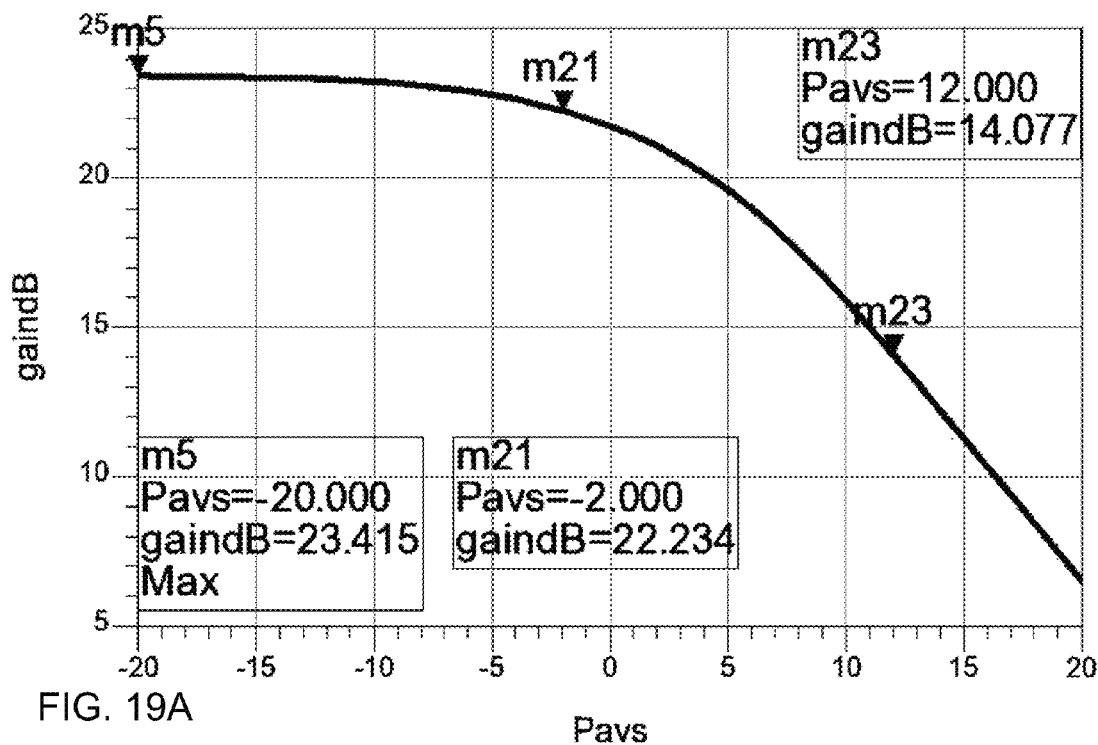
FIG. 19A shows a graph of gain (dB) plotted versus $P_{avs}$.
Figure 19B:
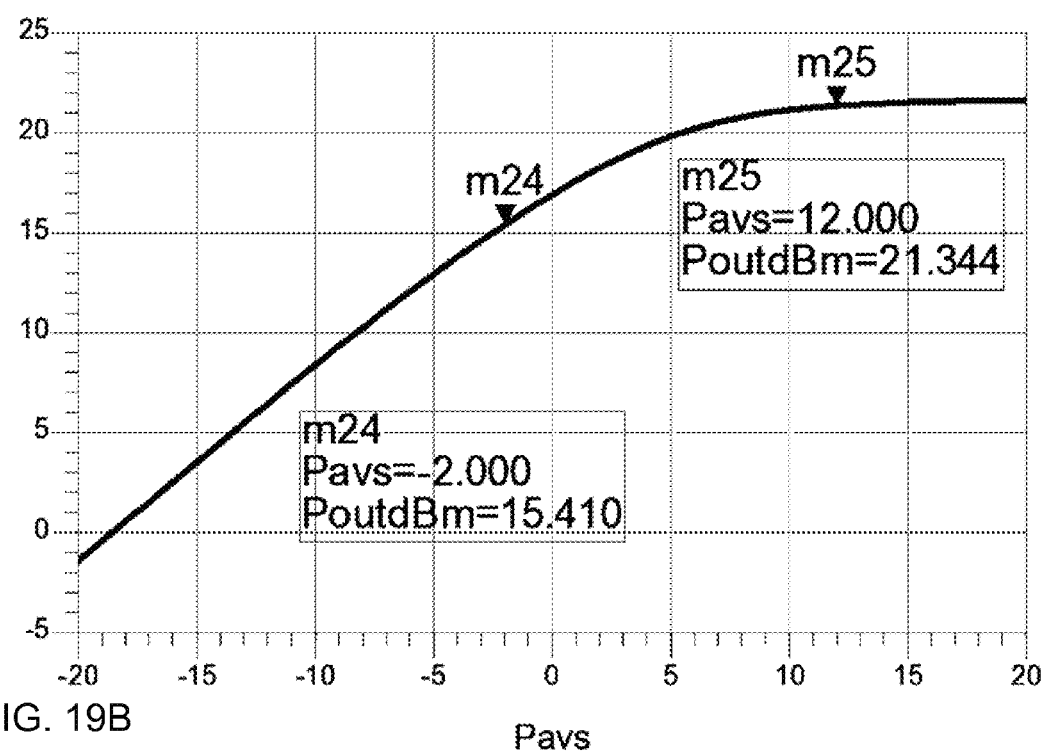
FIG. 19B shows a graph of $P_{out}$ (dBm) plotted versus $P_{avs}$.
Figures 19C, 19D:
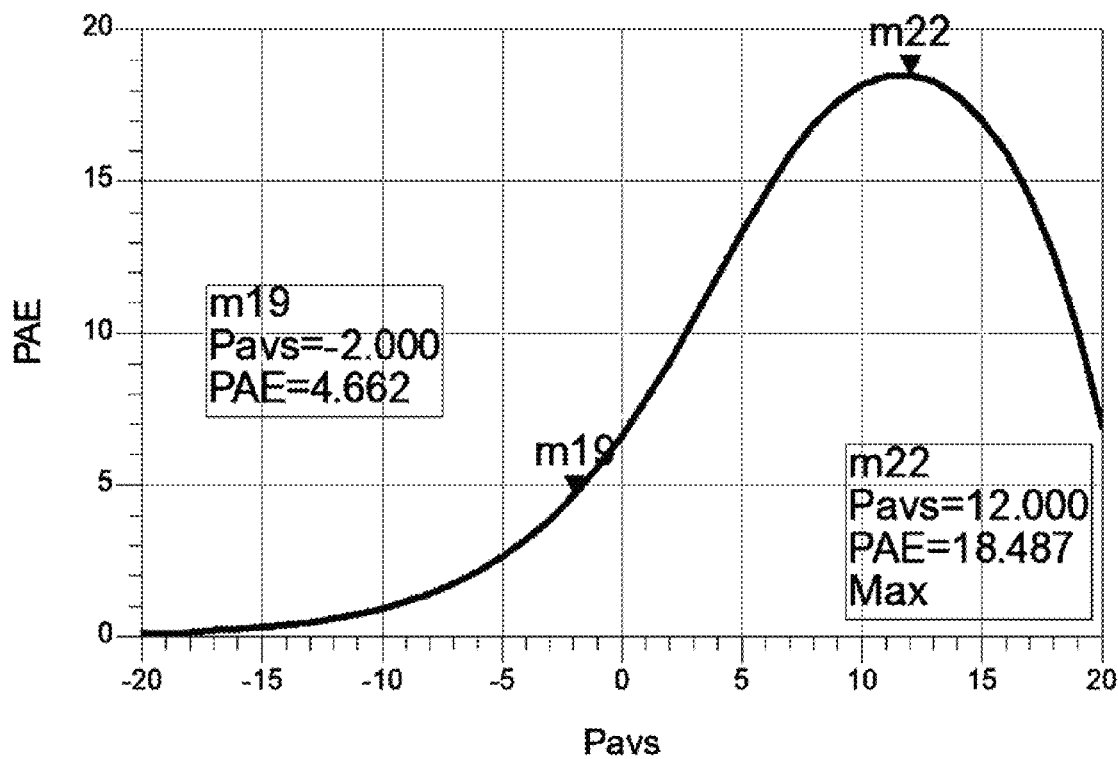
FIG. 19C shows a plot of PAE plotted versus $P_{avs}$.
FIG. 19D shows a table of Gain, $P_{out}$, and PAE.

FIG. 19A to FIG. 19C shows graphs of power amplifier simulated performance. FIG. 19A shows a graph of gain (dB) plotted versus $P_{avs}$. FIG. 19B shows a graph of $P_{out}$ (dBm) plotted versus $P_{avs}$. FIG. 19C shows a plot of PAE versus $P_{avs}$. FIG. 19D shows a table of Gain, $P_{out}$, and PAE for a 1 dB compression point, and for saturated power.

Figure 20A:
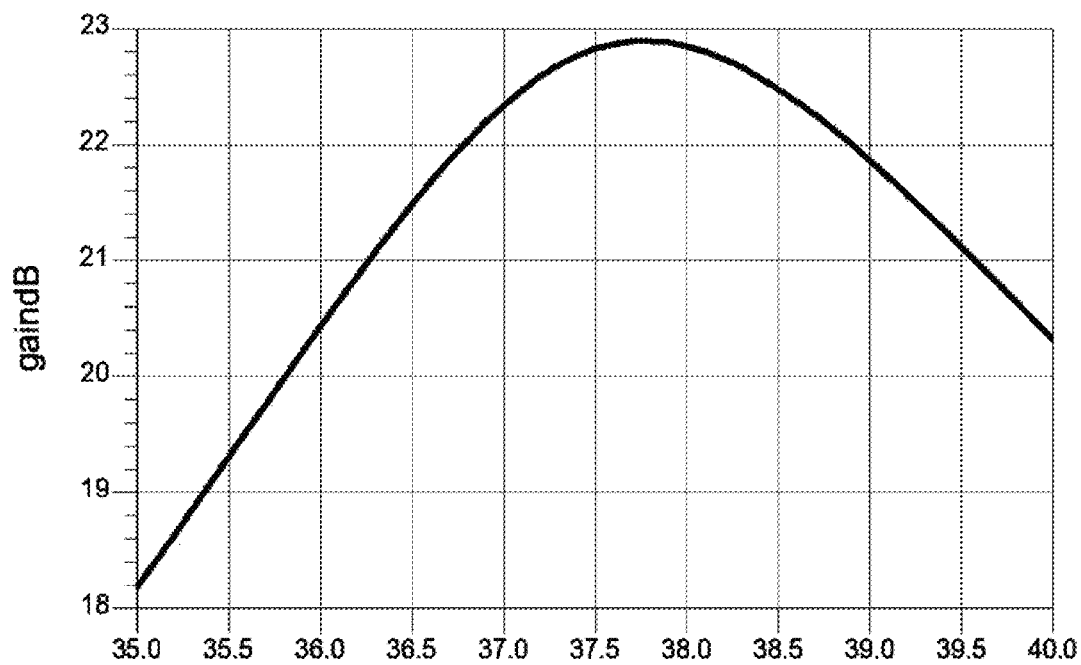
FIG. 20A shows gain (dB) plotted versus frequency.
Figure 20B:
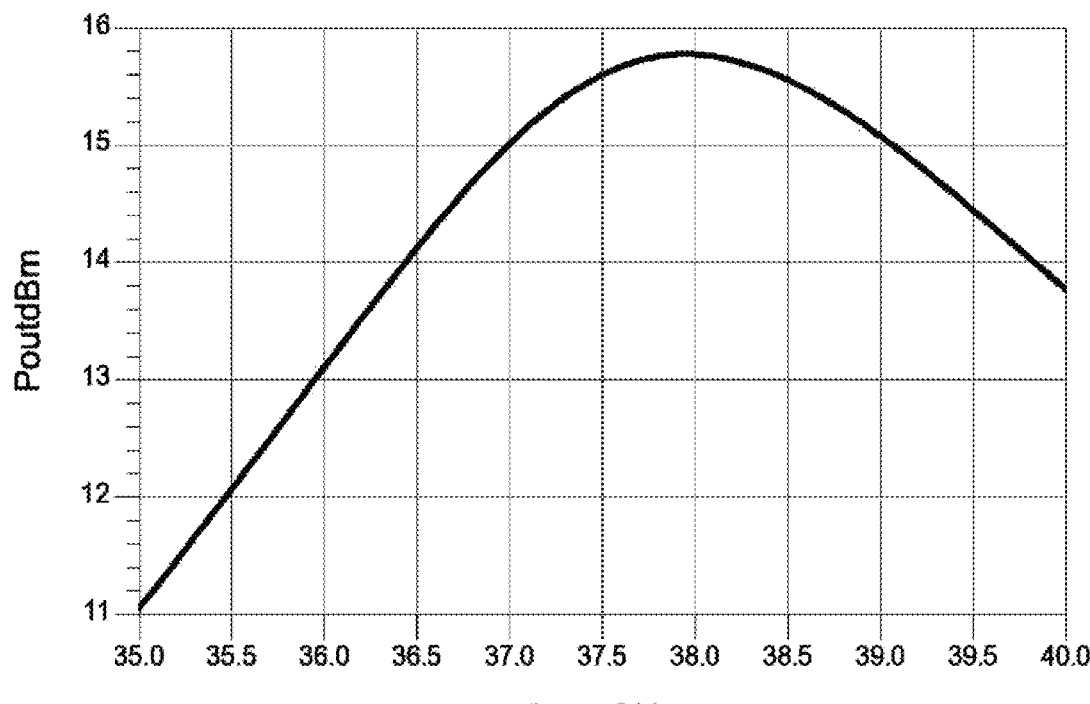
FIG. 20B shows $P_{out}$ (dBm) plotter versus frequency.

FIG. 20A to FIG. 20C show graphs of power amplifier specifications across a frequency range of 35 GHz to 40 GHz with a simulated power amplifier operation at the 1 dB compression point ($P_{avs}$=−2.5 dBm). FIG. 20A shows gain (dB) plotted versus frequency. FIG. 20B shows $P_{out}$ (dBm) plotter versus frequency. FIG. 20C shows a graph of PAE plotted versus frequency.

FIG. 21A to FIG. 21C show histograms of Monte Carlo power amplifier simulations with the power amplifier operating at the 1 dB compression point ($P_{avs}$=−2.5 dBm) at a frequency of 37 GHz. FIG. 21A shows a histogram of number of samples versus gain (dB). FIG. 21B shows a corresponding histogram of number of samples versus output power (dBm), and FIG. 21C shows a corresponding histogram of PAE (%).

Figure 22:
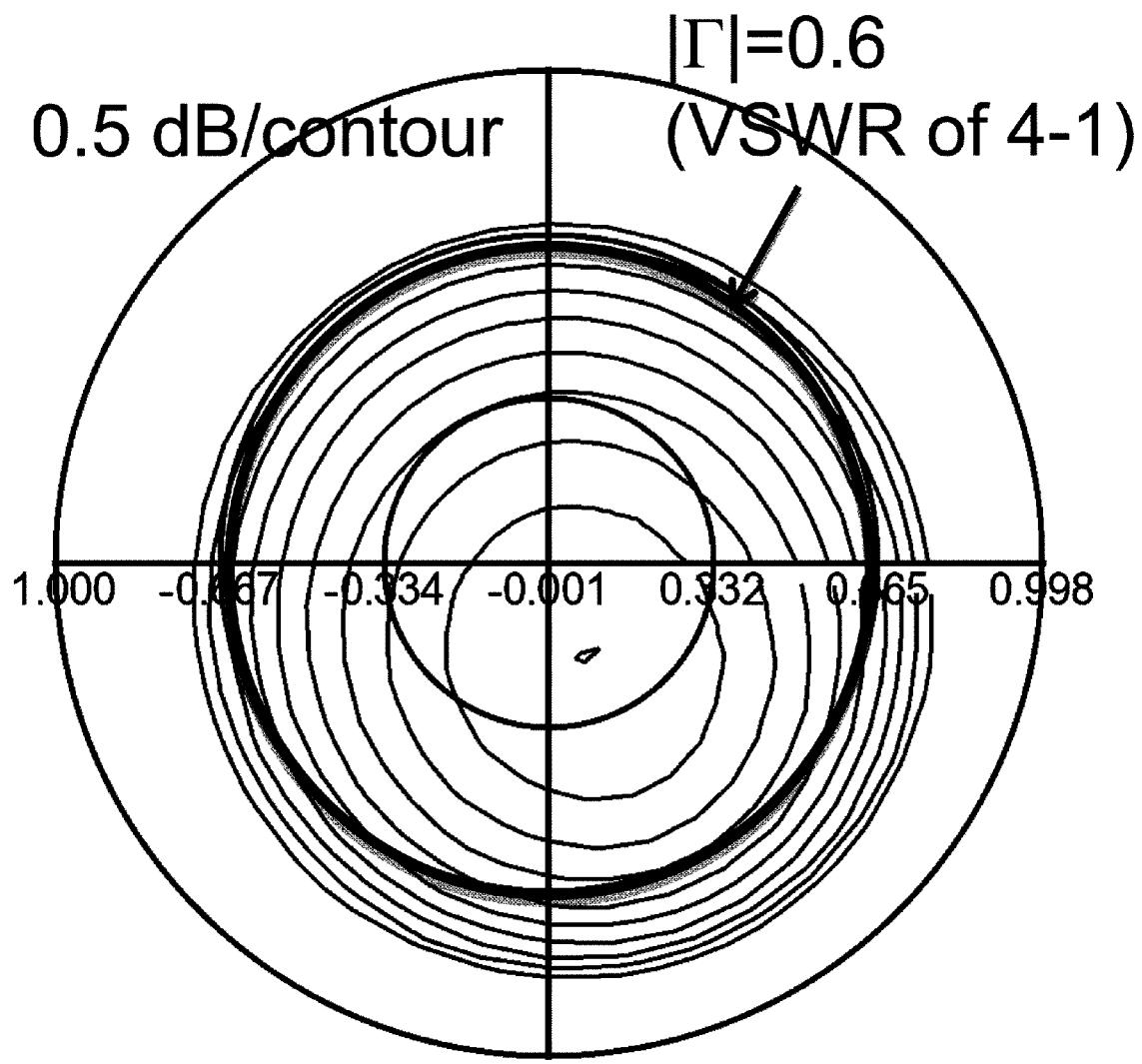
FIG. 22 shows a Smith chart of the output load reflection coefficient.

Voltage standing wave ratio (VSWR) events can occur, for example, if a power amplifier is attached to an antenna and the environment around the antenna changes. A nominal combiner design typically assumes a load impedance of 50 ohms, however a VSWR event can throw off the match and decrease the output power. FIG. 22 shows a Smith chart of the output load reflection coefficient with 50 ohms at the origin. Looking at the 4-1 VSWR circle, output power decreases by as much as 3.5 dB compared to a 50 ohm load. While the power amplifier is robust for $|\Gamma|<0.3$, it quickly loses power beyond that point.

Actuators

Figure 23:
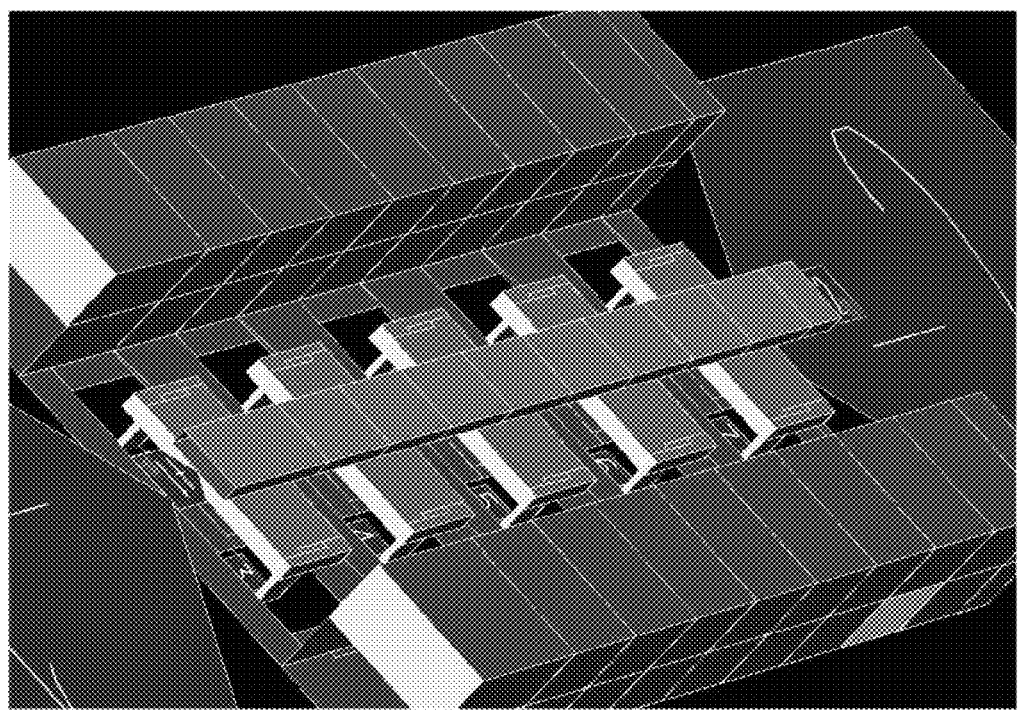
FIG. 23 shows a drawing of one exemplary tunable transmission line.

FIG. 23 shows a drawing of one exemplary tunable transmission line. Tunable transmission lines are suitable for use as actuators in a self-healing power amplifier. Switchable metal capacitors can be placed inside of the transmission line. This actuation mechanism can change both the effective dielectric constant as well as the intrinsic impedance of the line. There is a tradeoff between tune-ability and loss.

Figure 24:
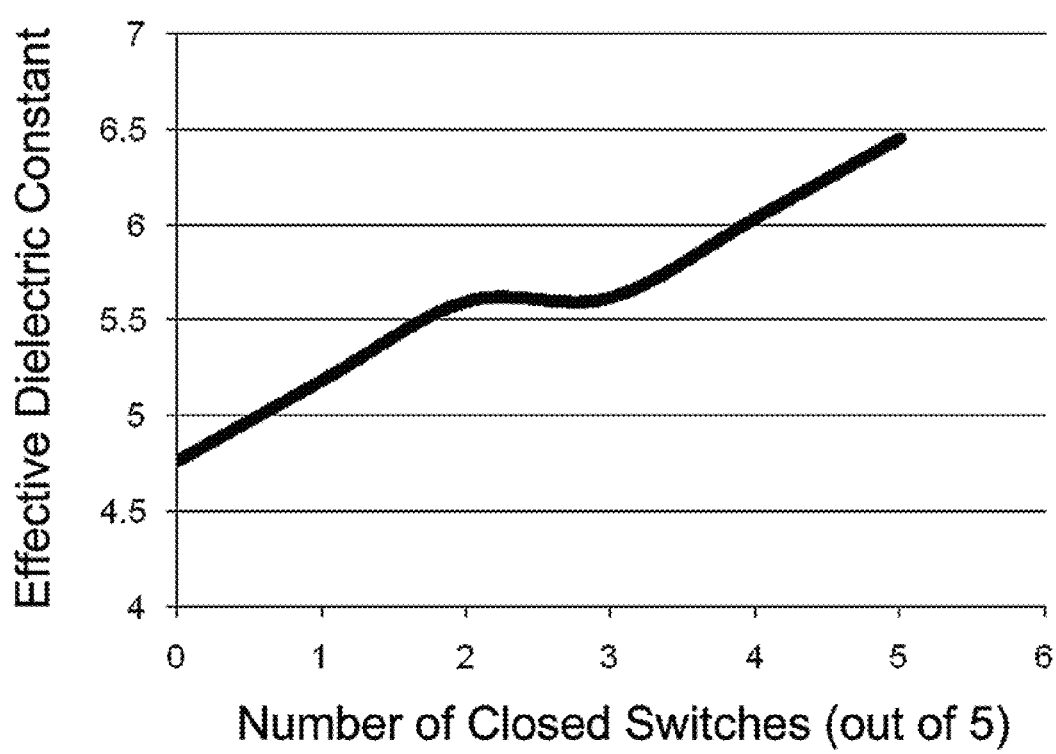
FIG. 24 shows a graph of effective dielectric constant plotted versus the number of close switches for one simulation model.

Several transmission lines were simulated in IE3D (available from Mentor Graphics of Austin, Tex.) and then modeled as tunable transmission lines using ADS (available from Agilent Technologies of Santa Clara, Calif.). Since the parameters of the transmission line vary monotonically with the number of closed switches, the percentage of the closed switches can be used as an actuating variable. FIG. 24 shows a graph of effective dielectric constant plotted versus the number of close switches for one exemplary simulation model.

For coarse tuning, switches can be added on the stubs that will short out the line at various points, effectively changing the length of the stub. FIG. 25 shows a block diagram of an exemplary transmission line having three shorting switches. Such shorting switch arrangements work for stubs, but not for series lines, since shorting out a series line shorts out the signal. Also, switches are typically placed on the second half of the line, since switches closer to the input of the stub can be prohibitively lossy. To make the on resistance very low, transistors as switches can be made very large. The capacitance of relatively large transistors should be taken into account when designing the matching networks.

Figure 26B:
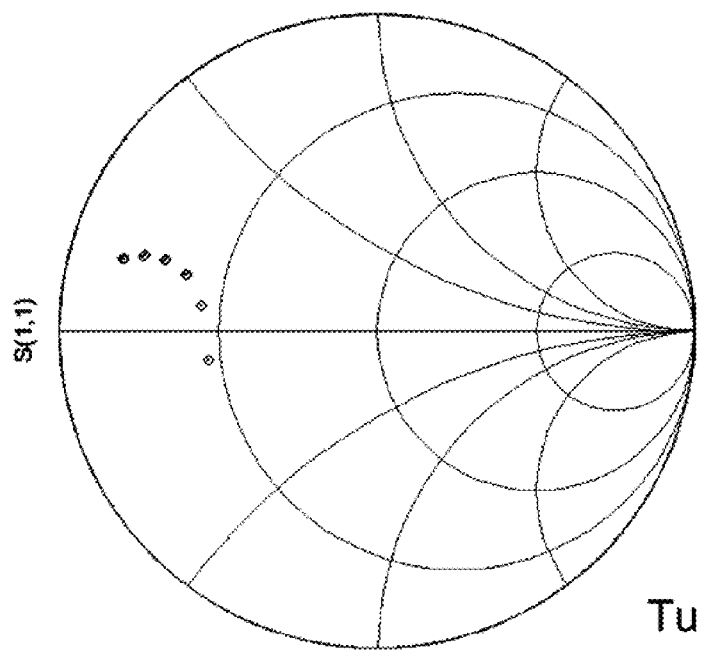
FIG. 26B shows a Smith chart for a self-healing amplifier using coarse tuning alone ($Z_{lp}$).
Figure 26C:
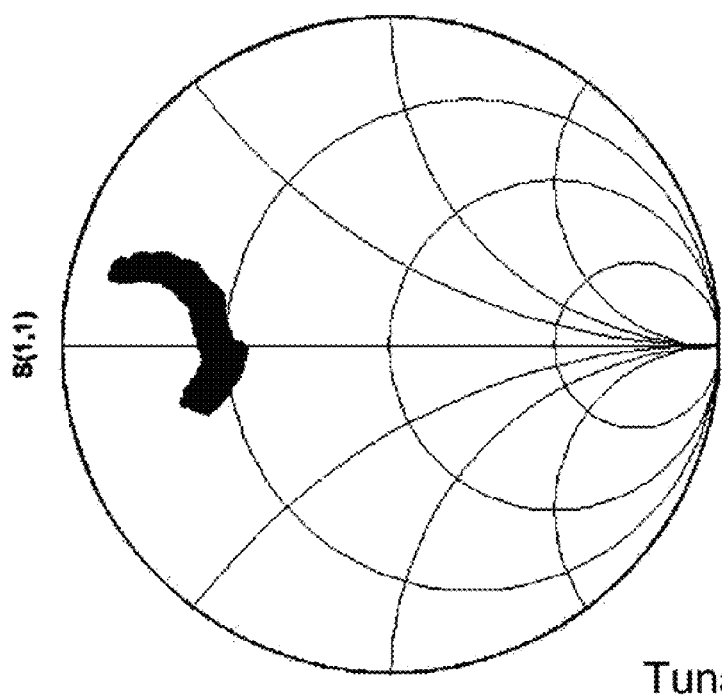
FIG. 26C shows a Smith chart for a self-healing amplifier using both fine and coarse tuning ($Z_{lp}$).

FIG. 26A to FIG. 26C show Smith charts of combiner actuation simulation results. FIG. 26A shows a Smith chart for a self-healing amplifier using fine tuning alone ($Z_{lp}$). FIG. 26B shows a Smith chart for a self-healing amplifier using coarse tuning alone ($Z_{lp}$). FIG. 26C shows a Smith chart for a self-healing amplifier using both fine and coarse tuning ($Z_{lp}$). With the combination of tunable lines and coarse stub tuning, the match seen looking into the output can have a relatively large coverage area.

Sensors

We now discuss three types of exemplary sensors (thermal, RF power, and DC current sensors) in more detail. On-chip sensors can measure output power, DC power drawn (e.g. to measure Gain), PAE, drain efficiency and/or output power, to provide an on-chip characterization of power amplifier performance. DC power drawn can be measured directly with a DC current sensor or indirectly using another non-electrical domain.

Thermal Sensor

Figure 27A:
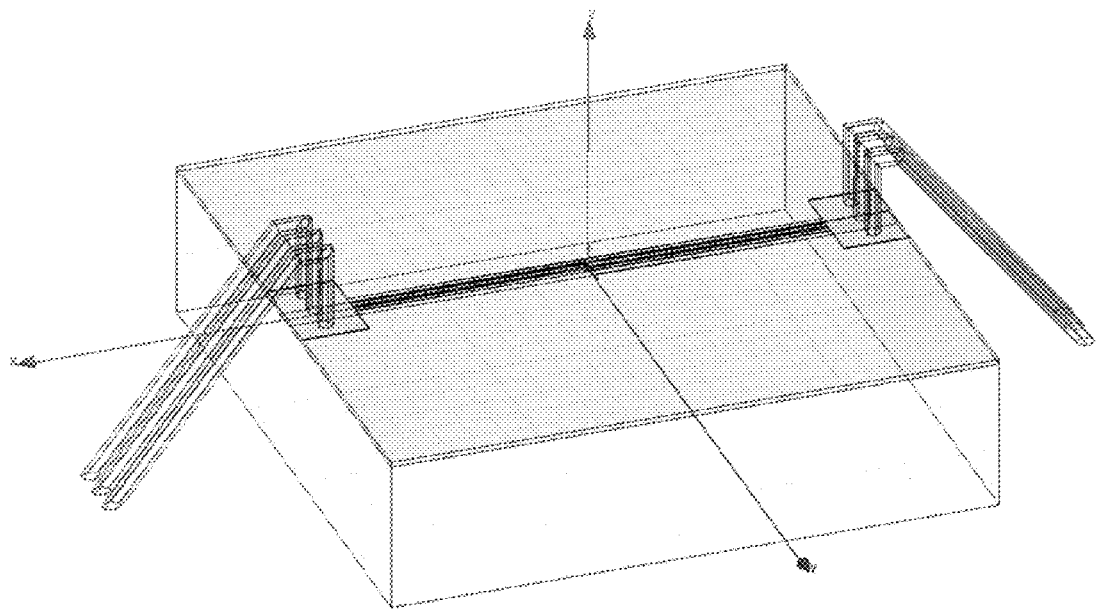
FIG. 27A shows a structure of one exemplary temperature sensor.
Figure 27B:
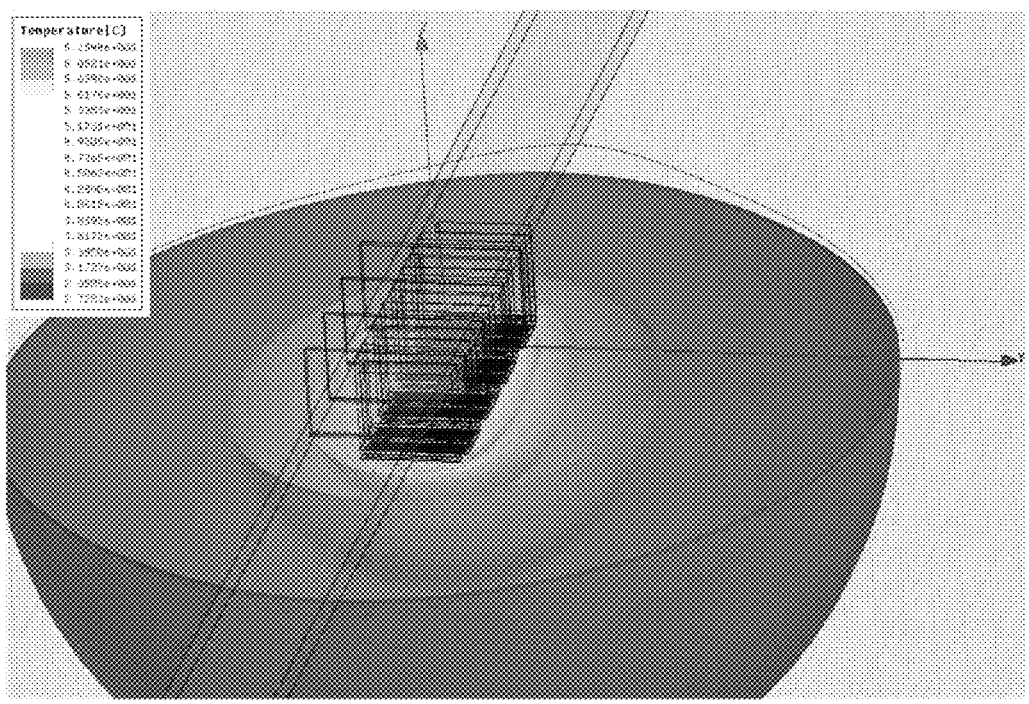
FIG. 27B shows thermal modeling of the structure of FIG. 27A.

Local temperature rise in a power amplifier core (e.g. a power amplifier core built in a SOI process) can be sensed to gauge power dissipation. The rise in temperature can be strongly influenced by the transistor and the sensor layout as well as the current density. In one exemplary model, 8 parallel 40 µm wide NFETS (45 nm) were biased at a current density of 0.25 mA/µm. FIG. 27A shows the structure of one exemplary temperature sensor. FIG. 27B shows thermal modeling of the structure of FIG. 27A. With an ambient temperature at 27° C., the core temperature was found to increase to about 62° C.

Figure 28A:
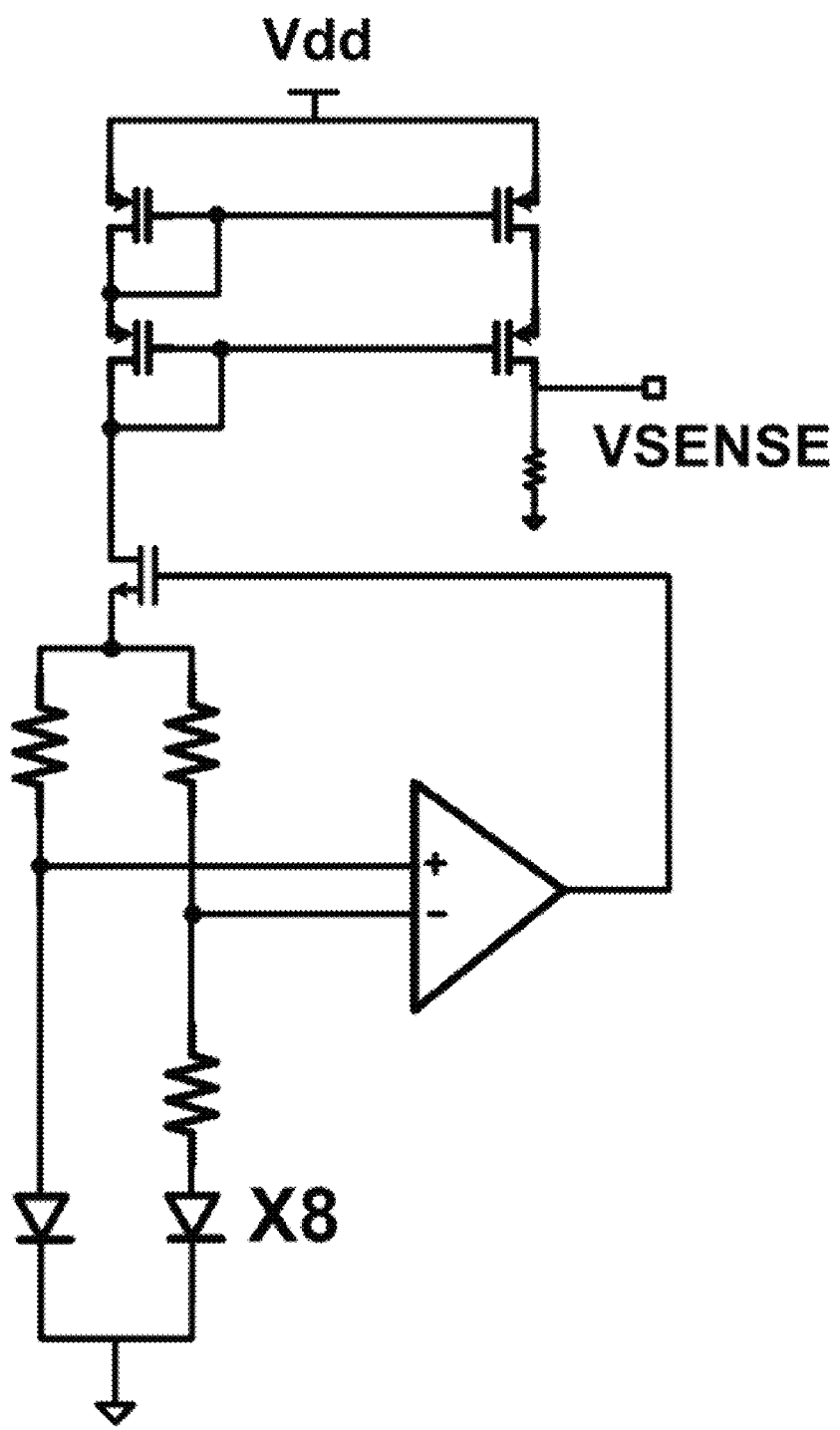
FIG. 28A shows one exemplary schematic diagram of a temperature sensor.
Figure 28B:
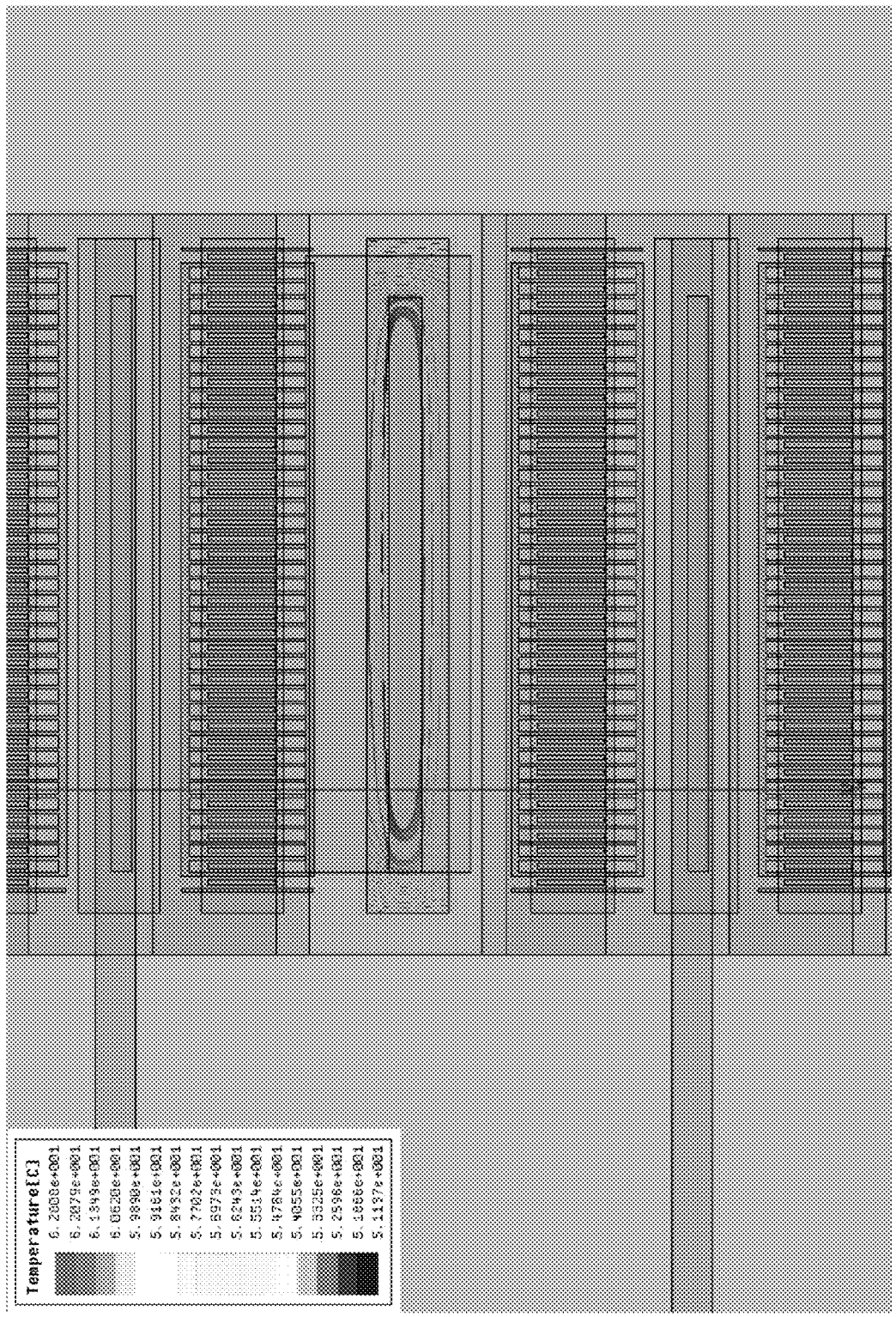
FIG. 28B shows thermal modeling for an integrated thermal sensor of FIG. 28A.

FIG. 28A shows a schematic diagram of one exemplary temperature sensor suitable for use in a self-healing power amplifier according to the invention. Diodes were interlaced with the power amplifier structures to sense the temperature rise. FIG. 28B shows thermal modeling of an integrated thermal sensor of FIG. 28A surrounded by power amplifier integrated structures. It was found that an 80 mW power dissipation raises the temperature at the thermal sensor by about 30° C. The temperature sensor voltage changed by 90 mV. This implies a sensitivity of about 1 mV/1 mW or ~4 mW/bit. All of the diodes will not be at the same temperature. Multiple sensors can be used to increase the sensitivity of the thermal sensors.

Figure 29A:
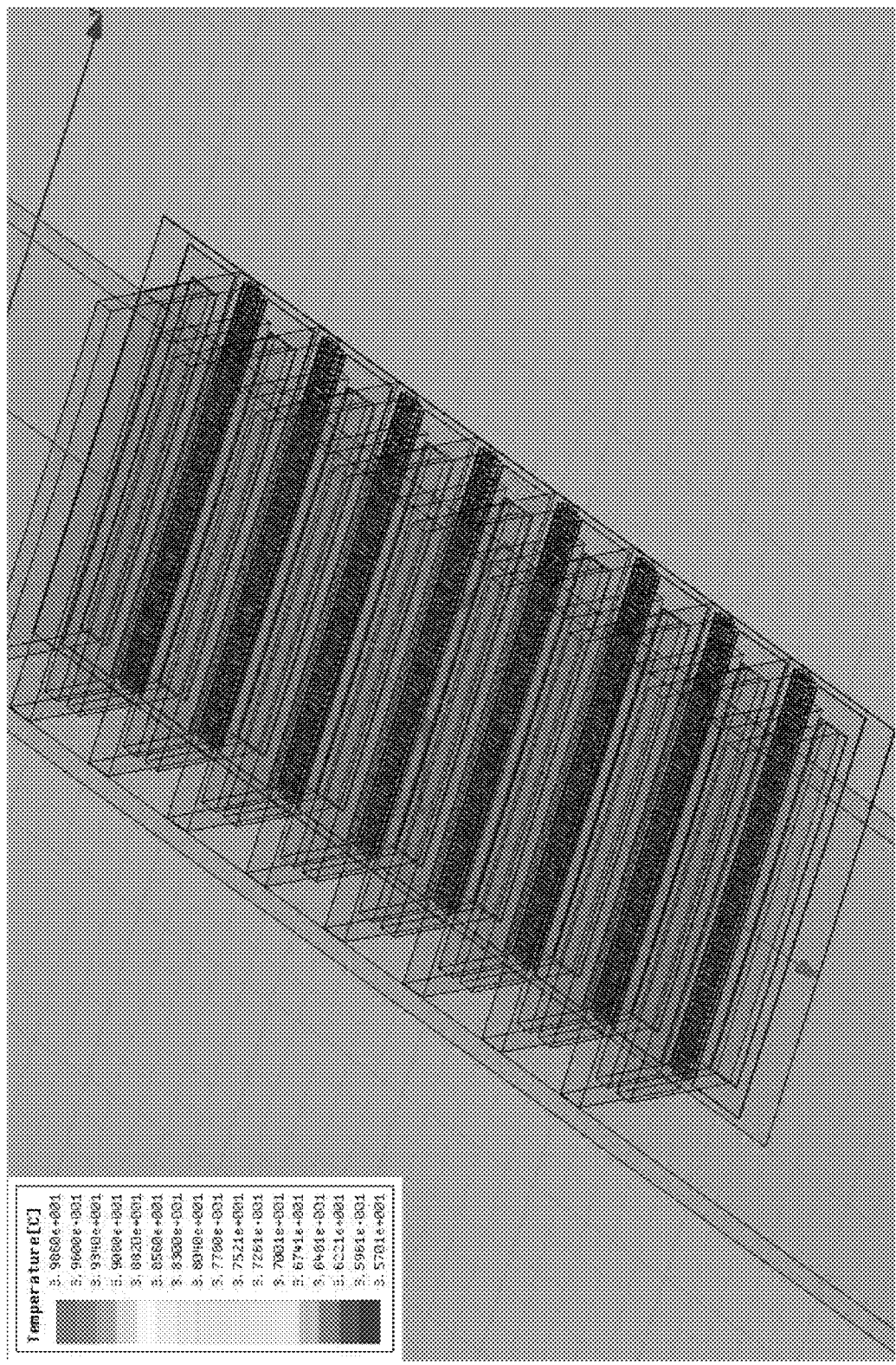
FIG. 29A shows a thermal model of a plurality of thermal sensors structures.
Figure 29B:
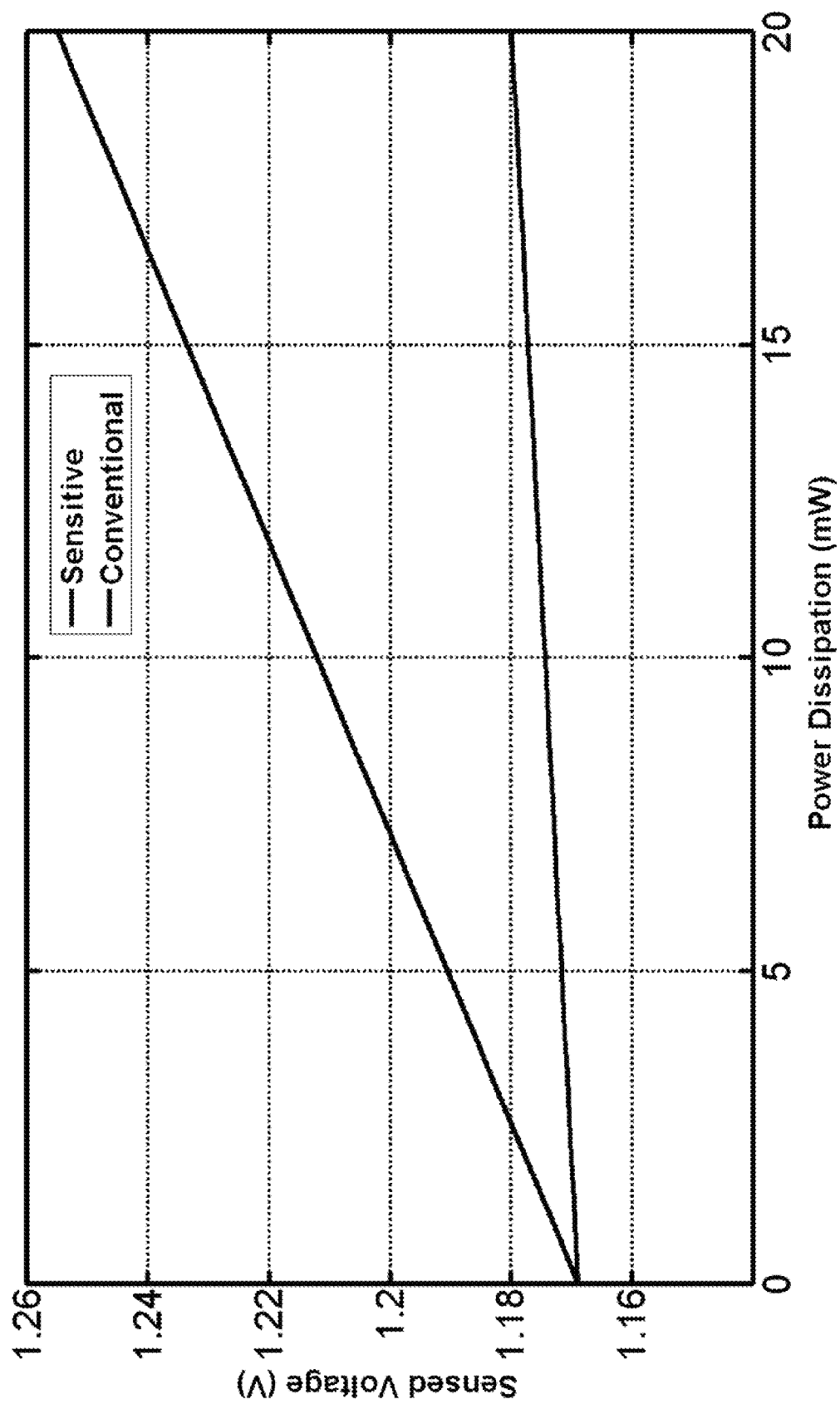
FIG. 29B shows a graph of sensed voltage plotted versus power dissipation (mW).

FIG. 29A shows a thermal model of a plurality of thermal sensors structures. One test power amplifier output stage having eight 50 μm analog FETs with 5 μm spacing was modeled and found to dissipate 20 mW. The simulated temperature rise was found to be about 3° C. This implies a thermal sensor sensitivity of about 0.45 mV/1 mW or 9 mW/bit. To increase sensitivity, one diode was placed further away in ambient temperature, while the rest of the thermal sensors were interlaced. The sensor voltage change was found to be about 100 mV. This implies sensitivity of about 5 mV/1 mW or about 1 mW/bit. FIG. 29B shows a graph of sensed voltage plotted versus power dissipation (mW) for a sensitive thermal sensor and a conventional thermal sensor.

Figure 30A:
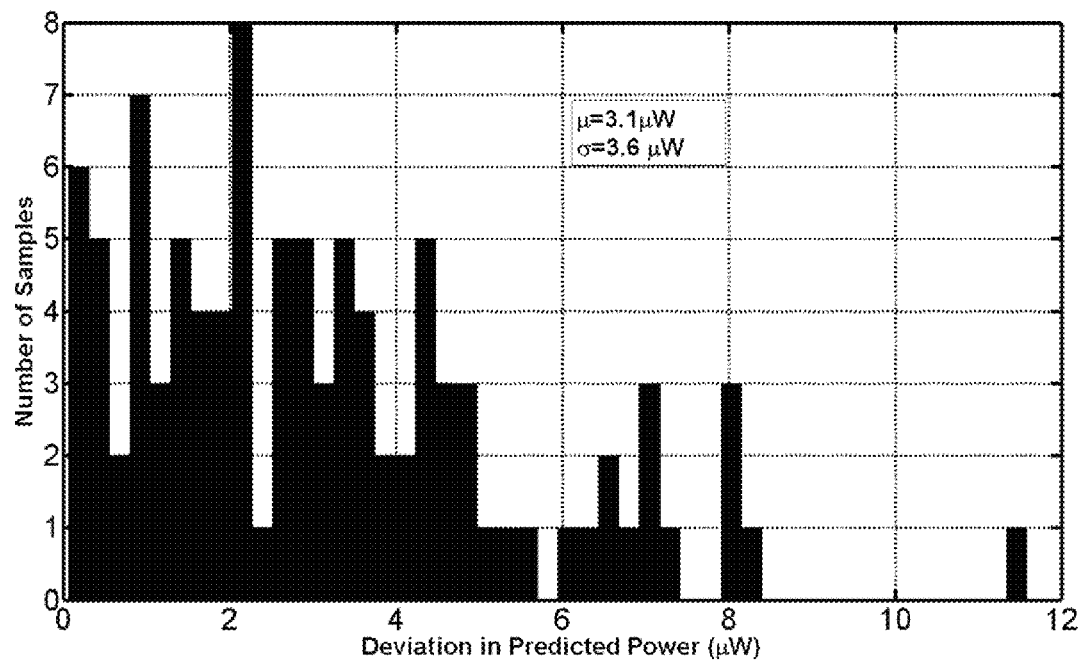
FIG. 30A shows a histogram of deviation in predicted power versus number of samples for a 3.1 µW power level.
Figure 30B:
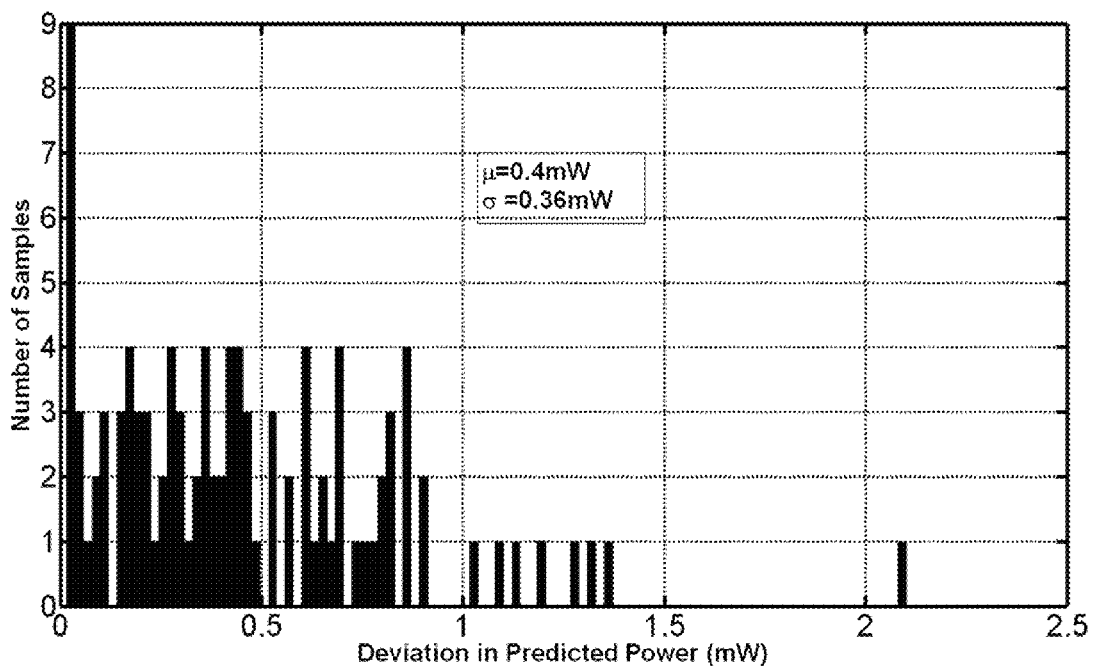
FIG. 30B shows a histogram of deviation in predicted power versus number of samples for a 0.4 mW power level.

FIG. 30A and FIG. 30B show histograms of thermal sensor calibration measurements. FIG. 30A shows a histogram of deviation in predicted power versus number of samples for a 3.1 μW power level. FIG. 30B shows a histogram of deviation in predicted power versus number of samples for a 0.4 mW power level. One approach to thermal sensor calibration is a two point calibration. In a two point thermal calibration the thermal sensor output voltage in an off state and in a known dissipation state is measured by passing a known DC current through a PA stage. The confidence interval is typically dominated by analog-to-digital converter (ADC) resolution. In another approach, a one point calibration, the output voltage is measured in an off state and an estimated slope is determined from a Monte Carlo simulation. Sensor resolution (3σ) was about one least significant bit (LSB) of the ADC. FIG. 31 shows a table of specifications of two exemplary thermal sensors (thermal sensor 1 and thermal sensor 2).

In summary, DC power dissipation leads to local rise in temperature and since the relation is typically monotonic, the local thermal temperature change can be used as an indirect measure of power dissipation.

In some embodiments, the thermal sensor can employ diodes interlaced with the PA and configured to sense the local temperature. In order to increase the sensitivity a diode based temperature sensor having a number of parallel diodes can be interlaced with the power amplifier or disposed nearby. Also, another diode can be disposed relatively far away from the thermal sensitive region. These techniques can provide an order of magnitude more sensitivity as compared with conventional diode power sensors.

RF Power Sensors

Figure 32:
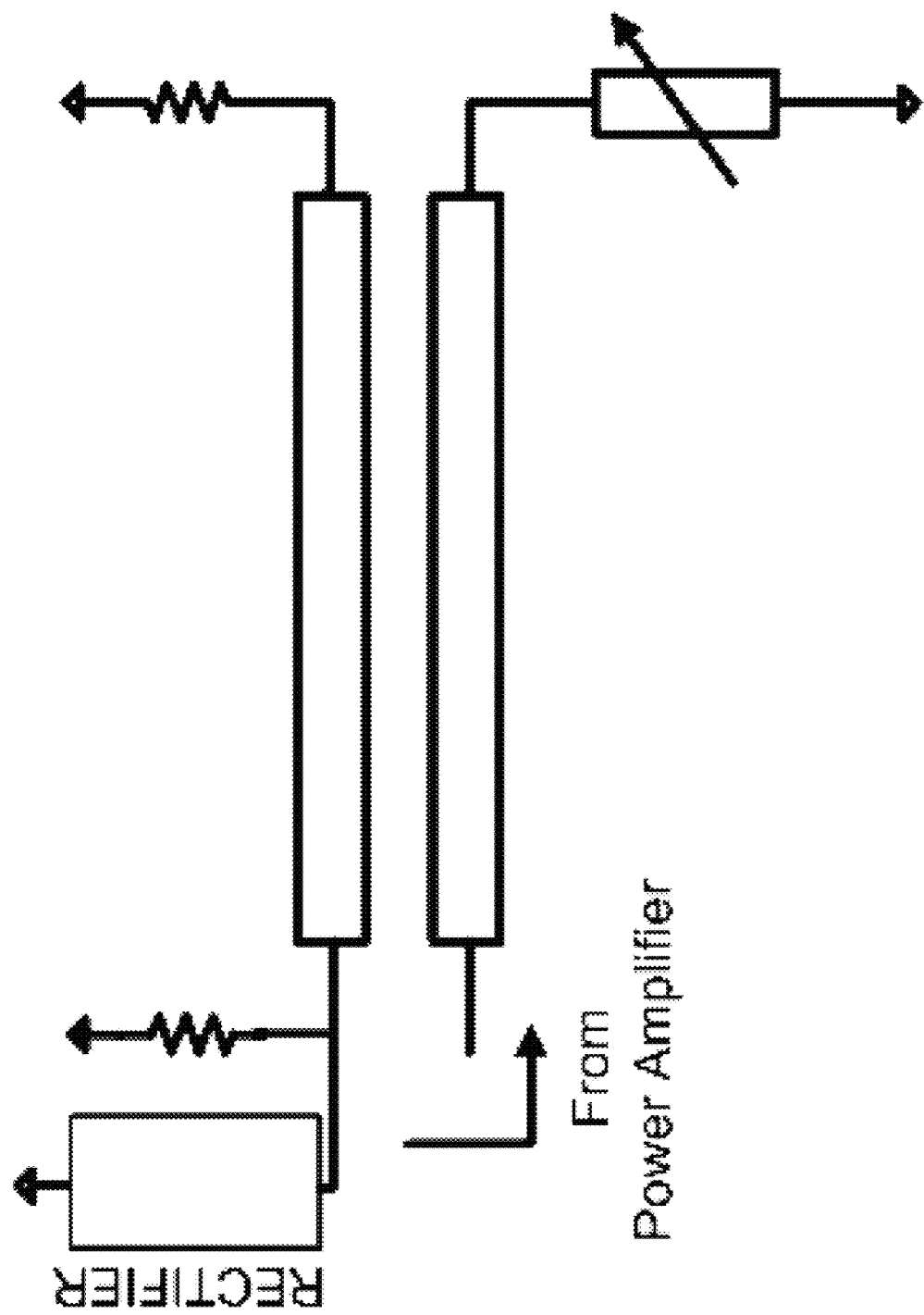
FIG. 32 shows a block diagram of one exemplary RF power sensor.

FIG. 32 shows a block diagram of one exemplary RF power sensor suitable for use in a self-healing power amplifier according to the invention. Preferably, the true power delivered to the load should be measured, especially if there is a mismatch at the load. Therefore, if the load impedance is unknown, a voltage sensor at the output will generally not be sufficient. A coupled line at the output transmission line, such as shown in FIG. 32, can be used to measure the reflected power, and the reflected power measurement can be used to provide information on the true power delivered to the load.

Figure 33A:
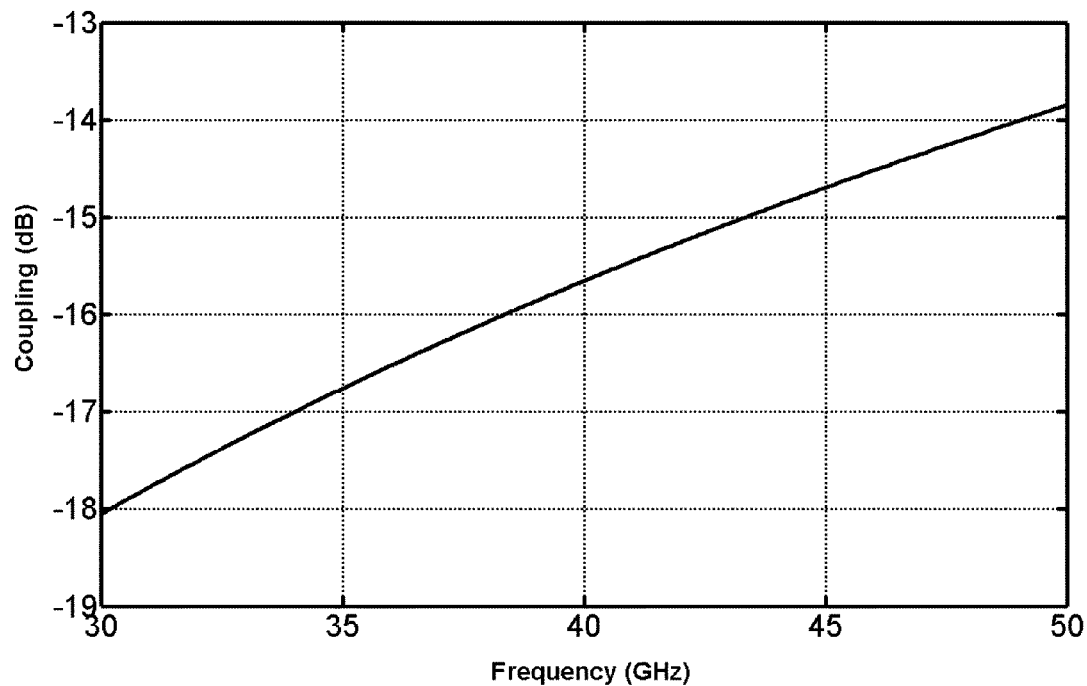
FIG. 33A shows a graph of coupling (dB) plotted versus frequency.
Figure 33B:
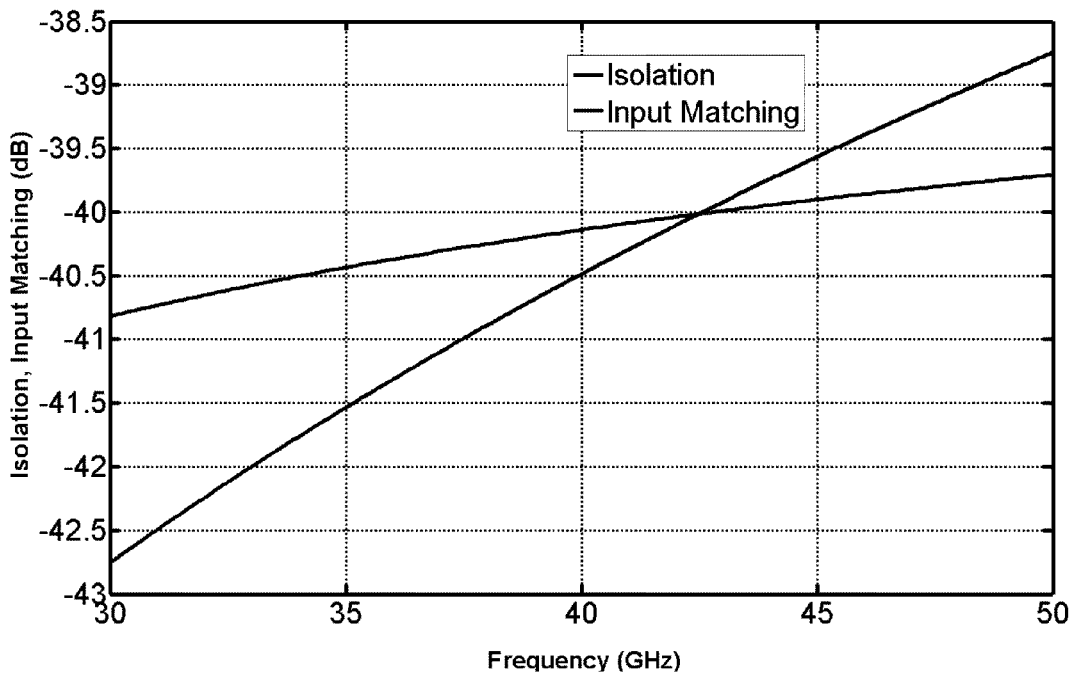
FIG. 33B shows a graph of input matching (dB) plotted versus frequency.

3-D electromagnetic (EM) simulations were performed to characterize the coupling over a frequency band of 34-40 GHz. FIG. 33A shows a graph of coupling (dB) plotted versus frequency. FIG. 33B shows a graph of isolation, input matching (dB) plotted versus frequency. For a reflected power of 0.5-50 mW and a coupling of 16 dB, the power at the coupled port was found to be in a range of about 10 μW–1 mW.

Figure 34A:
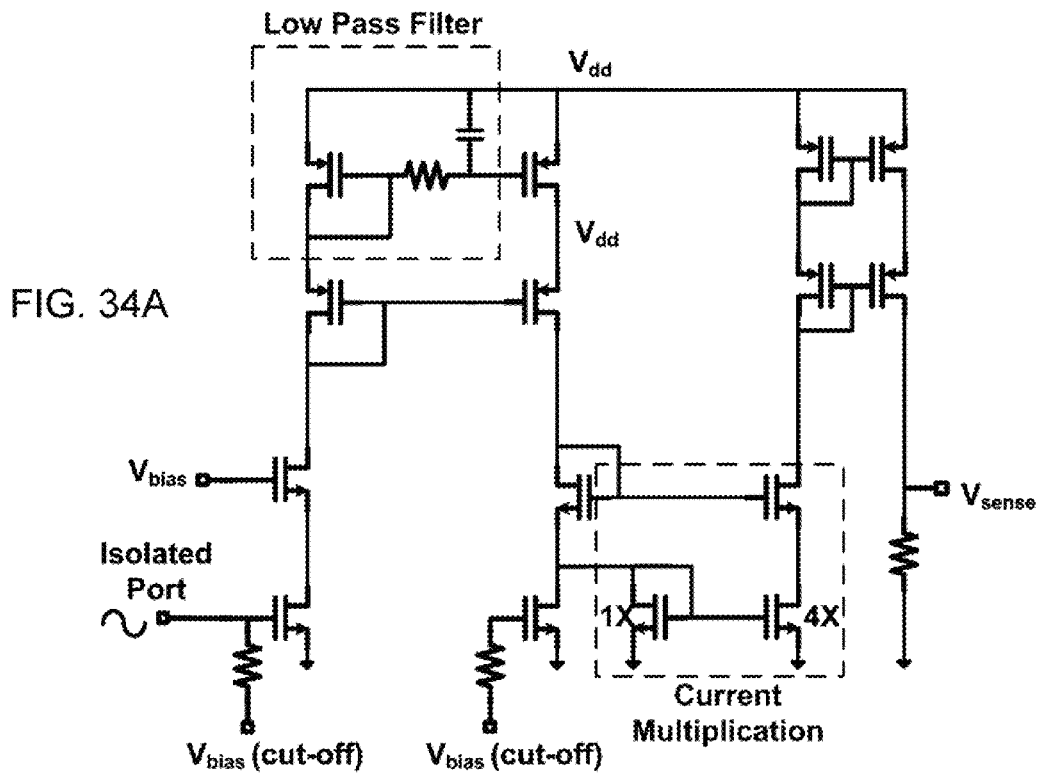
FIG. 34A shows a schematic diagram of one exemplary power sensor circuit.
Figure 34B:
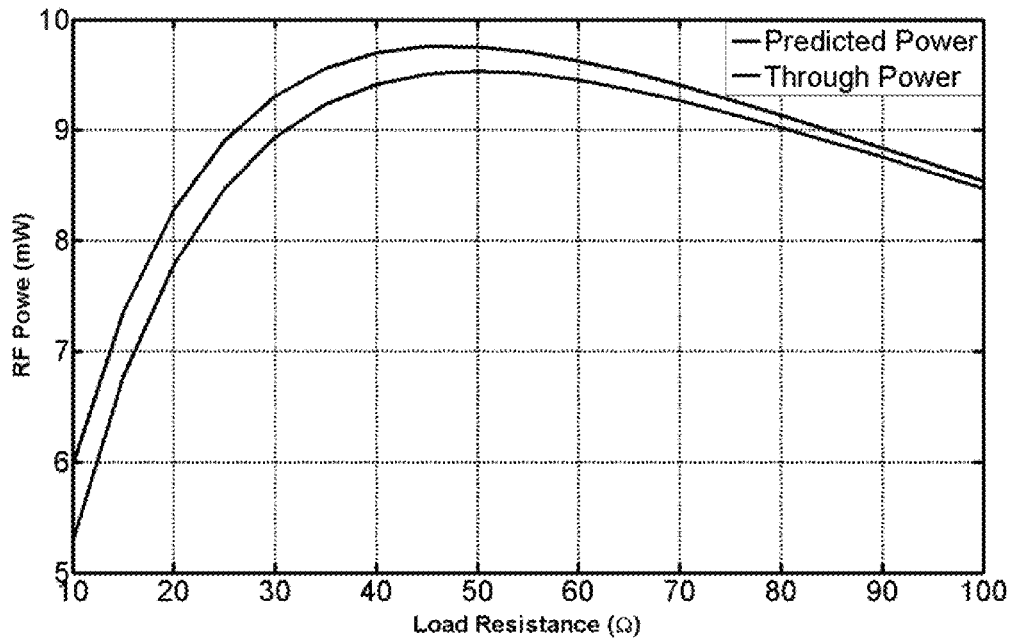
FIG. 34B shows a graph of RF power (mW) plotted versus load resistance.

FIG. 34A shows a schematic diagram of one exemplary power sensor circuit. FIG. 34B shows a graph of RF power (mW) plotted versus load resistance (ohms) for predicted power and through power as measured by the power sensor circuit of FIG. 34A. Predicted Power=$(C-I)/\alpha$, where $\alpha$ is the coupling coefficient, C is power at the coupled port and I is the power at the isolated port. The sensor circuit should detect the RF power from 10 μW–1 mW i.e. the RF voltage swings from about 31 mV to about 310 mV. Typically, such an integrated on-chip RF power sensor cannot be calibrated perfectly because of other on-chip power sources.

In order to measure the RF power both at the input and output, we employ a set of coupled lines much shorted in length than a quarter length, with RF power sensors at the isolated and coupled ports. The coupling factor is designed to be low which also means that less power is "sniffed" so that most of the output power can go to the load and most of the input power can go to the power amplifier. The RF power sensor therefore should be relatively sensitive. In some embodiments, the sensor is completely CMOS based and no p-n diodes or any other junctions are used. The power sensed by the coupling lines goes to the port (named isolated port in FIG. 34A) which is then rectified by a transistor biased near threshold. This causes a change in current through the branch when RF power is applied to the port through rectification. The current is then low-pass filtered and mirrored through several current amplification stages and sensed across a load or if the output is desire be in some other form than current form, the final transimpedance stage can be removed. In some embodiments, current amplification is done using cascode stages to make the stages more linear. An offset current at the input port can be cancelled off by an identical transistor biased at the same voltage so that the dynamic range is larger. The output voltage can be level-shifted for an operating range of the succeeding ADC.

Figure 35A:
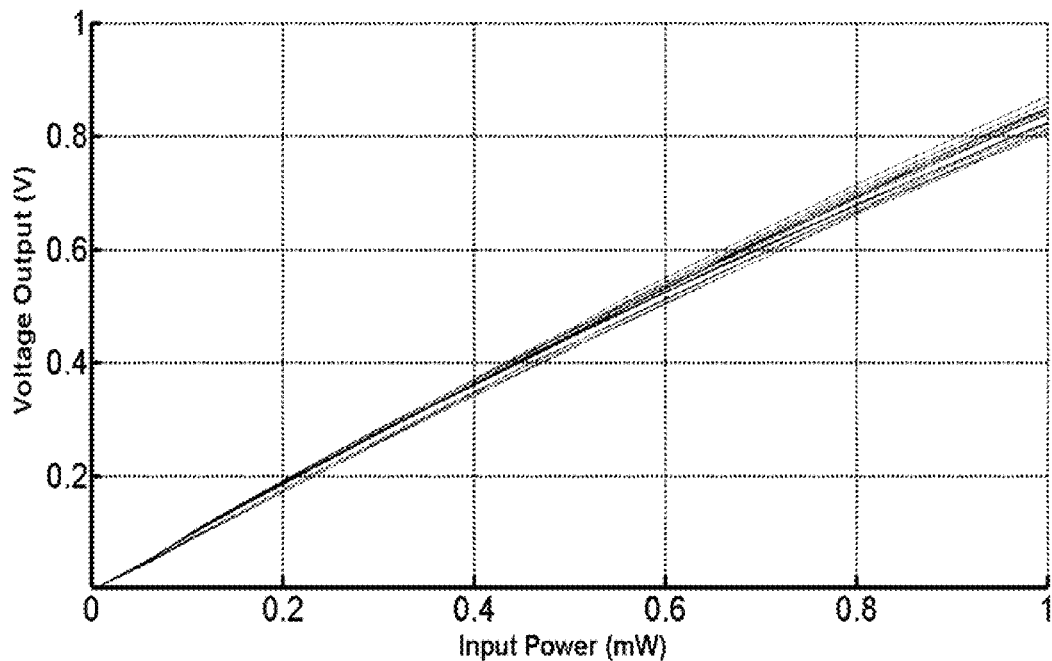
FIG. 35A shows a graph of voltage output (V) plotted versus input power (mW).
Figure 35B:
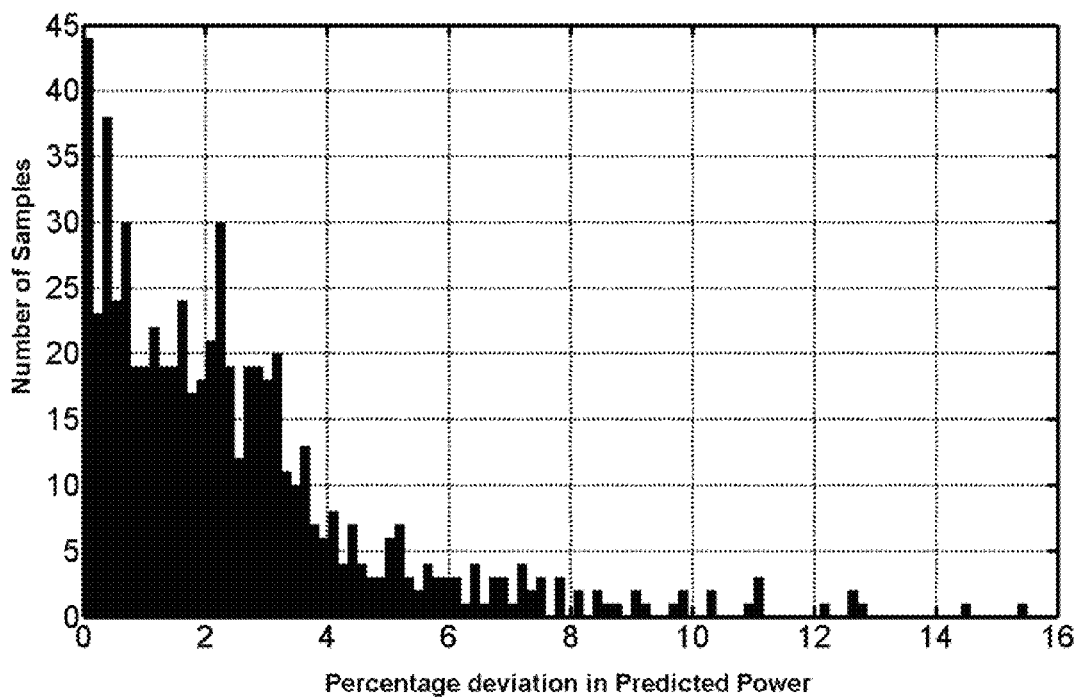
FIG. 35B shows a histogram of number of samples versus percentage deviation in predicted power.

FIG. 35A shows a graph of voltage output (V) plotted versus input power (mW) for several measurements of a Monte Carlo simulation. FIG. 35B shows a histogram of number of samples versus percentage deviation in predicted power. An offset voltage can be subtracted by using a dummy sensor and the slope estimated from Monte Carlo simulations. Both μ and σ of percentage deviation in predicted power were found to be about 2.5% each. The voltage change was found to be about 800 mV for a power change of about 1 mW, implying 8 mV or 2 bits of resolution for 0.5 mW reflected power. The confidence interval was dominated by deviation from known coupling and process variations. FIG. 36 shows a table of specifications for exemplary modeled power sensors.

DC Current Sensors

A DC current sensor can monitor DC current drawn from an individual stage. Since $P_{dc}=P_{diss}+P_{RF,drain}$, knowing delivered power at each output stage can provide a measurement of combiner loss and provide the ability to track the loss in an actuation mechanism. A DC current sensor can also monitor a mismatch which can affect both the DC current drawn and RF power delivered by different stages. One of the challenges is to make a DC current sensor having a relatively low headroom so the DC current sensor itself does not significantly reduce the efficiency of the power amplifier.

Figure 37A:
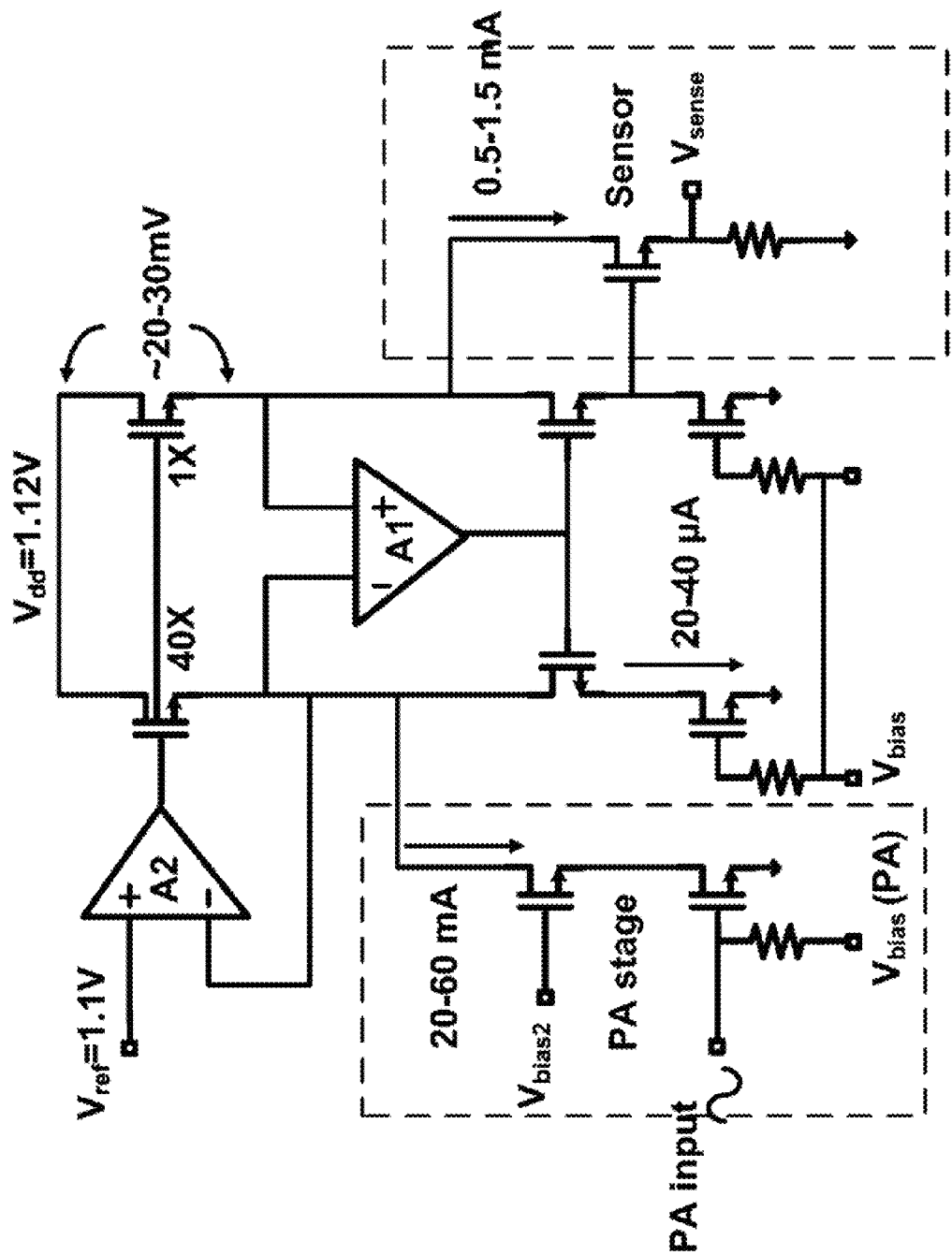
FIG. 37A shows a schematic diagram of an exemplary DC current sensor.

FIG. 37A shows a schematic diagram of one exemplary DC current sensor suitable for use in a self-healing power amplifier according to the invention. The operational amplifier A1 should have a relatively high gain to maintain almost the same drain potentials at two FETs, one that couples to the power amplifier stage and the second that couples to the sensor output. The DC sensor of FIG. 37A supplies current to the power amplifier with a very low headroom (typically millivolts). This low headroom allows the efficiency not to be compromised by the addition of the DC sensor. The power amplifier current is measured by mirroring a small fraction of the current through a current mirror, but the low headroom also implies that the current mirror circuit as shown in the FIG. 37A will be in triode and therefore proper mirroring implies the $V_{ds}$ of the mirroring devices will be very close. This close mirroring is achieved using an operational amplifier, which holds the two voltages at the same level. The current mirrored can be level-shifted for the proper range of the succeeding ADC as shown in FIG. 37A. Another operational amplifier A2 can provide enough current so that the power amplifier can be powered by the mirroring device.

Figure 37B:
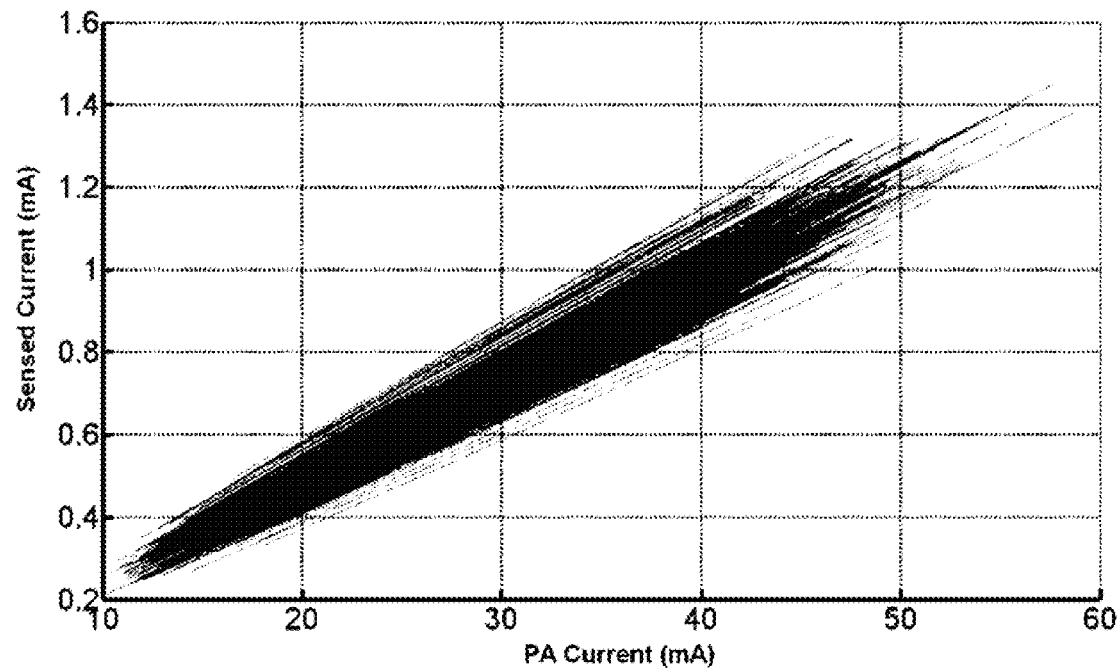
FIG. 37B shows a graph of sensed current (mA) plotted versus power amplifier current (mA).
Figure 37C:
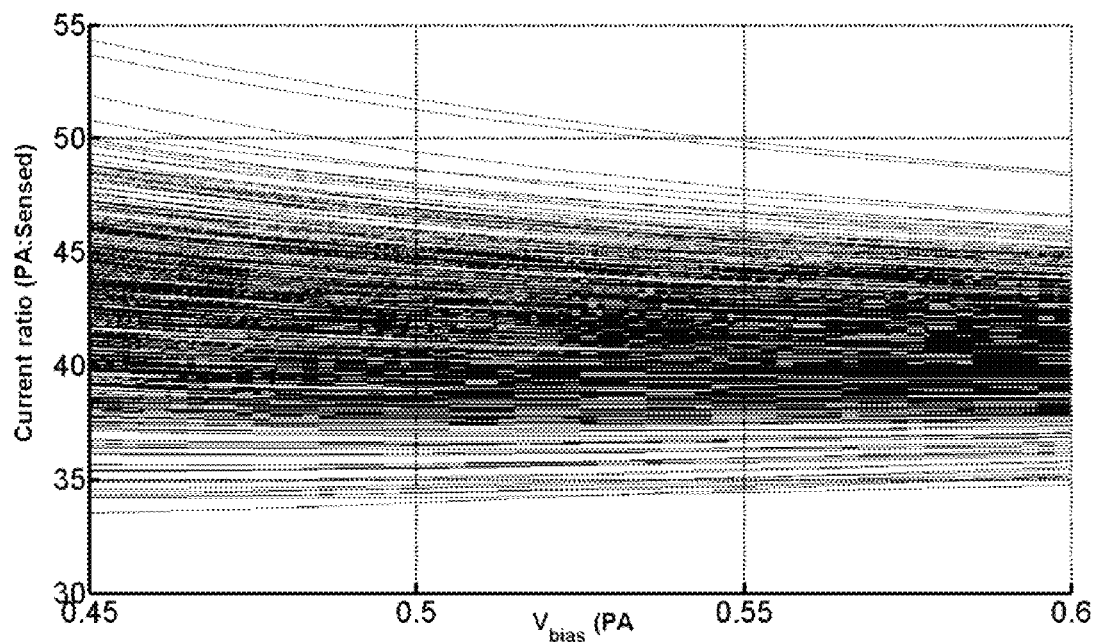
FIG. 37C shows a graph of current ratio plotted versus power amplifier $V_{bias}$.

The graphs of FIG. 37B and FIG. 37C show the results of Monte Carlo simulations of a DC current sensor, such as that of FIG. 37A. FIG. 37B shows a graph of sensed current (mA) plotted versus power amplifier current (mA). FIG. 37C shows a graph of current ratio (power amplifier current to sensed current) plotted versus power amplifier $V_{bias}$. The Monte Carlo Simulation predicted an almost linear response with some variation in slope. The 30 mV headroom implies a drain efficiency of 97% efficiency without the sensor.

Figure 38A:
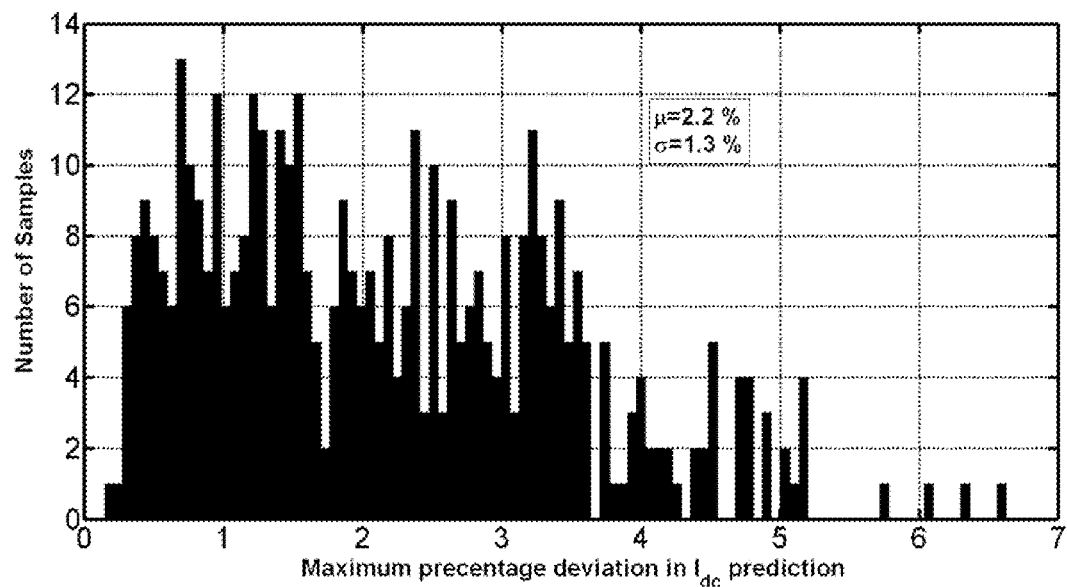
FIG. 38A shows a histogram of number of samples plotted versus maximum deviation in $I_{dc}$ prediction for the single point calibration method.
Figure 38B:
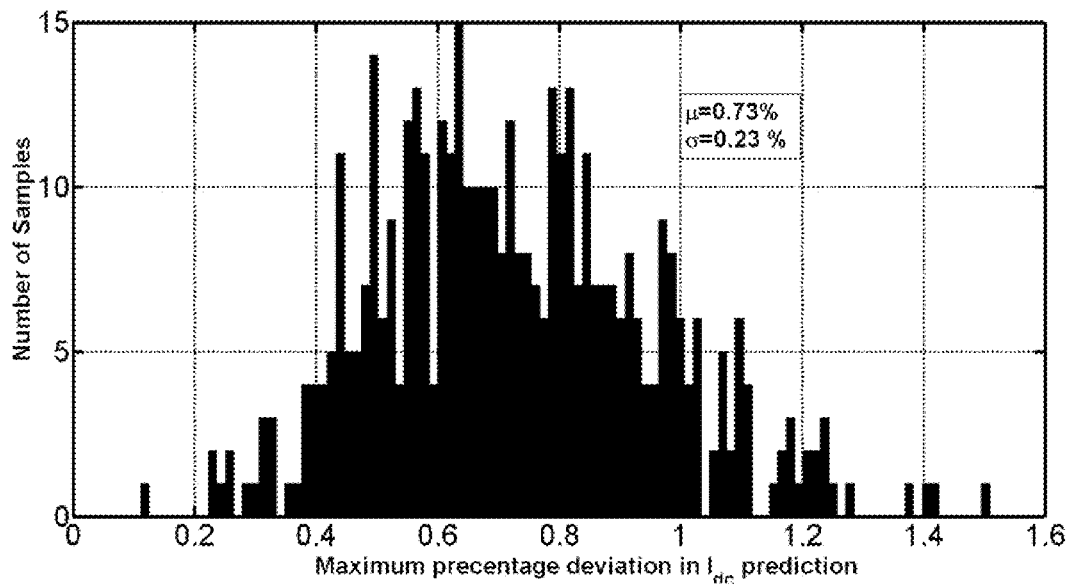
FIG. 38B shows a histogram of number of samples plotted versus maximum deviation in $I_{dc}$ prediction for the two point calibration method.

DC current sensors, such as that of FIG. 37A can be calibrated by a one or two point calibration method. Regarding a one-point calibration method, a Monte Carlo simulation shows ratio remains relatively constant over bias sweep. Hence a DC current sensor can be calibrated against one known current. The percentage deviation in prediction was found to about $\mu$=2.2%, $\sigma$=1.3%. For a two point calibration, a bias sweep showed that the ratio is almost linear with bias sweep. Hence, a DC current sensor can also be calibrated against two known currents. For the two point calibration method, a percentage deviation in prediction was found to be about $\mu$=0.73%, $\sigma$=0.23%. FIG. 38A and FIG. 38B show histograms related to the DC current sensor calibration. FIG. 38A shows a histogram of number of samples plotted versus maximum deviation in $I_{dc}$ prediction for the single point calibration method. FIG. 38B shows a histogram of number of samples plotted versus maximum deviation in $I_{dc}$ prediction for the two point calibration method. FIG. 39 shows a table of specifications for exemplary modeled DC current sensors.

Analog to Digital Converter

We turn now to analog-to-digital converters (ADC), which are useful for measuring (digitizing) signals from the various sensors described hereinabove. For some embodiments of a self-healing power amplifier according to the invention, we chose a successive-approximation (SAR) architecture. One exemplary SAR ADC had a resolution of 8 bits over a 1 V range, with about 4 mV per LSB. A sampling frequency of 5 MS/s with an internal clock frequency of 45 MHz was used. The integrated ADC was designed to occupy an area or about 80 μm×80 μm.

Figure 40:
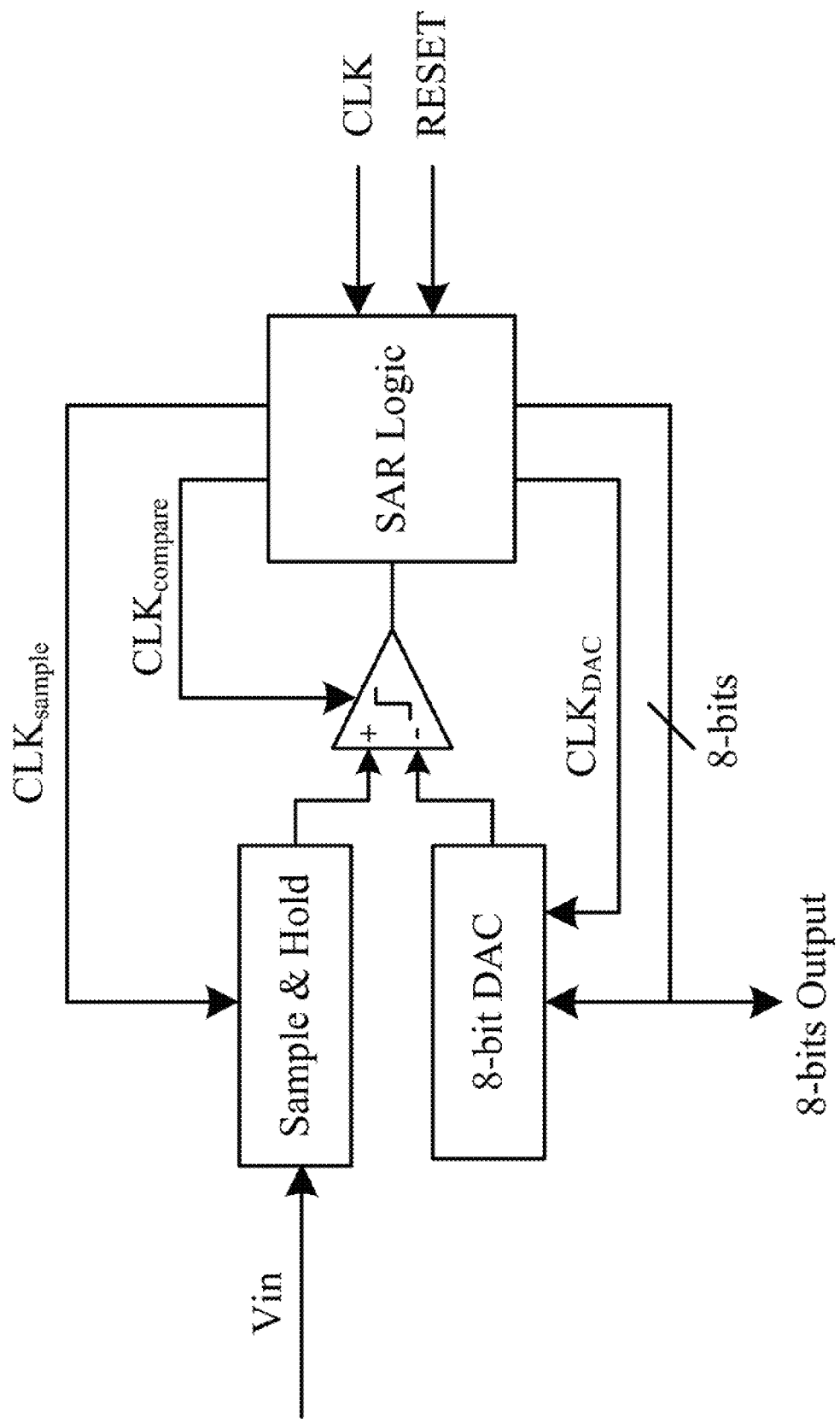
FIG. 40 shows a block diagram of the exemplary ADC.
Figure 41:
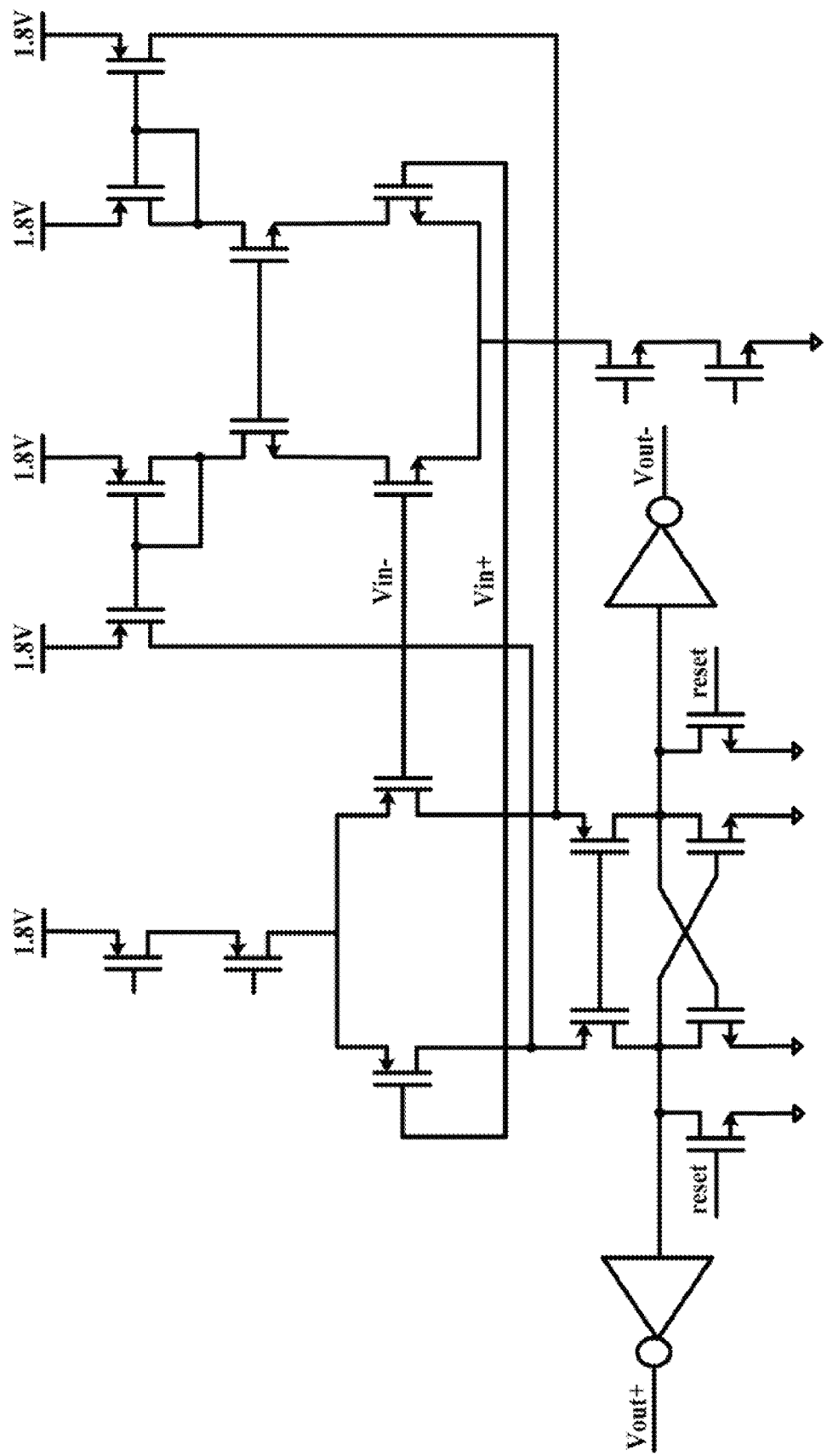
FIG. 41 shows a schematic diagram of one exemplary comparator.

FIG. 40 shows a block diagram of the exemplary ADC. Turning now to the ADC comparator we chose a fully differential architecture with a regenerative load. The comparator speed was chosen as 45 MHz, supply voltage, 1.8 V; input range, 0.5 V to 1.5 V; power consumption, 72 μW; input transistor size, W=80 μm, L=232 nm, and the input offset was about $\sigma$=1 mV. The input parasitic capacitance loaded the charge-scaling DAC, and was calibrated with an on-chip reference measurement. FIG. 41 shows a schematic diagram of one exemplary comparator suitable for use in the SAR ADC of FIG. 40.

Now turning to the DAC of FIG. 40, in some embodiments we used an 8-bit charge-scaling DAC with binary-weighted capacitor array. Exemplary capacitor values were: 20 fF, 20 fF, 40 fF, 80 fF, . . . , and 2.56 pF. We found a relatively small gain error due to parasitic capacitance from the comparator input differential pairs.

$$V_{out} = V_{ref-} + \frac{\left(\sum_{i=1}^{8} s_i C_i\right)}{\left(\sum_{i=1}^{8} C_i\right) + C_{parasitic}} \cdot (V_{ref+} - V_{ref-}) \quad \text{Eq. 2}$$

Figures 42A, 42B:
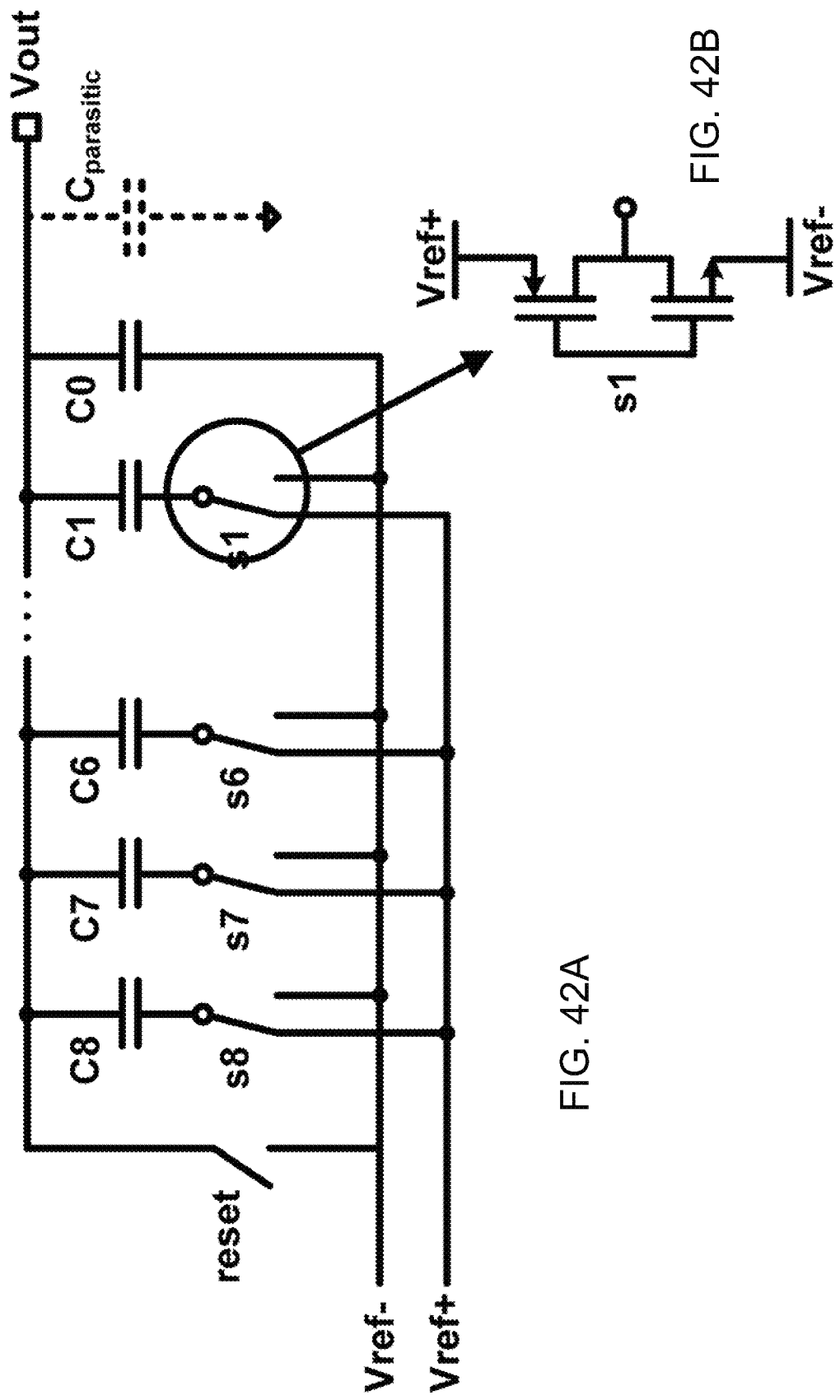
FIG. 42A shows a schematic diagram of one exemplary binary-weighted capacitor array.
FIG. 42B shows a more detailed schematic diagram of a switch of the binary-weighted capacitor array of FIG. 42A.
Figure 43:
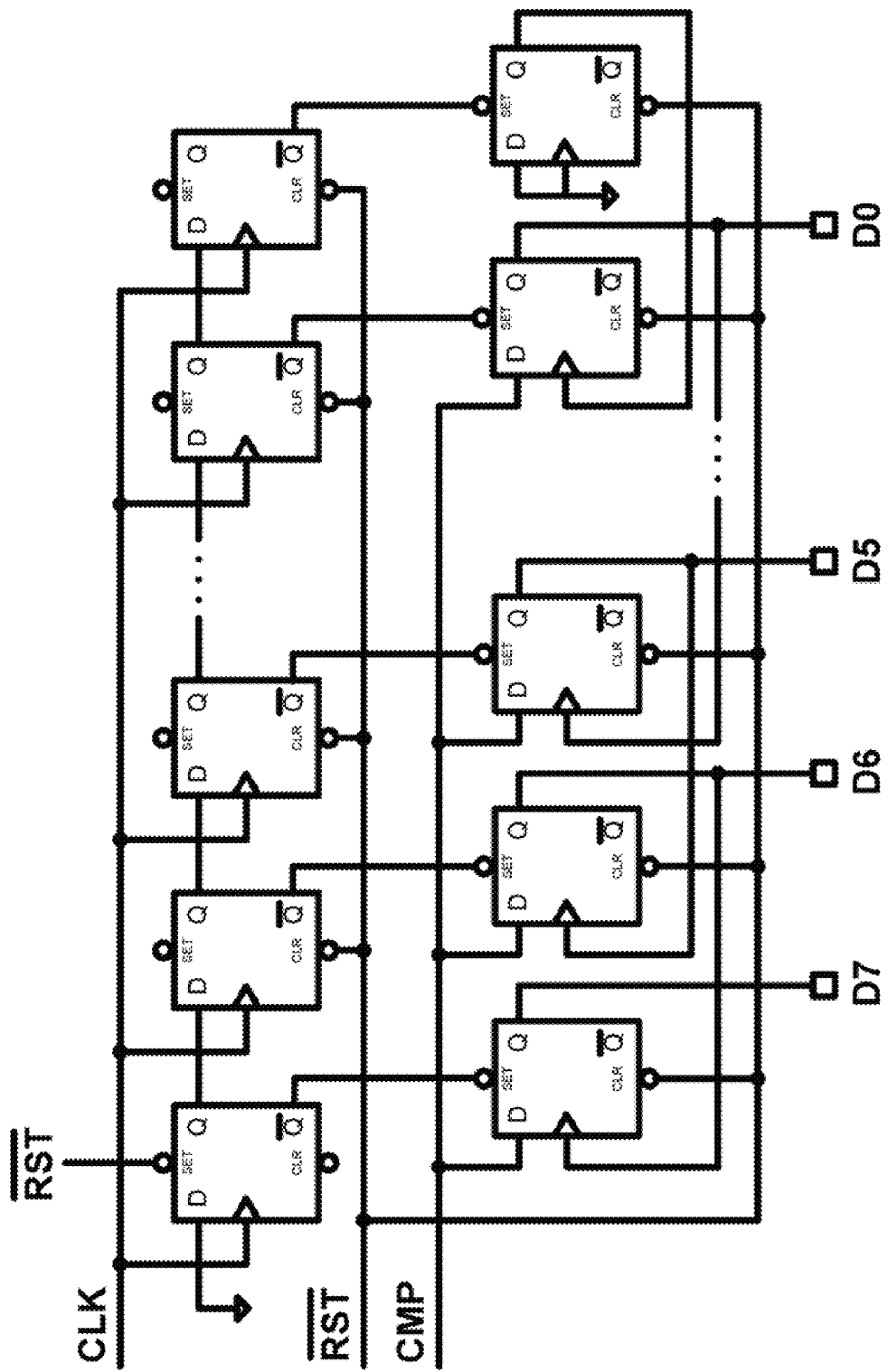
FIG. 43 shows a schematic diagram of one exemplary successive approximation register.
Figure 44:
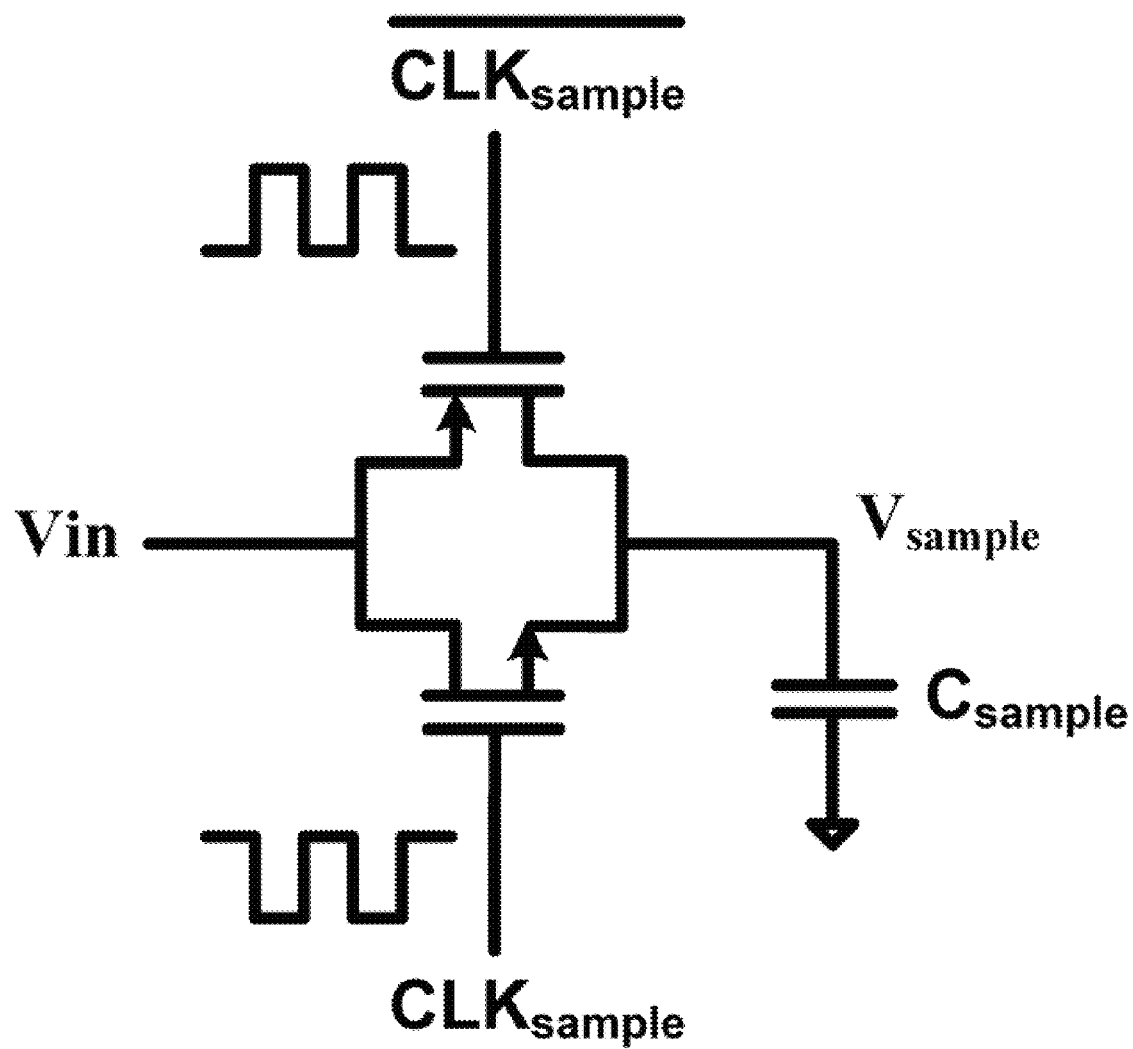
FIG. 44 shows a schematic diagram of one exemplary sample and hold circuit.

Referring to equation 2, for our simulation, $V_{ref-}$=0.5 V, $V_{ref+}$=1.6 V with a 1.1 V range to compensate for the gain error in order to cover 1V range. At 1.1V, such switching can be done with inverters. FIG. 42A shows a schematic diagram of one exemplary binary-weighted capacitor array suitable for use in the ADC of FIG. 40. FIG. 42B shows a more detailed schematic diagram of a switch of the binary-weighted capacitor array of FIG. 42A. FIG. 43 shows a schematic diagram of one exemplary successive approximation register suitable for use in the ADC of FIG. 40. The power consumption was on the order of 40 μW for this 18 DFF architecture with SET and CLR. FIG. 44 shows a schematic diagram of one exemplary sample and hold circuit suitable for use in the ADC of FIG. 40. The leakage at 50 MHz was found to be −55.6 dB, <½ LSB and the $R_{on}C$ cutoff frequency for the sample and hold circuit was 1.1 GHz.

Self-Healing Power Amplifier—Simulations

Figure 45:
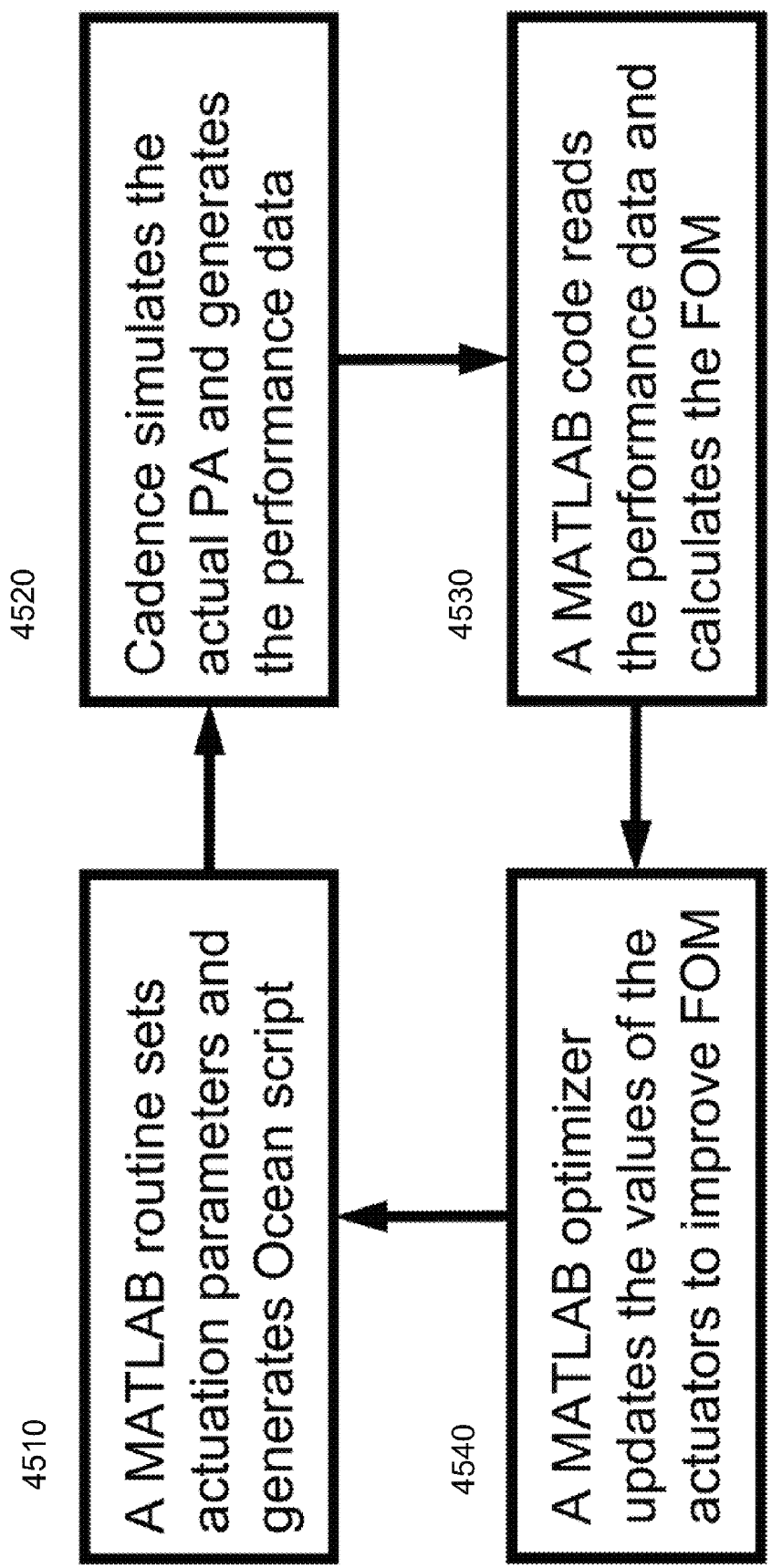
FIG. 45 shows a block diagram of one exemplary method for testing a self-healing power amplifier according to the invention.

FIG. 45 shows a block diagram of one exemplary method for testing a self-healing power amplifier according to the invention. First, at the box 4510 representing a step, a MATLAB™ routine (MATLAB™ is available from the MathWorks of Natick, Mass.) sets actuation parameters and generates an Ocean script. Next, at the box 4520 representing a step, Cadence™ (available from Cadence Design Systems of Berkshire, U.K.) simulates the actual PA and generates the performance data. Then, the box 4530 representing a step, a MATLAB™ code reads the performance data and calculates the FOM (figure of merit), followed by the box 4540 representing a step, where a MATLAB™ optimizer updates the values of the actuators to improve FOM. The method can repeat steps 4510, 4520, 4530 and 4540, and loop as many times as desired (e.g. continuously and/or until a desired FOM is reached).

Figure 46A:
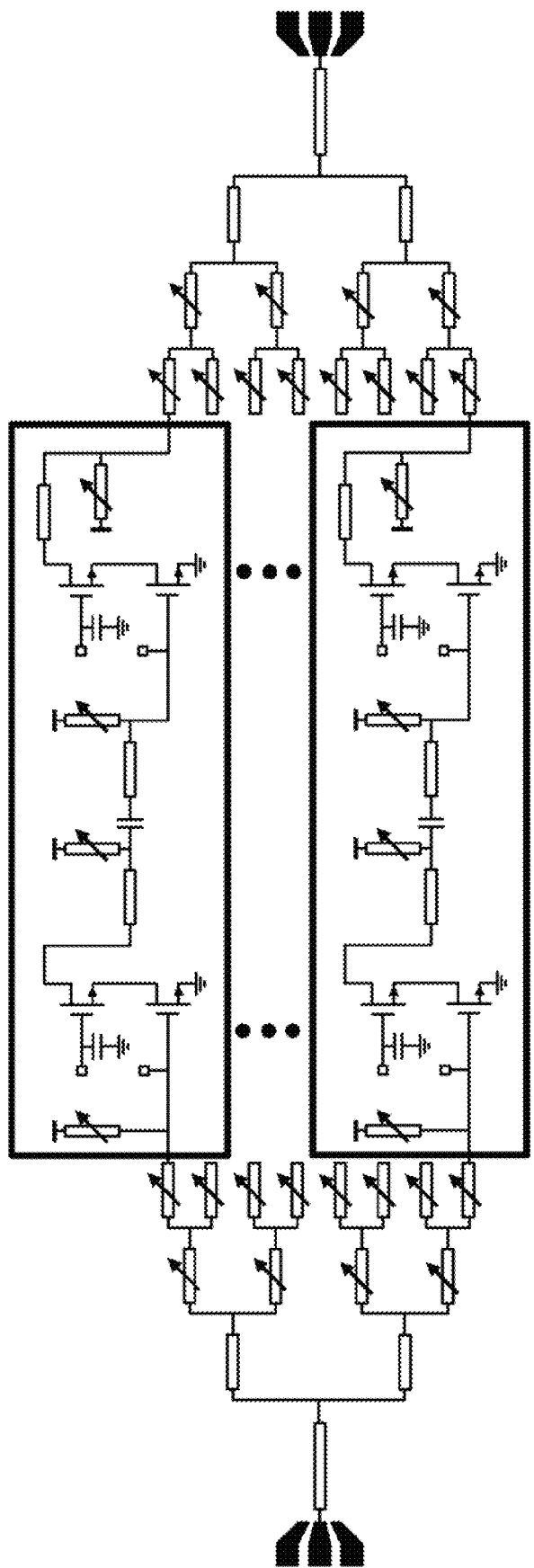
FIG. 46A shows a block diagram of a self-healing power amplifier illustrating one embodiment of a combination of power amplifier actuators.
Figure 46B:
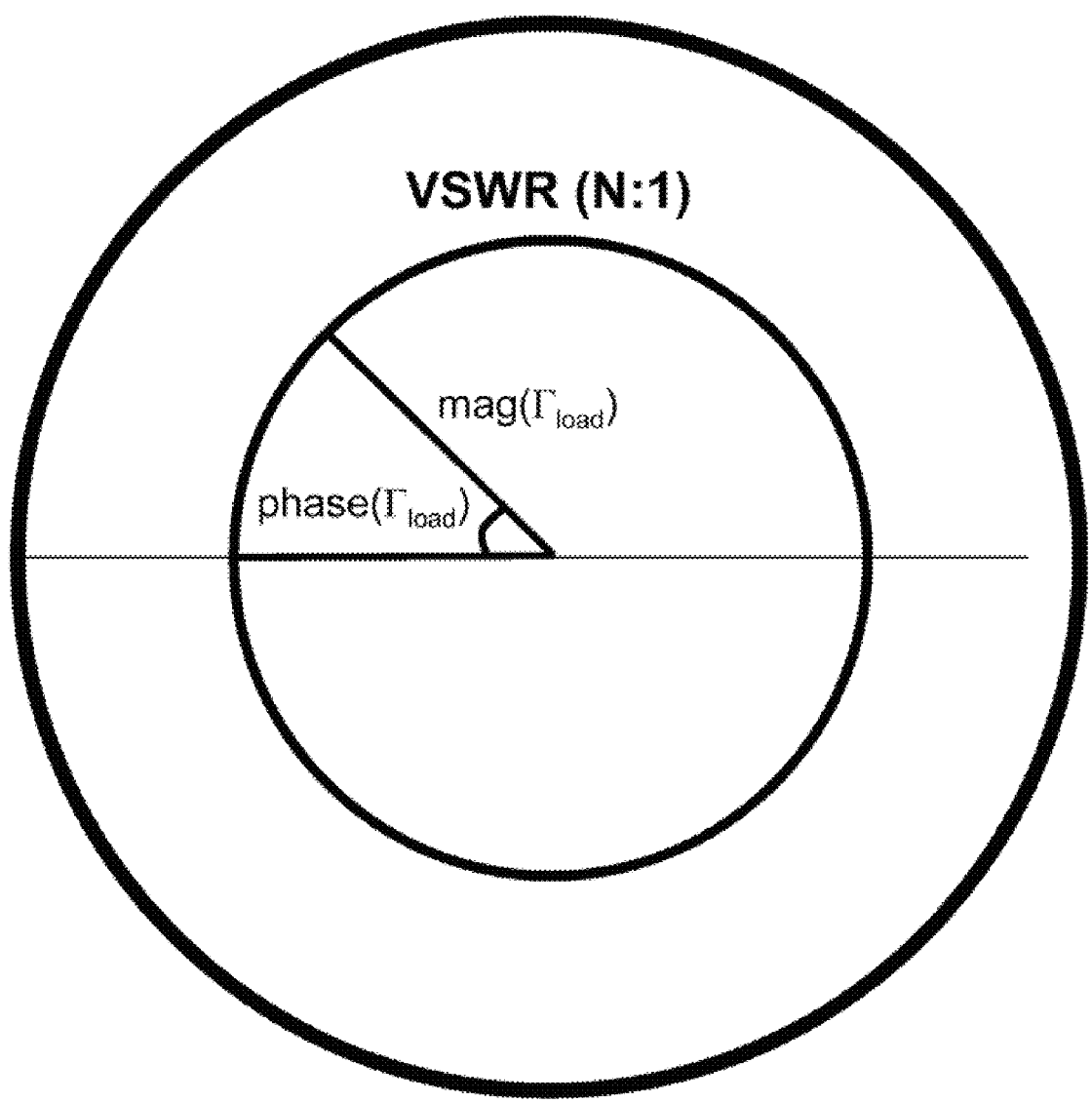
FIG. 46B shows an exemplary Smith chard helpful for determining power amplifier VSWR during tuning.

FIG. 46A shows a block diagram of a self-healing power amplifier illustrating one embodiment of a combination of power amplifier actuators. FIG. 46B shows an exemplary Smith chart helpful for observing power amplifier VSWR during tuning. Due to the large number of actuators, it can take a relatively long time to simulate the whole self-healing power amplifier and to optimize all of the actuators.

Figure 47:
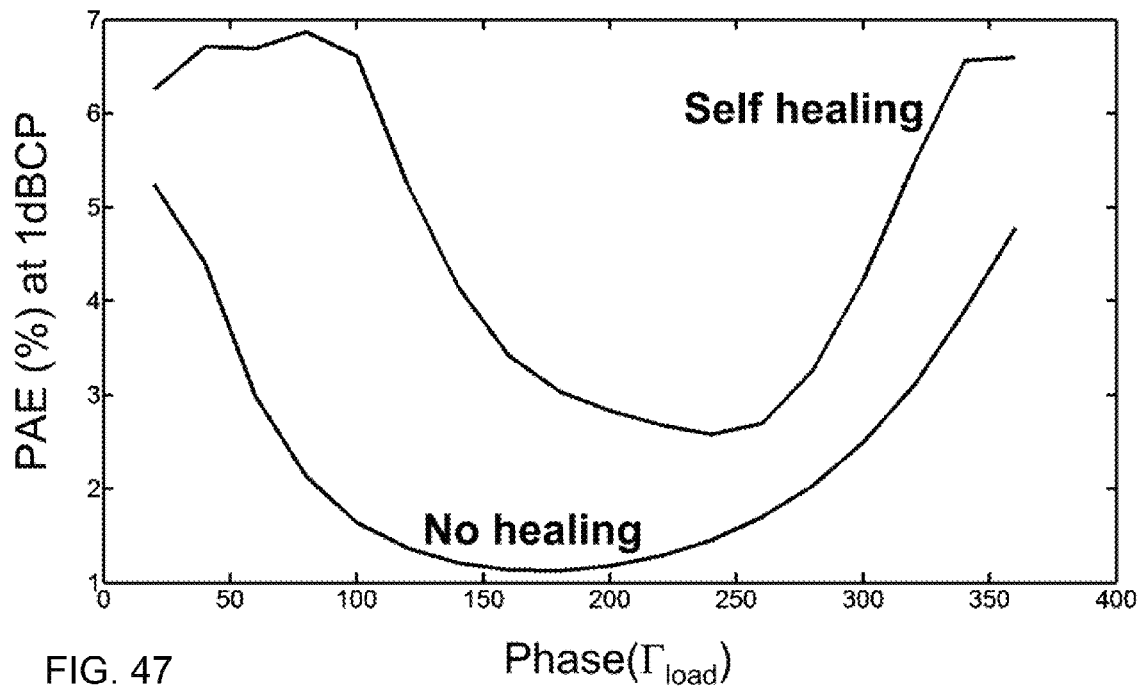
FIG. 47 shows a graph of a self-healing power amplifier simulation and no healing power amplifier as PAE (%) at 1 dBCP plotted versus Phase ($\Gamma_{load}$).
Figure 48:
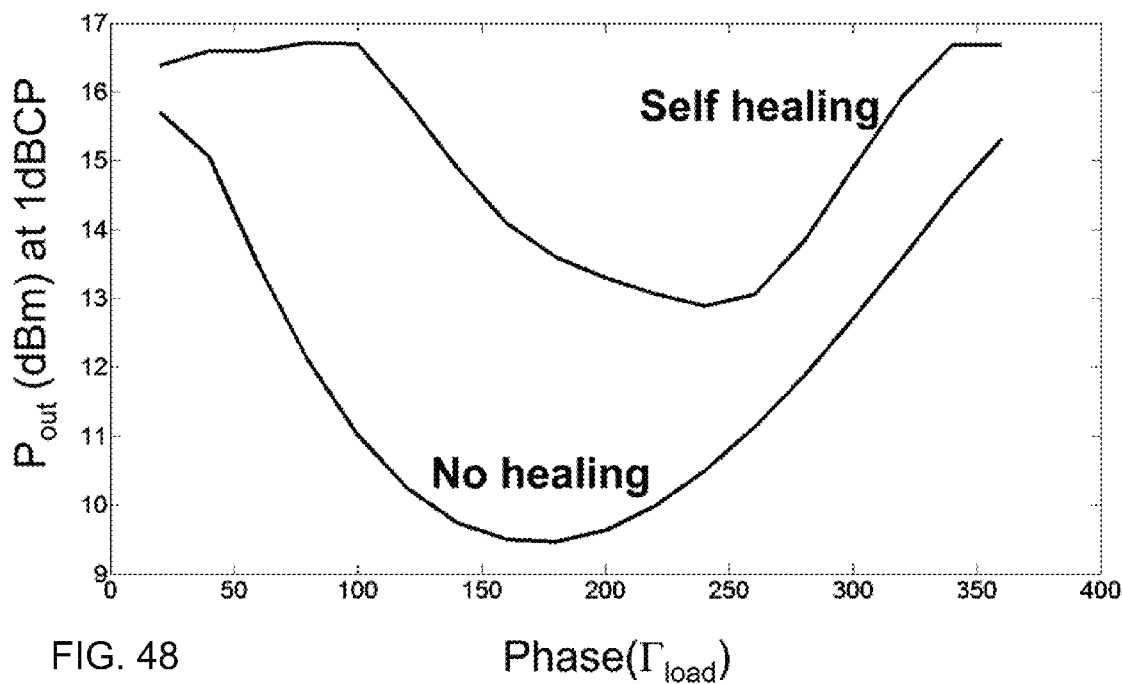
FIG. 48 shows a graph of a self-healing power amplifier simulation and no healing power amplifier as $P_{out}$ (dBm) at 1 dBCP plotted versus Phase ($\Gamma_{load}$).

We demonstrated one self-healing simulation strategy by fine-tuning the transmission line actuators. Fine-tuning of transmission lines can improve the worst-case PAE by a factor of 2 (at VSWR of 4:1, mag ($\Gamma_{load}$)=0.6). FIG. 47 shows a graph of a self-healing power amplifier simulation and no healing power amplifier as PAE (%) at 1 dBCP plotted versus Phase ($\Gamma_{load}$). In this simulation $P_{incident}$=−3 dBm (close to 1 dBCP). FIG. 48 shows a graph of a self-healing power amplifier simulation and no healing power amplifier as $P_{out}$ (dBm) at 1 dBCP plotted versus Phase ($\Gamma_{load}$). In this simulation $P_{incident}$=−3 dBm (close to 1 dBCP). Fine-tuning of transmission lines improves the worst-case $P_{out}$ by 3.4 dB (at VSWR of 4:1, mag (Γload)=0.6). In this simulation (FIG. 48) $P_{incident}$=−3 dBm (close to 1 dBCP).

Figure 49A:
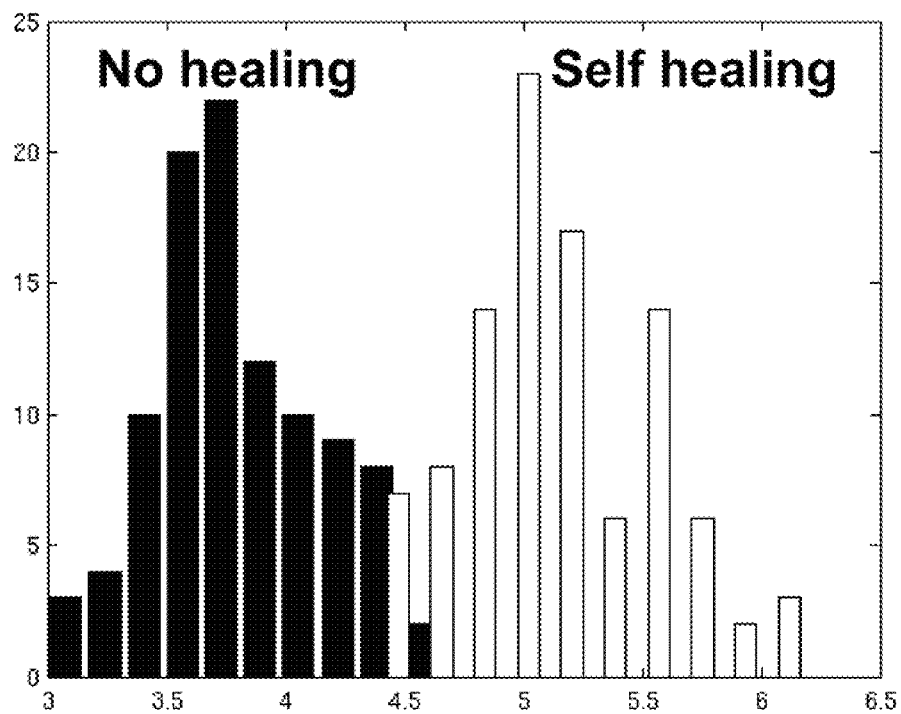
FIG. 49A shows a histogram of number of samples versus PAE.
Figure 49B:
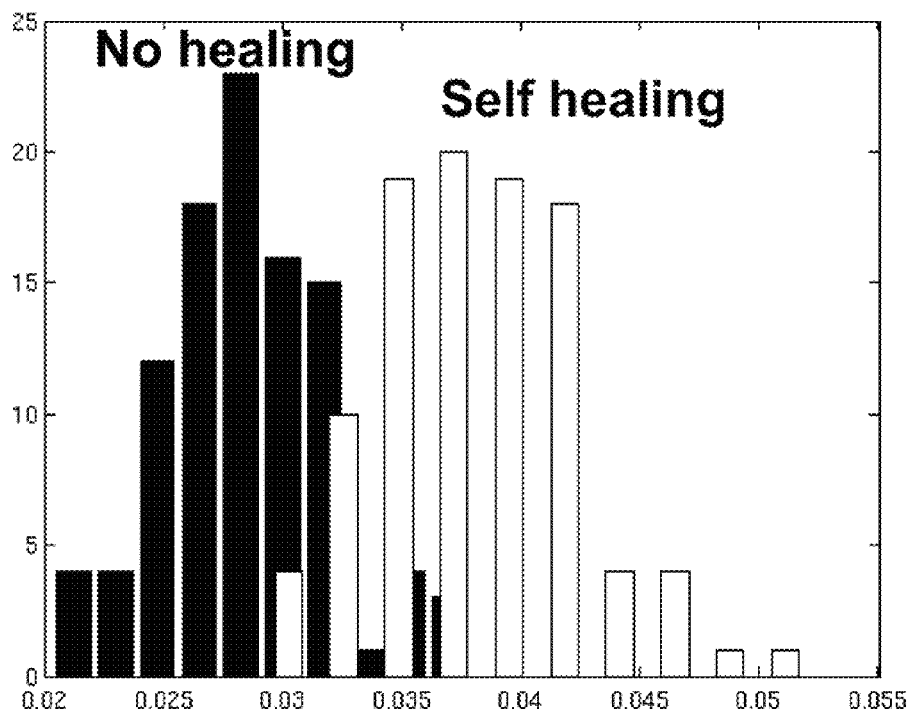
FIG. 49B shows a histogram of number of samples versus $P_{out}$.

FIG. 49A and FIG. 49B show a histogram of self-healing for process and mismatch. FIG. 49A shows a histogram of number of samples versus PAE. Designing for a $PAE_{1dBCP\_minimum}$=4.5%, the yield increased from 2% to 95%. In this simulation $P_{incident}$=−3 dBm (close to 1 dBCP). FIG. 49B shows a histogram of number of samples versus $P_{out}$. Designing for a $P_{out1dBCP\_minimum}$=35 mW, the yield increased from 4% to 76%. In this simulation $P_{incident}$=−3 dBm (close to 1 dBCP).

A Self-Healing Procedure: Architecture, Method, and Process

Figure 50:
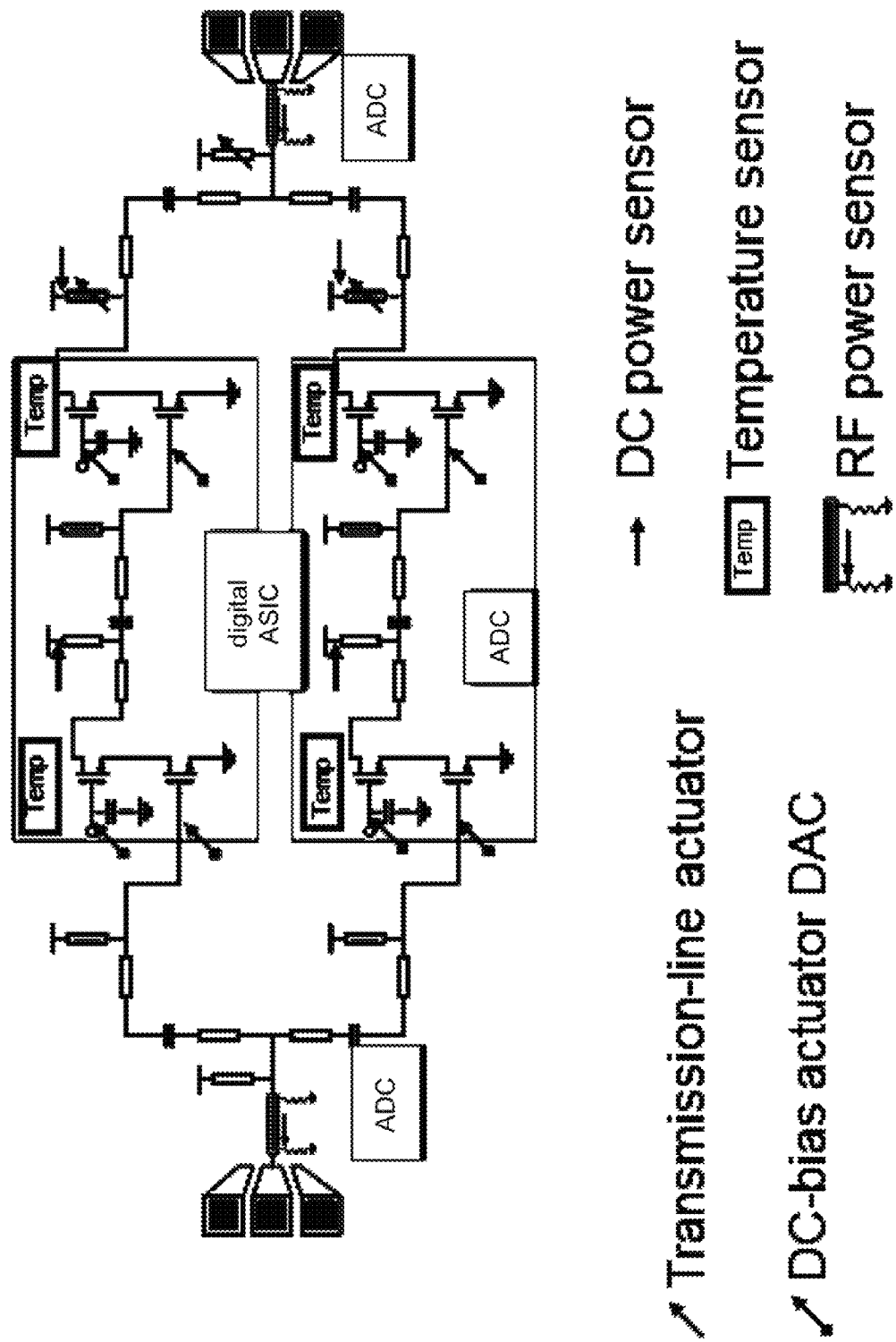
FIG. 50 shows a system block diagram illustrating an exemplary self-healing power amplifier architecture using a digital ASIC.
Figure 51:
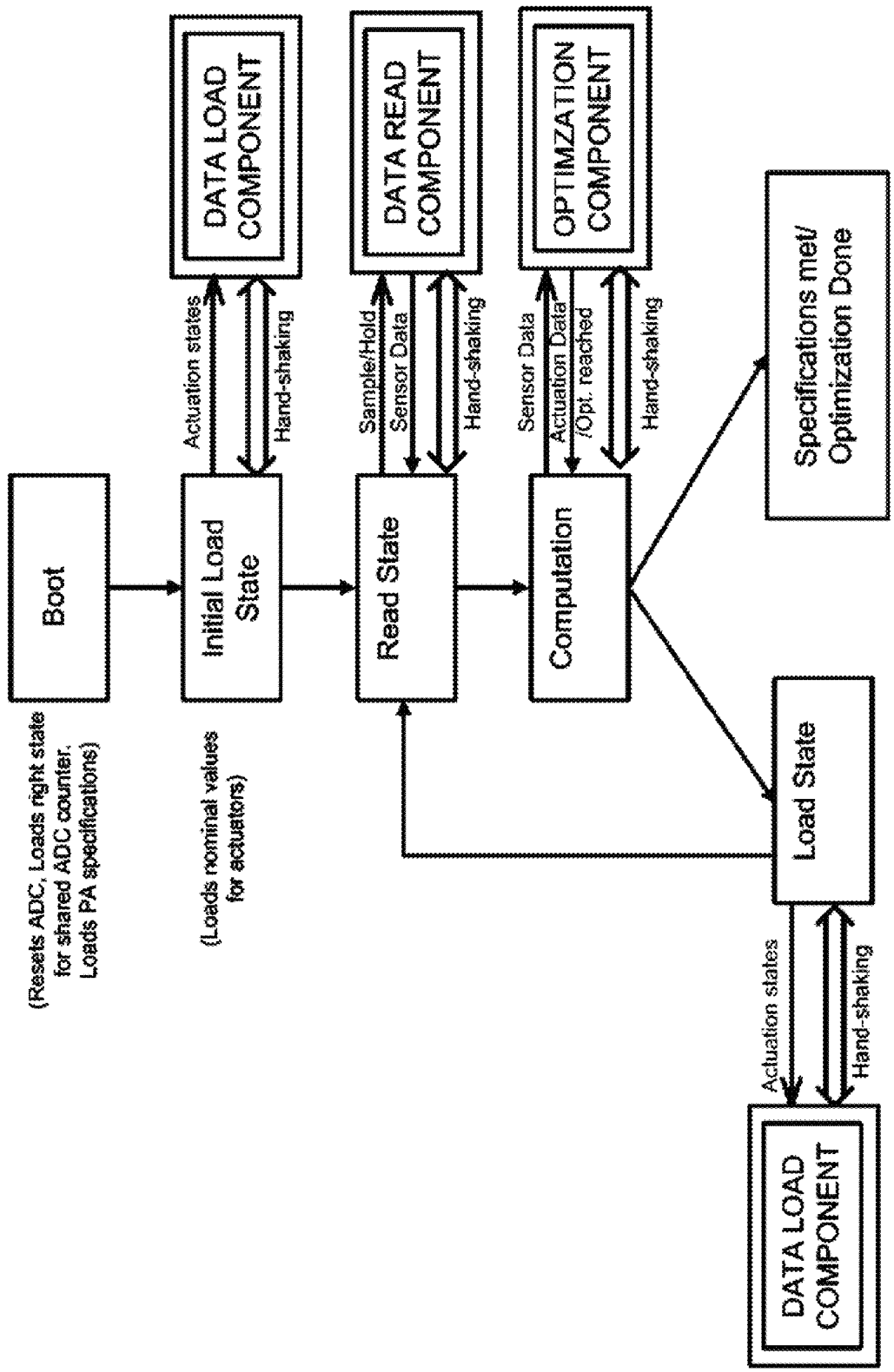
FIG. 51 shows a flow chart of one exemplary self-healing procedure.

A procedure that reads the data from the sensors, and determines the next state to put the actuators in can be implemented, for example, off chip with an FPGA, a microcontroller or with a digital ASIC. Any type of suitable processor can be implemented on-chip (as limited by the capabilities of any particular on-chip semiconductor process) or off-chip. FIG. 50 shows a system block diagram illustrating an exemplary self-healing power amplifier architecture using a digital ASIC. In one embodiment, the procedure can use a global control finite state machine (FSM) that can control a Data Load component, a Data Read component, and an Optimization component. FIG. 51 shows a flow chart of one such exemplary self-healing procedure.

The data load controls a procedure for loading actuation data which sets the actuation state of the actuators. The data read component reads data from the sensors, and the optimization component takes all of the data from the sensors, and calculates the next best state.

The optimization component can perform a bulk search of the actuation space if it is small enough, or the optimization component can use a more sophisticated search procedure such as gradient decent procedure. The optimization procedure can optimize different actuators separately, or treat them as one single large dimensional space to search through. In some embodiments, the procedure can perform a bulk search or a gradient decent of the transmission line actuators, for a given voltage bias point, to find an optimal or nearly optimal performing matching network.

The initialization can be done in many ways. One method to reach a desired output power level with maximum PAE/drain efficiency is to load nominal values, such as, for example, nominal values which have been simulated. These nominal values can fall in a central region of a Gaussian distribution of the power level that varies with process and mismatch. Such nominal values can also start from a lowest bias setting and then the output power can be checked. If more output power is required, the bias voltages can be raised either together as one, or separately for each stage. Then the transmission line actuation can be optimized again for the same bias conditions and this process can continue until a desired power level is reached. If the amplifier is delivering more power than needed, the bias voltages can be lowered to reduce the DC power and increase the power added efficiency (PAE) of the amplifier. In this way, the required output power specification can be met while keeping the PAE to a maximum.

In case of a mismatch, random or otherwise, such as, for example, due to mistuning, aging, a VSWR event, environmental changes, and/or a chip temperature variation, similar methods can be applied or more advanced search procedures, such as, for example, a random search, genetic procedure, neural networks, least mean square, Newton's methods, or least path can be used too. However, the same exemplary architecture described hereinabove, can remain the same. For example, the ASIC can be made programmable so that the procedure can be more flexible and loaded from outside, or it can be hardwired or a nominal may be loaded, so that batch testing of such chips becomes easy.

Figure 52:
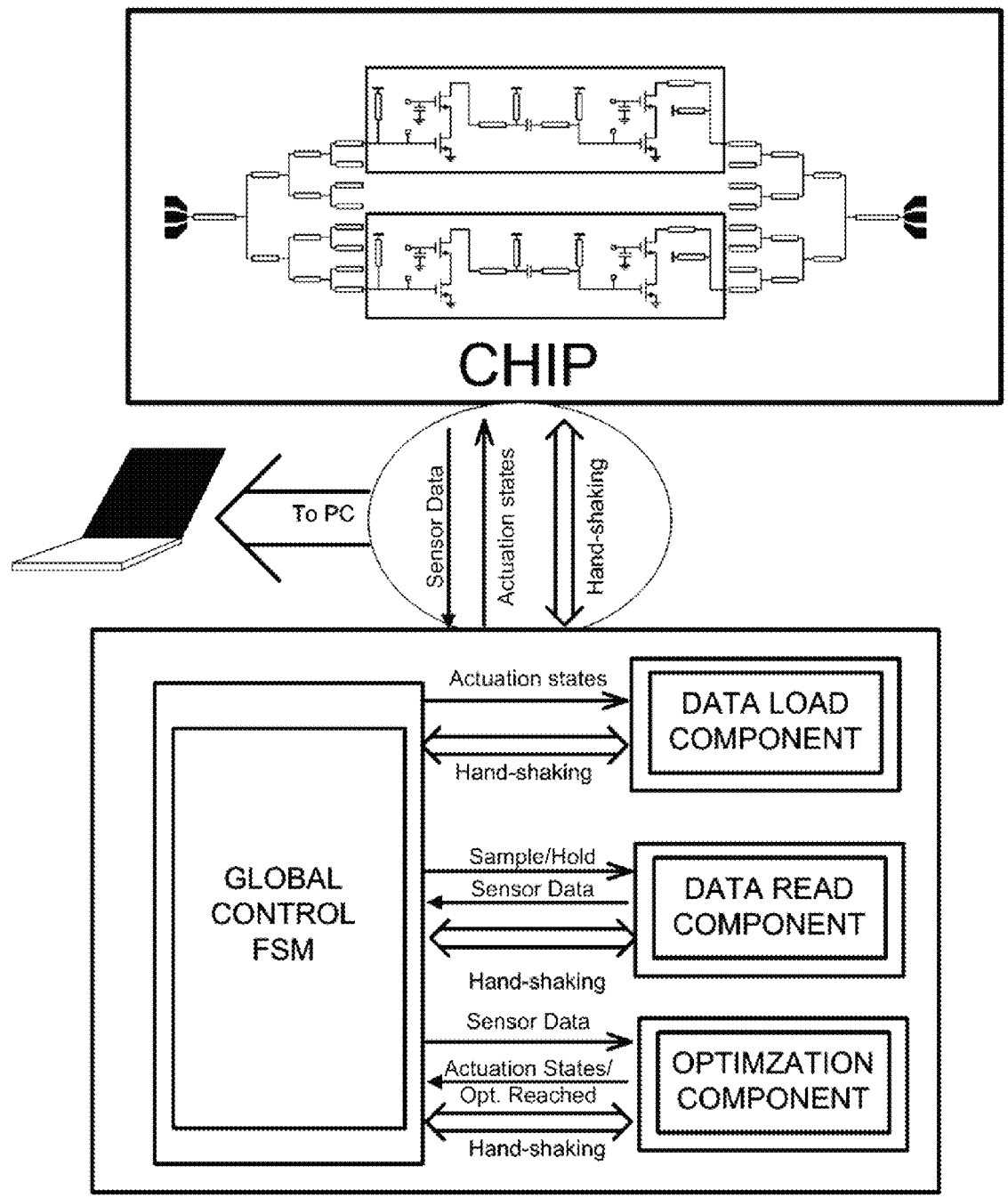
FIG. 52 shows one embodiment of a self-healing power amplifier controlled by the exemplary procedure of FIG. 51.

FIG. 52 shows one embodiment of a self-healing power amplifier controlled by the exemplary procedure of FIG. 51. The procedure can run on any suitable on-chip or off-chip processor. The PC illustrated in FIG. 52 can serve as an optional monitor of system function and performance. The PC can also run the procedure, however, more typically there will be a dedicated processor implemented as described hereinabove with a FPGA, microcontroller, or digital ASIC (all types of processor, on-chip or off-chip) to run the procedure.

The architecture, as described hereinabove, does not depend on number of cascaded PA stages, number of stages combined or the frequency of operation or output power level. The concept can be also valid for different kind of matching networks other than transmission line based e.g. a transformer matching network. Also, for example, instead of course tuning stubs or fine tuning, a varactor based tuning can be applied and the same concept with same sensors. In the case of substitutions of other suitable actuator and/or types of sensors (e.g. a varactor based tuning system in place of tuning stubs), the procedure can be appropriately adapted by following the techniques described herein.

Figure 53:
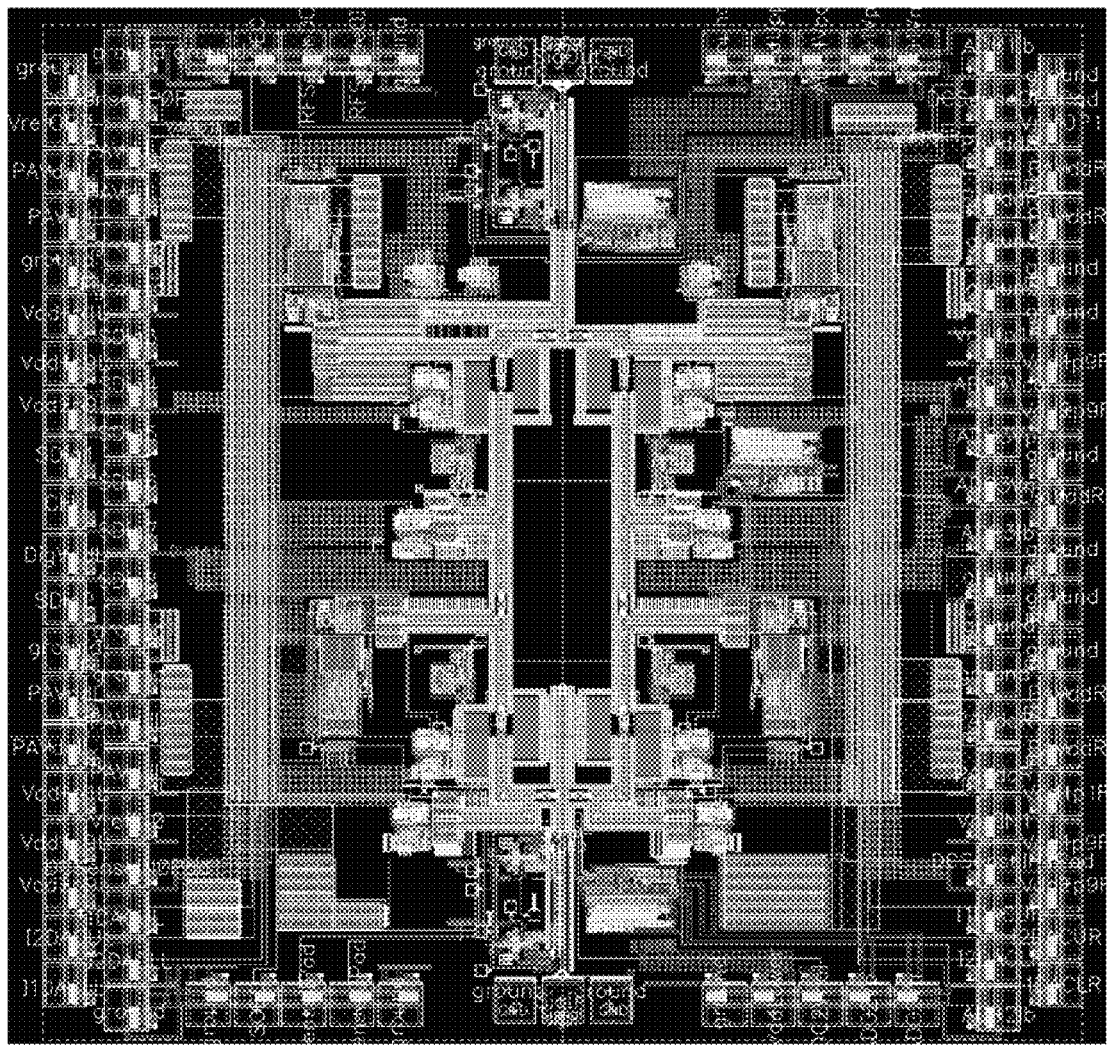
FIG. 53 shows an exemplary layout of a complete self healing power amplifier, including a plurality of on-chip actuators, sensors and an on-chip self healing processor.

FIG. 53 shows an exemplary layout of a complete self healing power amplifier, including a plurality of on-chip actuators, sensors and an on-chip self healing processor.

DEFINITIONS

As used in the present disclosure, we define the range of electromagnetic waves from microwave to "mm-wave" to correspond generally to a frequency range of about 10 to 300 GHz. The more general term of "high frequency" includes sub mm-wave as well as mm-wave frequencies. The self-healing techniques described herein are particularly advantageous in adapting semiconductor processes, such as for example, digital CMOS processes, to mm-wave operation. However, it is understood that the technologies described herein can also be applied generally to any similar circuits operating at any high frequency.

The words terminal or terminals are used to define connection points between electronic function blocks as well as connection points to an integrated structure and between integrated structures on a common chip or common substrate. Therefore, it is understood that some terminals are defined by integrated structures and connecting integrated structures, while other terminals can correspond to integrated structures such as pads for connecting to off-chip structures (e.g. other integrated devices, antennas, power sources, etc.).

Recording the results from an operation or data acquisition, such as for example, recording results for a particular self-healing operation, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks, hard disks, solid state drives (SSD); a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, ExpressCard cards or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An integrated power amplifier comprising:
   a divider having a divider input terminal and two or more divider output terminals, said divider input terminal electrically coupled to a power amplifier input terminal;
   a combiner having two or more combiner input terminals and a combiner output terminal electrically coupled to a power amplifier output terminal;
   two or more amplifiers in parallel, each amplifier having an amplifier input terminal and an amplifier output terminal, each of said amplifier input terminal electrically coupled to a divider output terminal and each of said amplifier output terminal electrically coupled to a combiner input terminal;

at least one power sensor configured to provide a power amplifier performance metric;

at least one terminal configured to receive an electrical voltage to power said integrated power amplifier; and wherein said divider and said combiner comprise a plurality of actuators, each actuator having at least one actuator control terminal configured to provide an actuator setting, and wherein said actuators are configured via said actuator control terminals to optimize said power amplifier performance metric.

2. The integrated power amplifier of claim 1, wherein each of said amplifiers further comprises at least one actuator configured to optimize a gain.

3. The integrated power amplifier of claim 1, wherein each of said amplifiers further comprises at least one actuator configured to set a dc bias.

4. The integrated power amplifier of claim 1, wherein said actuator comprises a tunable transmission line.

5. The integrated power amplifier of claim 4, wherein said tunable transmission line comprises switchable capacitors.

6. The integrated power amplifier of claim 4, wherein said tunable transmission line comprises stubs and shorting switches.

7. The integrated power amplifier of claim 1, wherein said power sensor comprises a thermal sensor.

8. The integrated power amplifier of claim 7, wherein said thermal sensor comprises a plurality of diodes interlaced with said integrated power amplifier.

9. The integrated power amplifier of claim 1, wherein said power sensor comprises a RF power sensor.

10. The integrated power amplifier of claim 1, wherein said RF power sensor comprises a coupled line.

11. The integrated power amplifier of claim 1, wherein said power sensor comprises a DC current sensor comprising a current mirror.

12. The integrated power amplifier of claim 11, wherein said DC current sensor comprises a low headroom power circuit having an amplifier and a plurality of FETs and a DC current sensor output terminal.

13. The integrated power amplifier of claim 1, further comprising an ADC configured to digitize a signal from said power sensor.

14. The integrated power amplifier of claim 13, wherein said ADC comprises a successive-approximation (SAR) ADC.

15. The integrated power amplifier of claim 14, wherein said SAR ADC comprises a DAC having a binary-weighted capacitor array.

16. The integrated power amplifier of claim 1, wherein said integrated power amplifier comprises a CMOS technology.

17. The integrated power amplifier of claim 1, comprising wherein said integrated power amplifier comprises body-contacted analog transistors.

18. A method to simulate the operation of a self-healing power amplifier comprising the steps of:

providing a general purpose programmable computer programmed with a set of instructions recorded on a computer-readable medium, said general purpose programmable computer configured to simulate self-healing power amplifier actuator settings and to calculate performance data for said simulated self-healing power amplifier actuator settings when said instructions are operating thereon;

setting said self-healing power amplifier actuator settings;

calculating said performance data for said simulated self-healing power amplifier;

calculating a figure of merit (FOM) based on said performance data;

calculating a revised set of self-healing power amplifier actuator settings based on said FOM; and performing at least one of displaying and recording at least one of said performance data, said FOM, and said revised set of self-healing power amplifier actuator settings.

19. The method to tune a self-healing power amplifier of claim 18, further comprising repeating one or more times said steps of setting said self-healing power amplifier actuator settings to calculate a revised set of self-healing power amplifier actuator settings.

20. The method to tune a self-healing power amplifier of claim 19, further comprising repeating said steps of setting said self-healing power amplifier actuator settings to calculating a revised set of self-healing power amplifier actuator settings until a desired FOM is reached or as desired.

21. A process for the operation of a self-healing circuit, comprising the steps of:

providing a self-healing circuit comprising actuators having actuator settings and sensors to provide a measurement indicative of a circuit performance metric;

providing a processor configured to run a self-healing procedure having as at least one input a sensor measurement and as output at least one actuator setting;

defining an initial state for at least one actuator;

reading a present state of said at least one actuator and said sensor measurement;

calculating said circuit performance metric;

calculating a new setting for said at least one actuator setting to provide a predicted improvement in said circuit performance metric; and setting said new setting for said at least one actuator and optionally repeating said step of reading a present state of said at least one actuator and said at sensor measurement to said step of setting said new setting for said at least one actuator as many times as desired;

wherein said process is repeated following a predetermined level of change of an environmental factor.

22. The process for the operation of a self-healing circuit of claim 21 wherein said environmental factor comprises a selected one of a temperature change, and a change in a voltage standing wave ratio (VSWR).

23. A process for the operation of a self-healing circuit, comprising the steps of:

providing a self-healing circuit comprising actuators having actuator settings and sensors to provide a measurement indicative of a circuit performance metric;

providing a processor configured to run a self-healing procedure having as at least one input a sensor measurement and as output at least one actuator setting;

defining an initial state for at least one actuator;

reading a present state of said at least one actuator and said sensor measurement;

calculating said circuit performance metric;

calculating a new setting for said at least one actuator setting to provide a predicted improvement in said circuit performance metric; and setting said new setting for said at least one actuator;

wherein said at least one actuator is present in a matching network.

* * * * *